United States Patent
Sato (12)

(10) Patent No.: US 6,303,265 B1
(45) Date of Patent: Oct. 16, 2001

(54) POSITIVE PHOTORESIST COMPOSITION FOR EXPOSURE TO FAR ULTRAVIOLET LIGHT

(75) Inventor: Kenichiro Sato, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/345,159

(22) Filed: Jun. 30, 1999

(30) Foreign Application Priority Data

Jul. 2, 1998 (JP) .................................................. 10-187597

(51) Int. Cl.⁷ ...................................................... G03C 1/73
(52) U.S. Cl. .................. 430/270.1; 430/906; 430/286.1; 522/31
(58) Field of Search .............................. 430/270.1, 281.1, 430/286.1, 913, 919, 920, 921, 906; 522/31

(56) References Cited

U.S. PATENT DOCUMENTS

| 5,580,694 | * | 12/1996 | Allen et al. | 430/270.1 |
| 5,786,131 | * | 7/1998 | Allen et al. | 430/325 |
| 5,910,392 | * | 6/1999 | Nozaki et al. | 430/270.1 |
| 6,013,416 | * | 1/2000 | Nozaki et al. | 430/283.1 |
| 6,042,991 | * | 3/2000 | Aoai et al. | 430/285.1 |
| 6,159,655 | * | 12/2000 | Sato | 430/270.1 |

FOREIGN PATENT DOCUMENTS

| 789278 | * | 8/1997 | (EP) . |
| 0878738 | * | 11/1998 | (EP) . |
| 10-55069 | | 2/1998 | (JP) . |
| 10221853 | * | 8/1998 | (JP) . |
| 11052575 | * | 2/1999 | (JP) . |

OTHER PUBLICATIONS

Sato et al. (JP 10239848 A, abstract) "Positive Photoresist Composition for exposure to far ultraviolet rays."*

* cited by examiner

Primary Examiner—Janet Baxter
(74) Attorney, Agent, or Firm—Sughrue, Mion, Zinn, Macpeak & Seas, PLLC

(57) ABSTRACT

A positive photoresist composition for exposure to far ultraviolet light which comprises (A) a compound which generates an acid upon irradiation with an actinic ray or radiation, and (B) a resin which is decomposed by the action of an acid to increase its solubility in an alkaline developing solution and has a group represented by the following formula (1) connected to at least one terminal of the molecular chain thereof:

$$—X—R \qquad (1)$$

wherein X represents $—R_1—$, $—S—R_1—$, $—O—R_1—$, $—NH—R_1—$ or $—NR_2—R_1—$; R represents an alkoxy group, a hydroxy group, $—COO—R_2$, $—CONH—R_2$, $—CONHSO_2—R_2$ or $—CONH_2$; $R_1$ represents a divalent hydrocarbon group having from 1 to 20 carbon atoms; and $R_2$ represents an alkyl group.

The positive photoresist composition provides good sensitivity, resolution and resist pattern when used with a light source having a wavelength of 250 nm or less, particularly 220 nm or less and which forms a solution having excellent storage stability when dissolved in an organic solvent.

16 Claims, No Drawings

POSITIVE PHOTORESIST COMPOSITION FOR EXPOSURE TO FAR ULTRAVIOLET LIGHT

FIELD OF THE INVENTION

The present invention relates to a positive photoresist composition used in an ultramicrolithogrpahic process, e.g., for the production of VLSI and high capacity chips, or other photofabrication processes. In particular, the present invention relates to a positive photoresist composition capable of forming highly precise patterns by using light in the far ultraviolet region, including, excimer laser beams.

BACKGROUND OF THE INVENTION

The degree of integration of integrated circuits has recently become much higher, and the photolithography for superfine patterns having a line width of half micron or below is required in the production of semiconductor substrates for VLSI and the like. In order to meet such a requirement, a wavelength used in an exposure apparatus for photolithography becomes shorter, and nowadays the use of far ultraviolet light in a shorter wavelength region, or an excimer laser beam (e.g., XeCl, KrF, or ArF) is investigated.

A chemical amplification resist is known to be used in the pattern formation by the photolithography in such a wavelength region.

In general, the chemical amplification resist is roughly divided into three types, the so-called two-component, two point five-component and three-component types. The chemical amplification resist of two-component type comprises a combination of a compound capable of generating an acid by photolysis (hereinafter referred to as a "photo-acid generator" sometimes) with a binder resin. The binder resin combined with such a compound is a resin having in its molecule, a group capable of being decomposed by the action of an acid to increase the solubility of resin in an alkaline developing solution (which is hereinafter referred to as an "acid-decomposable group" sometimes). The resist of two point five-component type further contains a low molecular weight compound having an acid-decomposable group in addition to the above described two components. The resist of three-component type contains a photo-acid generator, an alkali-soluble resin and the low molecular weight compound described above.

Although the chemical amplification resist described above is a photoresist suitable for exposure to ultraviolet light or far ultraviolet light, it is yet necessary for the resist to meet requirements for characteristics from the viewpoint of practical use. In the case of using a KrF excimer laser beam of 248 nm as exposure light, for instance, resist compositions comprising a hydoxystyrene polymer showing only slight absorption of the laser beam into which acetal or ketal groups are introduced as protective groups are proposed, e.g., in JP-A-2-141636, JP-A-2-19847, JP-A-4-219757 and JP-A-5-281745. In addition, compositions which are similar to the above, except that tert-butoxycarbonyloxy or p-tetrahydropyranyloxy groups are introduced thereinto as acid-decomposable groups, are proposed, e.g., in JP-A-2-209977, JP-A-3-206458 and JP-A-2-19847.

Although those compositions are suitable for the case of using the KrF excimer laser beam of 248 nm, they have low sensitivity to an ArF excimer laser beam because their absorbance at the wavelength of ArF excimer laser beam is substantially high. This drawback is accompanied with other drawbacks of causing deterioration, e.g., in definition, focus latitude and pattern profile. Therefore, it is necessary for those compositions to be improved in many points.

As photoresist composition suitable for the ArF excimer light source, combinations of (meth)acrylic resins showing less absorption of light than partially hydroxylated styrene resins with a compound capable of generating an acid upon exposure are proposed, e.g., in JP-A-7-199467 and JP-A-7-252324. Among others, JP-A-6-289615 discloses an acrylic resin having carboxyl groups the oxygen atoms of which are bonded to tertiary carbon-containing organic groups to form ester linkages.

Further, JP-A-7-234511 discloses an acid-decomposable resin containing both acrylate and fumarate as repeating units. However, those resins are insufficient in view of pattern profile and adhesion to a substrate. Thus, it is true that satisfactory resist properties are not obtained.

Furthermore, a resin into which an alicyclic hydrocarbon moiety is introduced is proposed for the purpose of improving dry etching resistance. However, the introduction of alicyclic hydrocarbon moiety is accompanied with a problem in that a system including the resin becomes extremely hydrophobic, and it is difficult to conduct development with an aqueous solution of tetramethylammonium hydroxide (hereinafter referred to as TMAH sometimes) which has hitherto been widely employed as a developing solution of resist. Thus, a phenomenon of peeling the resist from a substrate during the development is observed.

In response to the increase in the hydrophobic property of resist, an attempt has been made that an organic solvent such as isopropyl alcohol is added to the developing solution. Although the result is recognized to a certain extent, other problems, for example, fear of swelling the resist film and complexity of the process arise. Thus, the problem is not always solved.

As to an approach to improvement of the resist, many attempts of compensation for the hydrophobic property of alicyclic hydrocarbon moieties by the introduction of hydrophilic groups have been made.

In general, a method of copolymerizing a monomer having a carboxylic acid group such as acrylic acid or methacrylic acid together with a monomer having the alicyclic hydrocarbon moiety is adopted. Although the adhesion to a substrate tends to be improved as a result of the introduction of carboxylic acid group, such a method has problems in that the dry etching resistance is deteriorated and in that the reduction in a thickness of resist film is remarkably observed, and thus the above described problems still remain. Further, a method of copolymerizing a monomer having a hydroxy group or a cyano group such as 2-hydroxyethyl methacrylate (HEMA) or acrylonitrile in place of the monomer having a carboxylic acid group together with a monomer having the alicyclic hydrocarbon moiety is proposed in order to solve the problems in a developing property as described in JP-A-7-234511. However, the method is still insufficient for attaining the purpose.

Recently, investigations on improvement in the adhesion to a substrate by using a lactone structure such as mevalonic lactone have been made as described in Journal of Photopolymer Science and Technology, Vol. 9, pages 509–522 (1996) and Journal of Photopolymer Science and Technology, Vol. 10, pages 545–550 (1997). However, since these methods are inferior in the developing property, an overcoat layer which makes the process complex is necessary for maintaining the good developing property. Further, the adhesion to a substrate is still insufficient according to these methods.

Also, monomers having both a carboxylic acid group and the alicyclic hydrocarbon moiety in their molecules are investigated in order to improve the dry etching resistance, developing property and adhesion to a substrate as described in JP-A-8-259626, Journal of Photopolymer Science and Technology, Vol. 9, pages 377–385 (1996) and Journal of Photopolymer Science and Technology, Vol. 9, pages 447–456 (1996). Due to extremely high solubility of the monomer in a developing solution, to use the monomer is attended with other problems of decrease in the adhesion to a substrate and lack of an aptitude to a standard developing solution.

Moreover, an attempt of improvement has been made by copolymerizing an alicyclic hydrocarbon monomer having an alcoholic hydroxy group as described in Journal of Photopolymer Science and Technology, Vol. 10, pages 561–570 (1997) with the above-described monomer. The attempt, however, has not reached the satisfactory level.

Besides the introduction of alicyclic hydrocarbon moiety into a side chain of an acrylate monomer as described above, a method for imparting the dry etching resistance utilizing a polymer having the alicyclic hydrocarbon moiety in the main chain thereof is investigated. Since the method is accompanied with the above described problems, improvements using methods similar to those described above are further investigated.

For instance, introduction of hydroxy group into the main chain of a norbornene polymer for the purpose of imparting the adhesion to a substrate is proposed as described in Journal of Photopolymer Science and Technology, Vol. 10, pages 529–534 (1997) and Journal of Photopolymer Science and Technology, Vol. 10, pages 521–528 (1997). However, satisfactory results are not obtained with respect to both the developing property and the adhesion to a substrate.

Further, in SPIE, Vol. 3049, pages 92–105 (1988), a composition containing a polymer obtained by a ring-opening polymerization of a norbornene ring or a polymer containing a norbornene ring in the main chain thereof, and each having a carboxy group and a tert-butyl ester group is described. However, the composition is defective in that the adhesion to a substrate and the aptitude to a standard developing solution are practically insufficient.

A composition containing a polymer obtained by a ring-opening polymerization of a norbornene ring or a polymer containing a norbornene ring in the main chain thereof, and each having an acid-decomposable group and a carboxy group is described in EP-A-789,278. Also, a photoresist composition comprising a resin obtained by polymerization of a monomer containing a norbornene ring having an acid-decomposable group is described in WO 97/33198. Further, the photoresist composition further containing a carboxylic acid is described in JP-A-9-274318.

For the chemical amplification resist, the alkali solubility of resin is an important factor which relates to the resolution and developing property thereof, and control of the alkali solubility is conducted by determining a content of a carboxy group attached to its side chain. However, the photoresist composition containing the resin described above has a problem in that the developing property and the adhesion to a substrate are not satisfactory.

In JP-A-10-55069, there is described a radiation-sensitive resin composition containing a resin which is decomposed by the action of an acid to increase its solubility in an alkaline developing solution and has a group represented by —X—COOH (wherein X represents a specific divalent group) at least at one terminal of the molecular chain thereof and a photo-acid generator which generates an acid upon irradiation of light, which has good transparency to far ultraviolet light and excellent adhesion to a substrate as well as excellent sensitivity, resolution and developing property.

The above described composition for exposure to short wavelength light has a problem in that a solution (coating solution) of the composition prepared by dissolving the composition in an organic solvent has poor storage stability to generate aggregates or the like. Thus, further improvements have been desired.

SUMMARY OF THE INVENTION

Therefore, an object of the present invention is to provide a positive photosensitive composition suitable for use of a light source having a wavelength of 250 nm or less, particularly 220 nm or less.

Another object of the present invention is to provide a positive photosensitive composition which provides good sensitivity, resolution and resist pattern when used with a light source having a wavelength of 250 nm or less, particularly 220 nm or less and which forms a solution having excellent storage stability when dissolved in an organic solvent.

Other objects of the present invention will become apparent from the following description.

As a result of intensive investigations made by the inventors on constituent materials for positive resist composition of the chemical amplification type while taking the properties described above into consideration, it has been found that the objects of the present invention are accomplished by using a resin which has a group represented by the specific structural formula at least at one terminal of its molecular chain and increases its solubility in an alkaline developing solution by the action of an acid, to complete the present invention.

Specifically, the present invention comprises a positive photoresist composition for exposure to far ultraviolet light which comprises (A) a compound which generates an acid upon irradiation with an actinic ray or radiation, and (B) a resin which is decomposed by the action of an acid to increase its solubility in an alkaline developing solution and has a group represented by the following formula (1) connected to at least one terminal of the molecular chain thereof:

wherein X represents —R$_1$—, —S—R$_1$—, —O—R$_1$—, —NH—R$_1$—, or —NR$_2$—R$_1$—; R represents an alkoxy group, a hydroxy group, —COO—R$_2$, —CONH—R$_2$, —CONHSO$_2$—R$_2$ or —CONH$_2$; R$_1$ represents a divalent hydrocarbon group having from 1 to 20 carbon atoms; and R$_2$ represents an alkyl group.

DETAILED DESCRIPTION OF THE INVENTION

The present invention also includes the following embodiments.

(1) a positive photoresist composition for exposure to far ultraviolet light as described above, wherein the resin has an alicyclic structure; and (2) a positive photoresist composition for exposure to far ultraviolet light as described above, wherein the composition is suitable for exposure using far ultraviolet light having a wavelength of from 170 nm to 220 nm, as exposure light.

Now, the group of —X—R in the resin which is decomposed by the action of an acid to increase its solubility in an alkaline developing solution and has the group represented by the above described formula (1) connected to at least one terminal of the molecular chain thereof will be described in greater detail below.

In formula (1), X represents a divalent group selected from —$R_1$—, —S—$R_1$—, —O—$R_1$—, —NH—$R_1$— and —$NR_2$—$R_1$—; $R_1$ represents a divalent hydrocarbon group having from 1 to 20 carbon atoms which may be substituted; $R_2$ represents an alkyl group; and R represents an alkoxy group, a hydroxy group, —COO—$R_2$, —CONH—$R_2$, —$CONHSO_2$—$R_2$ or —$CONH_2$.

The divalent hydrocarbon group having from 1 to 20 carbon atoms represented by $R_1$ includes, for example, an alkylene group such as methylene, ethylene, propylene, tetramethylene, 1,2-butylene, 1,3-butylene, 2,3-butylene, pentamethylene or hexamethylene; an alkylidene group such as ethylidene, propylidene, isopropylidene, butylidene, pentylidene or hexylidene; an cyaloalkylene group such as 1,2-cyclopentylene, 1,3-cyclopentylene, 1,2-cyclohexylene, 1,3-cyclohexylene, 1,4-cyclohexylene, 1,2-cycloheptylene, 1,3-cycloheptylene or 1,4-cycloheptylene; an arylene group such as 1,2-phenylene, 1,3-phenylene, 1,4-phenylene, 2,3-tolylene, 2,4-tolylene, 2,5-tolylene or 1,4-naphthylene; and an aralkylene group such as o-xylylene, m-xylylene or p-xylylene.

The substituent for the hydrocarbon group includes, for example, —CN or —C(=O)$R_3$ (wherein $R_3$ represents an alkyl group having from 1 to 4 carbon atoms). The alkyl group represented by $R_3$ or $R_4$ includes, for example, methyl, ethyl, n-propyl, isopropyl, n-butyl, isobutyl, sec-butyl and tert-butyl. The substituent may present in any position of the hydrocarbon group.

The alkyl group represented by $R_2$ includes, for example, methyl, ethyl, n-propyl, isopropyl, n-butyl, isobutyl, sec-butyl and tert-butyl.

The alkoxy group represented by R may be substituted and includes, for example, methoxy, ethoxy, propoxy, isopropoxy and butoxy.

In the group represented by formula (1), X is preferably —$R_1$—, —S—$R_1$— or —NH—$R_1$—. $R_1$ is preferably a methylene group, an ethylene group, a straight chain or branched propylene group, a straight chain or branched butylene group, a straight chain or branched hexylene group, a cyclopentylene group, a cyclohexylene group, a straight chain or branched propylene group substituted with a cyano group, a straight chain or branched butylene group substituted with a cyano group, or a straight chain or branched hexylene group substituted with a cyano group. R is preferably a methoxy group, an ethoxy group, a propoxy group, a hydroxy group, a methoxycarbonyl group, an ethoxycarbonyl group, an N-methylaminocarbonyl group or an N-ethylaminocarbonyl group.

The resin having the group represented by formula (1) connected to at least one terminal of the molecular chain thereof can be obtained by copolymerization, for example, radical polymerization, anion polymerization or group transfer polymerization (GTP) of monomers corresponding to repeating units to be desired using a specific polymerization initiator and/or specific chain transfer agent or a radical terminator as described above.

Specifically, suitable examples for the synthesis of resin include methods (a) to (c) described below. In the following reaction schemes of methods (a) to (c), M represents an appropriate monomer forming a repeating unit, M* represents a repeating unit formed from the monomer M, and n represents an integer indicating the number of M or M*.

Method (a):
A method of conducting copolymerization using a radical initiator having the —X—R group. One example of a reaction scheme of the method is shown below.

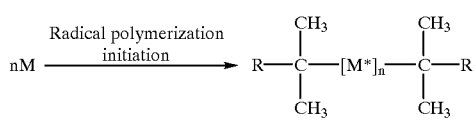

Radical polymerization initiator:

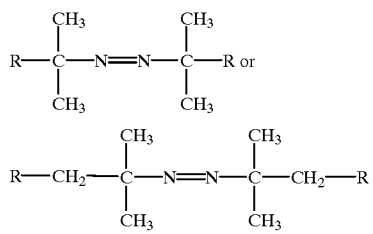

Specific examples of the radical polymerization initiator include those having a hydrophilic group such as dimethylazobis(2-methylpropionate) and 2,2'-azobis[2-(hydroxymethyl)propionitrile].

Method (b):
A method of conducting radical copolymerization in the presence of a chain transfer agent having the —X—R group. One example of a reaction scheme of the method is shown below.

chain transfer agent:

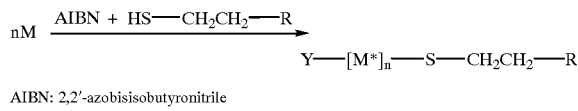

AIBN: 2,2'-azobisisobutyronitrile
Y: AIBN residue

Specific examples of the chain transfer agent having the —X—R group include mercaptoethanol, 1-mercapto-2-propanol, 3-mercapto-1-propanol, 3-mercapto-2-butanol, 3-mercapto-1,2-propanediol, 2-methoxyethylmercaptane, methyl mercaptoacetate, methyl mercaptopropionate, mercapto-acetamide, N-methylmercaptoacetamide and N-methane-sulfonylmercaptoacetamide.

Method (c):
A method of adding a radical terminator having the —X—R group at an appropriate stage of radical copolymerization. One example of a reaction scheme of the method is shown below.

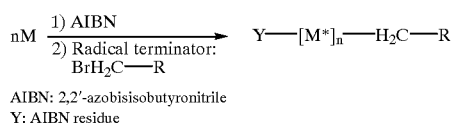

AIBN: 2,2'-azobisisobutyronitrile
Y: AIBN residue

Specific examples of the radical initiator having the —X—R group include 2-bromoethanol, 3-bromopropanol, bromoethyl methyl ether, bromoethyl ethyl ether, bromomethyl acetate, 2-bromoethyl acetate and ethyl bromoacetate.

There is no discrimination on the characteristics of positive photoresist composition for exposure to far ultraviolet light according to the present invention, when any one of methods (a) to (c) described above is employed for the preparation thereof. According to the present invention, a method for introducing the —X—R group into a resin is not particularly limited as long as the —X—R group is present at the terminal of the resin. Therefore, methods other than methods (a) to (c) described above can be adopted for the preparation of the resin.

Now, a polymer chain of the resin (B) which is decomposed by the action of an acid to increase its solubility in an alkaline developing solution (hereinafter also referred to as an acid-decomposable resin sometimes) other than the terminal group represented by formula (1) will be described in detail below.

As the acid-decomposable resins, those each having a group capable of being decomposed by the action of an acid (hereinafter also referred to as an acid-decomposable group sometimes) and an alicyclic structure are preferred. The alicyclic structure may be present either in the side chain of the resin, in the main chain of the resin or in both thereof. The alicyclic structure includes a polycyclic structure and a bridged structure. The acid-decomposable group may be included in the alicyclic structure or other repeating units.

Skeletons of the alicyclic structure include cyclopentane, cyclohexane and structures (1) to (47) described below.

(1)

(2)

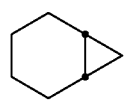

(3)

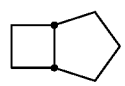

(4)

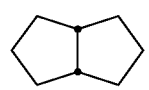

(5)

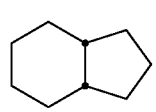

(6)

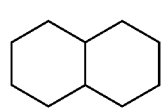

(7)

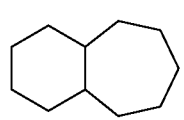

(8)

-continued

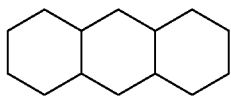

(9)

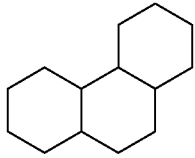

(10)

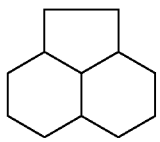

(11)

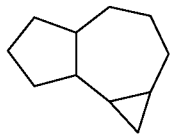

(12)

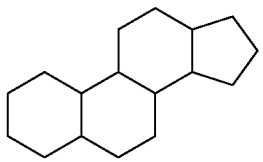

(13)

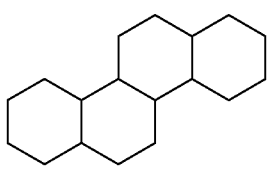

(14)

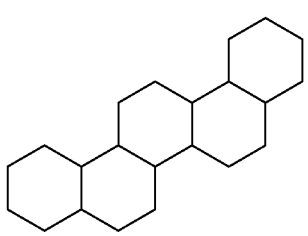

(15)

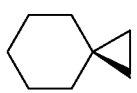

(16)

(17)

(18)

-continued
(19) 
(20) 
(21) 
(22) 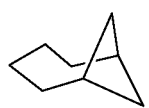
(23) 
(24) 
(25) 
(26) 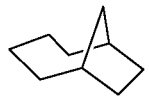
(27) 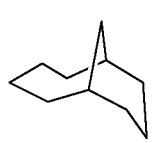
(28) 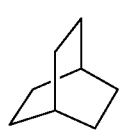
(29) 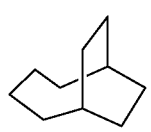
-continued
(30) 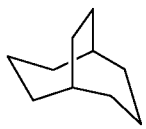
(31) 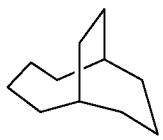
(32) 
(33) 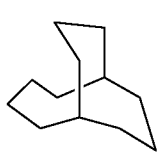
(34) 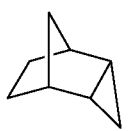
(35) 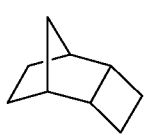
(36) 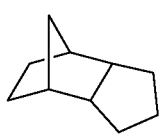
(37) 
(38) 
(39) 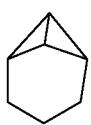

-continued

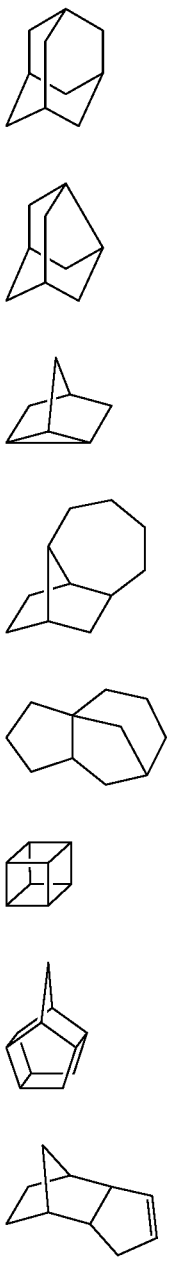

(40)

(41)

(42)

(43)

(44)

(45)

(46)

(47)

Of the skeletons described above, cyclopentane, cyclohexane and structures (5), (6), (7), (9), (10), (13), (14), (15), (23), (28), (36), (37), (42) and (47) are preferred.

Now, preferred examples of the acid-decomposable resin according to the present invention will be described below.

Acid-Decomposable Resin (a):

A resin having at least one monovalent polyalicyclic group represented by the following formula (aI), (aII) or (aIII) and a group which is decomposed by the action of an acid to increase solubility of the resin in an alkaline developing solution:

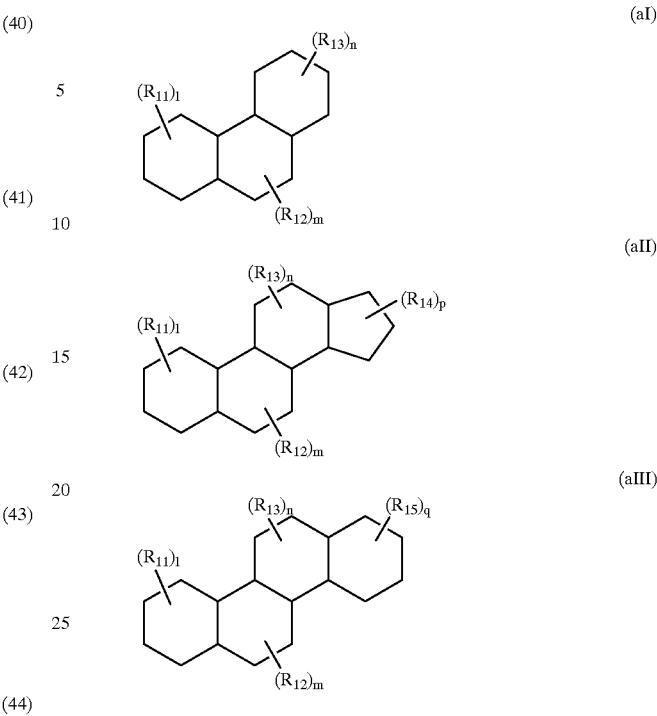

wherein $R_{11}$ to $R_{15}$ may be the same or different and each represents an optionally substituted alkyl, cycloalkyl, alkenyl, acyloxy, or alkynyl group, a halogen atom, a cyano group, or a group represented by $-R_{16}-O-R_{17}$,
$-R_{18}-CO-O-R_{19}$,
$-R_{20}-CO-O-NR_{21}R_{22}$,
$-R_{23}-O-CO-R_{24}$,
$-R_{25}-CO-X_1-A_1-R_{26}$,
$-R_{25}-CO-X_1-A_2-R_{27}$,
$-R_{25}-CO-NHSO_2-X_2-A-R_{27}$, or
$-COOZ$, wherein $R_{17}$ and $R_{19}$ may be the same or different and each represents a hydrogen atom, an optionally substituted alkyl, cycloalkyl, or alkenyl group, $-Z$, or such a group that the $-O-R_{17}$ or $-CO-O-R_{19}$ functions as a group which is decomposed by the action of an acid to increase solubility in an alkaline developing solution (acid-decomposable group), Z is a group represented by either of the following formulae:

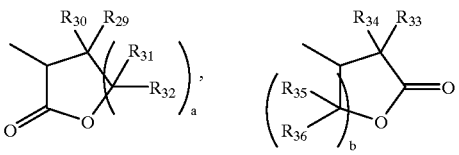

wherein $R_{29}$ to $R_{36}$ may be the same or different and each represents a hydrogen atom or an optionally substituted alkyl group, and a and b each represents 1 or 2;

$R_{21}$, $R_{22}$ and $R_{24}$ may be the same or different and each represents a hydrogen atom or an optionally substituted alkyl, cycloalkyl, or alkenyl group, provided that $R_{21}$ and $R_{22}$ may be bonded to each other to form a ring;

$R_{16}$, $R_{18}$, $R_{20}$ and $R_{23}$ may be the same or different and each represents a single bond or an optionally substituted alkylene, alkenylene, or cycloalkylene group;

$R_{25}$ represents a single bond or an optionally substituted alkylene or cycloalkylene group;

$X_1$ represents an oxygen atom, a sulfur atom, or —NH—;

$X_2$ represents a single bond or —NH—;

A represents one member or a combination of two or more members selected from the group consisting of a single bond, an optionally substituted alkylene group, an ether group, a thioether group, a carbonyl group, an ester group, an amido group, a sulfonamido group, a urethane group and a urea group;

$A_1$ represents one member or a combination of two or more members selected form the group consisting of an optionally substituted alkylene group, an ether group, a thioether group, a carbonyl group and an ester group;

$A_2$ represents one member or a combination of two or more members selected from the group consisting of an optionally substituted alkylene group, an ether group, a thioether group, a carbonyl group, an ester group, an amido group, a sulfonamido group, a urethane group and a urea group, provided that at least one $A_2$ is selected form sulfonamido, urethane, and urea groups, $R_{26}$ represents —COOH, —COOR$_{19}$, —OR$_{17}$, —COOZ, —CN, a hydroxy group, or —CO—NH—SO$_2$—R$_{40}$;

$R_{27}$ represents —COOH, —COOR$_{19}$, —OR$_{17}$, —CN, a hydroxy group, —CO—NH—R$_{40}$, —CO—NH—SO$_2$—R$_{40}$, —Z—, or an optionally substituted alkyl, cycloalkyl, or alkoxy group, wherein $R_{40}$ represents an optionally substituted alkyl or cycloalkyl group; and L, m, n, p, and q may be the same or different and each represents 0 or an integer of 1 to 5, provided that when l, m, n, p, or q is 2 or larger, the plural substituents with respect to each of $R_{11}$, $R_{12}$, $R_{13}$, $R_{14}$ and $R_{15}$ may be the same or different; two of the plural substituents, which are present on the same carbon, in combination may represent a carbonyl group (=O) or a thiocarbonyl group (=S); two of the plural substituents, which are bonded to adjacent carbon atoms, may represent a double bond between the carbon atoms; and two of the plural substituents may be bonded to each other to form a ring; and the bond for external linkage of each monovalent polyalicyclic group represented by formula (aI), (aII), or (aIII) being located in any position in the polycyclic hydrocarbon structure.

Now, the acid-decomposable resin (a) will be described in greater detail below.

The polyalicyclic group represented by formula (aI), (aII) or (aIII) and the acid-decomposable group each may be bonded to any site of the base resin. Specifically, the polyalicyclic group represented by formula (aI), (aII) or (aIII) and the acid-decomposable group may be bonded to different repeating units in the base resin. Alternatively, the base resin may contain repeating units each having both a polyalicyclic group represented by formula (aI), (aII) or (aIII) and an acid-decomposable group. Furthermore, the two kinds of groups may be bonded to the base resin in these two manners.

In the resin according to the present invention, the repeating structural units having groups represented by at least one of formula (aI) to (aIII) may be any units having these groups. However, repeating structural units represented by the following formula (aIV) to (aVI) are preferred. More preferred are those represented by formula (aIV).

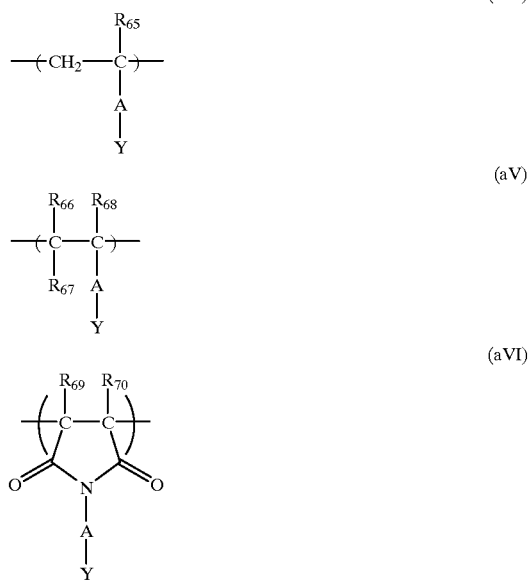

wherein, $R_{65}$, $R_{66}$, and $R_{68}$ to $R_{70}$ may be the same or different and each represents a hydrogen atom, a halogen atom, a cyano group, an alkyl group, or a haloalkyl group;

$R_{67}$ represents a cyano group, —CO—OR$_{77}$, or —CO—NR$_{78}$R$_{79}$;

A represents one member or a combination of two or more members selected from the group consisting of a single bond, an optionally substituted alkylene, alkenylene or cycloalkylene group, an ether group, a thioether group, a carbonyl group, an ester group, an amido group, a sulfonamido group, a urethane group, and a urea group, or represents —SO$_2$—, —O—CO—R$_{80}$—, —CO—O—R$_{81}$—, or —CO—NR$_{82}$—R$_{83}$—;

$R_{77}$ represents a hydrogen atom, an optionally substituted alkyl, cycloalkyl, or alkenyl group, or such a group that the —CO—OR$_{77}$ functions as an acid-decomposable group;

$R_{78}$, $R_{79}$, and $R_{82}$ may be the same or different, and each represents a hydrogen atom or an optionally substituted alkyl, cycloalkyl, or alkenyl group, or $R_{78}$ and $R_{79}$ may be bonded to each other to form a ring;

$R_{80}$, $R_{81}$, and $R_{83}$ may be the same or different, and each represents a single bond or a bivalent alkylene, alkenylene, or cycloalkylene group, or a bivalent group formed by combining these groups with an ether, ester, amido, urethane or ureido group; and Y represents any of the polyalicyclic groups represented by formulae (aI) to (aIII) described above.

Also, the acid-decomposable resin (a) is preferably a resin which has at least one repeating structural unit represented by formula (aIV), (aV), or (aVI) described above and at least one repeating structural unit represented by the following formulae (aVII), (aVIII), or (aIX), and which decomposes by the action of an acid to increase its solubility in an alkaline developing solution.

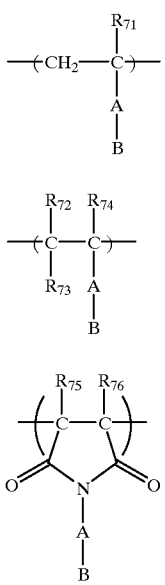

(aVII)

(aVIII)

(aIX)

wherein $R_{71}$, $R_{72}$, and $R_{74}$ to $R_{76}$ may be the same or different and each represents a hydrogen atom, a halogen atom, a cyano group, an alkyl group or a haloalkyl group;

$R_{73}$ has the same meaning as $R_{67}$ described above;

A has the same meaning as in formulae (aIV) to (aVI) described above; and

B is a group which is decomposed by the action of an acid to increase solubility in an alkaline developing solution.

The acid-decomposable resin (a) preferably further contains at least one repeating structural unit represented by the following formula (aX), (aXI), or (aXII) having a carboxy group.

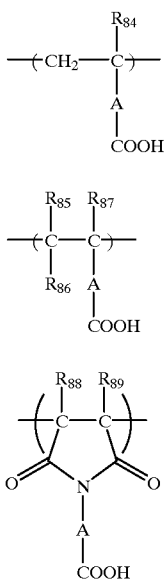

(aX)

(aXI)

(aXII)

wherein $R_{84}$, $R_{85}$, and $R_{87}$ to $R_{89}$ may be the same or different and each represents a hydrogen atom, a halogen atom, a cyano group, an alkyl group or a haloalkyl group;

$R_{86}$ represents a cyano group, a carboxy group, —CO—$OR_{90}$, or —CO—$NR_{91}R_{92}$;

A has the same meaning as in formulae (aIV) to (aVI);

$R_{90}$ represents an optionally substituted alkyl, cycloalkyl, or alkenyl group;

$R_{91}$ and $R_{92}$ may be the same or different and each represents a hydrogen atom or an optionally substituted alkyl, cycloalkyl, or alkenyl group, or $R_{91}$ and $R_{92}$ may be bonded to each other to form a ring.

Preferred examples of the alkyl group represented by each of $R_{11}$ to $R_{15}$, $R_{17}$, $R_{19}$, $R_{21}$, $R_{22}$, $R_{24}$, $R_{29}$ to $R_{36}$, $R_{40}$, $R_{65}$, $R_{66}$, $R_{68}$ to $R_{70}$, $R_{71}$, $R_{72}$, $R_{74}$ to $R_{79}$, $R_{82}$, $R_{84}$, $R_{85}$, and $R_{87}$ to $R_{92}$ in the formulae described above include an optionally substituted alkyl group having from 1 to 8 carbon atoms, such as methyl, ethyl, propyl, n-butyl, sec-butyl, hexyl, 2-ethylhexyl, and octyl.

Preferred examples of the cycloalkyl group represented by each of $R_{11}$ to $R_{15}$, $R_{17}$, $R_{19}$, $R_{21}$, $R_{22}$, $R_{24}$, $R_{29}$ to $R_{36}$, $R_{40}$, $R_{65}$, $R_{66}$, $R_{68}$ to $R_{70}$, $R_{71}$, $R_{72}$, $R_{74}$ to $R_{79}$, $R_{82}$, $R_{84}$, $R_{85}$, and $R_{87}$ to $R_{92}$ include an optionally substituted cycloalkyl group such as cyclopropyl, cyclopentyl, cyclohexyl, adamantyl, 2-methyl-2-adamantyl, norbornyl, bornyl, isobornyl, tricyclodecanyl, dicyclopentenyl, norbornaneepoxy, menthyl, isomenthyl, neomenthyl, and tetracyclodecanyl.

Preferred Examples of the alkenyl group include an optionally substituted alkenyl group having from 2 to 6 carbon atoms, such as vinyl, propenyl, allyl, butenyl, pentenyl, hexenyl, and cyclohexenyl.

Examples of the alkoxy group represented by each of $R_{11}$ to $R_{15}$ and $R_{27}$ include an optionally substituted alkoxy group having from 1 to 4 carbon atoms, such as methoxy, ethoxy, propoxy, and butoxy.

Examples of the acyloxy group represented by each of $R_{11}$ to $R_{15}$ include an optionally substituted acyloxy group having from 1 to 4 carbon atoms, such as acetoxy and butyryloxy.

Preferred examples of the alkynyl group represented by each of $R_{11}$ to $R_{15}$ include an alkynyl group having from 2 to 4 carbon atoms, such as acetyl and propargyl.

In the case where l, m, n, p, or q is 2 or larger, the plural substituents with respect to each of $R_{11}$, $R_{12}$, $R_{13}$, $R_{14}$ and $R_{15}$ may be the same or different; two of the plural substituents, which are present on the same carbon, in combination may represent a carbonyl group (=O) or a thiocarbonyl group (=S).

Two of the plural substituents, which are bonded to adjacent carbon atoms, may represent a double bond between the carbon atoms. The carbon-carbon double bond thus formed preferably is not a conjugated carbon-carbon double bond.

In the case where there are two or more substituents represented by each of $R_{11}$, to $R_{15}$, two of these may be bonded to each other to form a ring. Preferred examples of such a ring include three- to eight-membered rings optionally containing one or more heteroatoms, such as cyclopropyl, cyclopentyl, cyclohexyl, cycloheptyl, tetrahydrofuranyl, and tetrahydropyranyl. These rings may have substituents.

The bond for external linkage of each monovalent polyalicyclic group represented by formula (aI), (aII), or (aIII) may be located in any position in the polycyclic hydrocarbon structure, and is preferably located in the 3-, 7-, or 12-position of the steroid framework.

Preferred examples of the haloalkyl group represented by each of $R_{65}$, $R_{66}$, $R_{68}$ to $R_{70}$, $R_{71}$, $R_{72}$, $R_{74}$ to $R_{76}$, $R_{84}$, $R_{85}$, and $R_{87}$ to $R_{89}$ include an alkyl group having from 1 to 4 carbon atoms and substituted with one or more of fluorine, chlorine, and bromine atoms. Specific examples thereof include fluoromethyl, chloromethyl, bromomethyl, fluoroethyl, chloroethyl, and bromoethyl.

In the present invention, examples of the halogen atom include fluorine, chlorine, and bromine atoms.

Preferred examples of the alkylene group represented by each of $R_{16}$, $R_{18}$, $R_{20}$, $R_{23}$, and A include an optionally substituted alkylene group having form 1 to 8 carbon atoms, such as methylene, ethylene, propylene, butylene, hexylene, and octylene.

Preferred examples of the alkenylene group include an optionally substituted alkenylene group having from 2 to 6 carbon atoms, such as ethylene, propenylene, and butenylene. Preferred examples of the cycloalkylene group include an optionally substituted cycloalkylene group having from 5 to 8 carbon atoms, such as cyclopentylene and cyclohexylene.

Examples of the optionally substituted alkylene group represented by each of $R_{25}$, A, $A_1$, and $A_2$ include a group represented by the following formula:

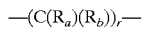
—(C($R_a$)($R_b$))$_r$— wherein $R_a$ and $R_b$ may be the same or different and each represents a hydrogen atom, an alkyl group, a substituted alkyl group, a halogen atom, a hydroxy group or an alkoxy group. Preferred examples of the alkyl group include a lower alkyl group such as methyl, ethyl, propyl, isopropyl, and butyl. More preferably, the alkyl group is a methyl, ethyl, propyl or isopropyl group. Examples of the substituent of the substituted alkyl group include a hydroxy group, a halogen atom, and an alkoxy group. Examples of the alkoxy group include an alkoxy group having from 1 to 4 carbon atoms such as methoxy, ethoxy, propoxy, and butoxy. Symbol r represents an integer of from 1 to 10.

Preferred examples of the cycloalkylene group represented by $R_{25}$ include an optionally substituted cycloalkylene group having from 5 to 8 carbon atoms, such as cyclopentylene and cyclohexylene.

$A_2$ contains at least one of sulfonamido, urethane, and urea groups, and these groups each may form a divalent group in cooperation with one member or a divalent combination of two or more members selected from the group consisting of alkylene, substituted alkylene, ether, thioether, carbonyl, ester, amido, sulfonamido, urethane, and urea groups.

Symbols l, m, n, p, and q in formulae (aI) to (aIII) each represents 0 or an integer of from 1 to 5, preferably represents 0 or an integer of 1 or 2.

Examples of the alkylene, alkenylene, and cycloalkylene groups represented by each of $R_{80}$, $R_{81}$, and $R_{83}$ include the same alkylene, alkenylene, and cycloalkylene groups as those descried above, and further include divalent groups each made of any of those groups and, bonded thereto, at least one of ether, ester, amido, urethane, and urea groups.

Preferred examples of the ring constituted of $R_{21}$ and $R_{22}$ bonded to each other or of $R_{78}$ and $R_{79}$ bonded to each other together with the nitrogen atom include five- to eight-membered rings. Specific examples thereof include pyrrolidine, piperidine, and piperazine.

$R_{17}$, $R_{19}$, $R_{77}$, and B each constitutes an acid-decomposable group.

In the resin according to the present invention, the acid-decomposable group may be contained in the structure of group represented by at least one of formulae (aI) to (aIII) (for example, as —O—$R_{17}$ or —C—O—$R_{19}$), or may be contained in a repeating unit having a group represented by formula (aI), (aII), or (aIII) (for example, as —CO—O—$R_{77}$), or may be contained in other repeating units The acid-decomposable groups may be contained in two or more kinds of such structures or units.

Examples of the acid-decomposable group include a group which is hydrolyzed by the action of an acid to form an acid and a group which releases a carbon cation by the action of an acid to form an acid. Preferred examples include groups represented by the following formulae (XIII) and (XIV). Such acid-decomposable groups serve to impart excellent storage stability.

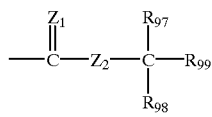

(XIII)

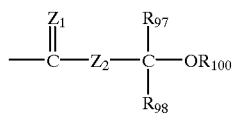

(XIV)

wherein $R_{97}$ to $Rh_{99}$ may be the same or different and each represents a hydrogen atom or an optionally substituted alkyl, cycloalkyl, or alkenyl group, provided that at least one of $R_{97}$ to $R_{99}$ in formula (XIII) is not a hydrogen atom; $R_{10}$ represents an optionally substituted alkyl, cycloalkyl, or alkenyl group; or two of $R_{97}$ to $R_9$ in formula (XIII) or two of $R_{97}$, $R_{98}$ and $R_{100}$ in formula (XIV) may be bonded to each other to form a three- to eight-membered ring structure comprising carbon atoms and optionally containing one or more heteroatoms; and $Z_1$ and $Z_2$ may be the same or different and each represents an oxygen atom or a sulfur atom.

Specific examples of such a ring include cyclopropyl, cyclopentyl, cyclohexyl, cycloheptyl, 1-cyclohexenyl, 2-tetrahydrofuranyl, and 2-tetrahydropyranyl.

Preferred examples of the alkyl and cycloalkyl groups are the same as those described hereinabove with regard to $R_{11}$ to $R_{15}$. Preferred examples of the alkenyl group include an optionally substituted alkenyl group having from 2 to 6 carbon atoms, such as vinyl, propenyl, allyl, butenyl, pentenyl, hexenyl, and cyclohexenyl.

Other preferred examples of the acid-decomposable group include —C(=O)—O—R (wherein R represents a trialkylsilyl group, e.g., trimethylsilyl, tert-butyldimethylsilyl or diisopropylmethylsilyl, a mevaloric lactone group, or a 3-oxocyclohexyl group).

Preferred examples of the substituent which may be possessed by the substituents described above in detail include a hydroxy group, a halogen atom (fluorine, chlorine, bromine, and iodine), a nitro group, a cyano group, an amido group, a sulfonamido group, an alkyl group such as the same described hereinabove with regard to $R_{11}$ to $R_{15}$, an alkoxy group such as methoxy, ethoxy, hydroxyethoxy, propoxy, hydroxypropoxy and butoxy, an alkoxycarbonyl group such as methoxycarbonyl and ethoxycarbonyl, an acyl group such as formyl, acetyl and benzoyl, an acyloxy group such as acetoxy and butyryloxy, and a carboxy group.

The content of repeating unit having the alicyclic group represented by formula (aI), (aII) or (aIII) (preferably a repeating unit represented by at least one of formulae (aIV) to (aVI)) in the resin according to the present invention may be regulated while taking account of a balance among the dry etching resistance, developing property with alkali and the like. However, the content thereof is preferably 20% by mole or higher, more preferably from 30 to 80% by mole, yet more preferably from 40 to 65% by mole, based on the total repeating units.

The content of repeating unit having the above described acid-decomposable group (preferably a repeating unit represented by at least one of formula (aVII) to (aIX)) in the resin according to the present invention is regulated while taking account of characteristics such as the developing property with alkali, adhesion to a substrate and the like. However, the content thereof is preferably from 5 to 80% by mole, more preferably from 10 to 70% by mole, yet more preferably from 20 to 60% by mole, based on the total repeating unit. The content of repeating unit containing the acid-decomposable group means an amount of all repeating units containing the acid-decomposable group in the resin, including those contained in a repeating unit having the group represented by formula (aI), (aII), or (aIII).

A monomer corresponding to the repeating unit of the acid-decomposable resin can be synthesized generally by an esterification reaction of, e.g., an alcohol having in its molecule a partial structure represented by formula (aI), (aII) or (aIII) with a carboxylic acid having a polymerizable functional group in its molecule or a derivative thereof, or by reacting such an alcohol with an imide. A polymer containing the repeating unit according to the present invention can be obtained by polymerizing corresponding monomer using an ordinary radical initiator, e.g., an azo initiator. Alternatively, the polymer can be obtained by subjecting the monomer to cationic polymerization or anionic polymerization in a conventional manner. The polymer obtained may be treated to convert its functional groups to another kind of functional groups, if desired.

Specific examples of the repeating unit represented by formula (aIV) to (aVI) are set forth below as (a1) to (a131). However, the present invention should not be construed as being limited thereto.

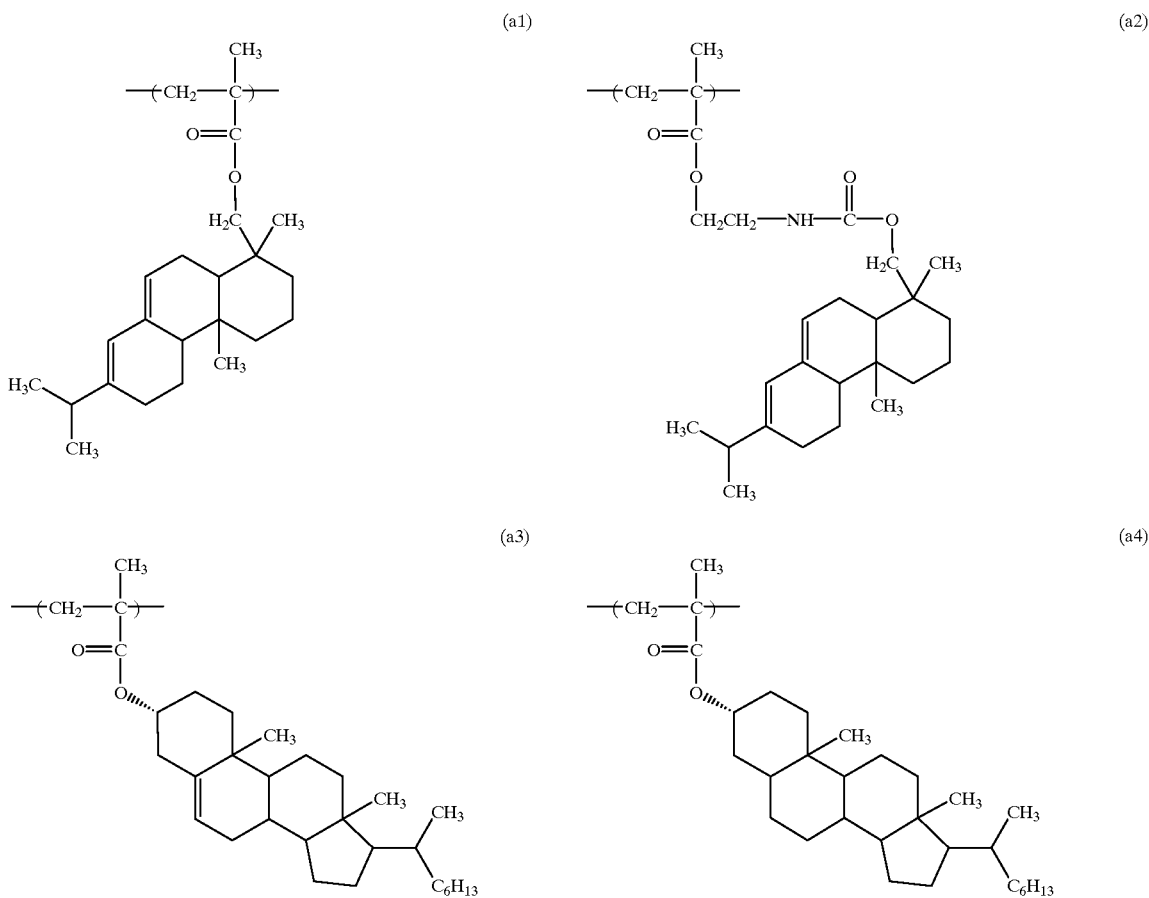

-continued
(a5)
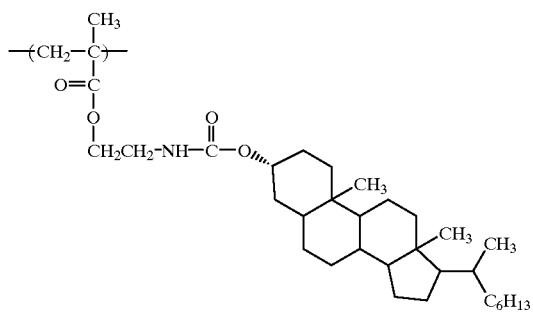
(a6)
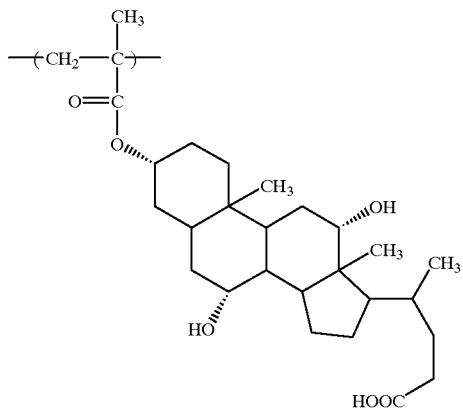
(a7)
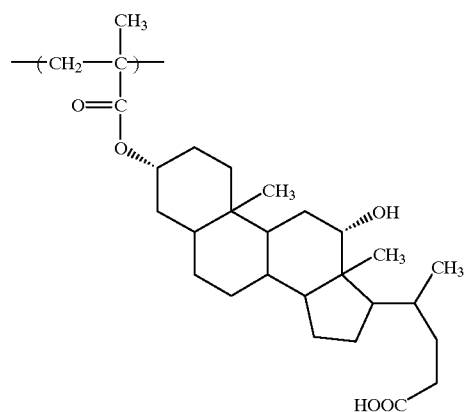
(a8)
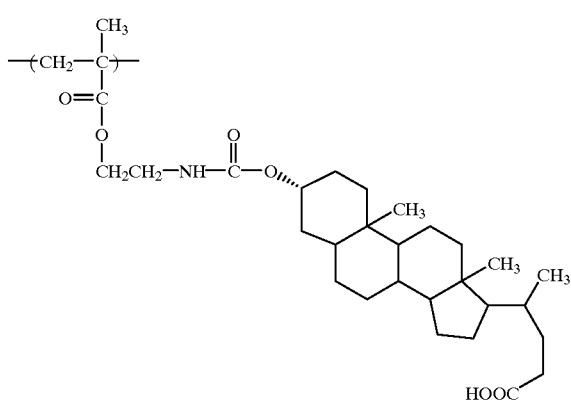
(a9)
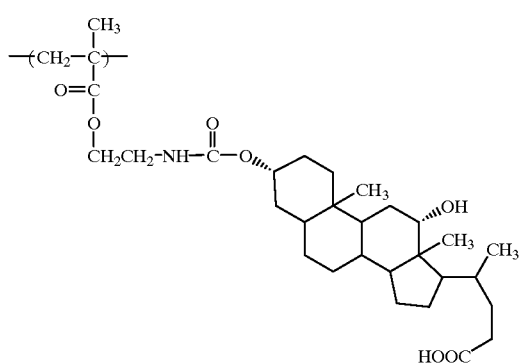
(a10)
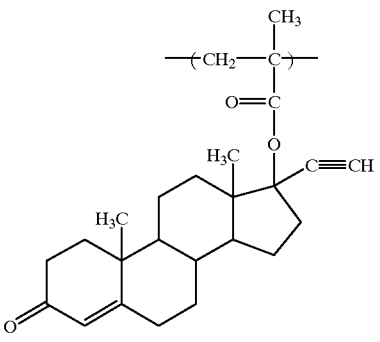

-continued
(a11)
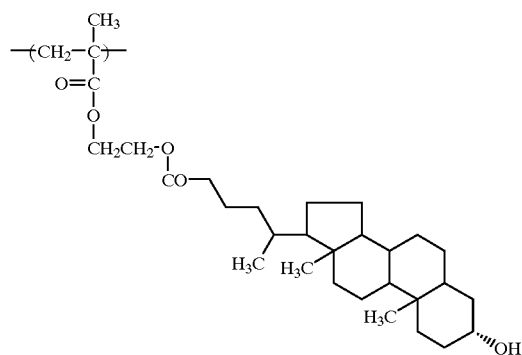
(a12)
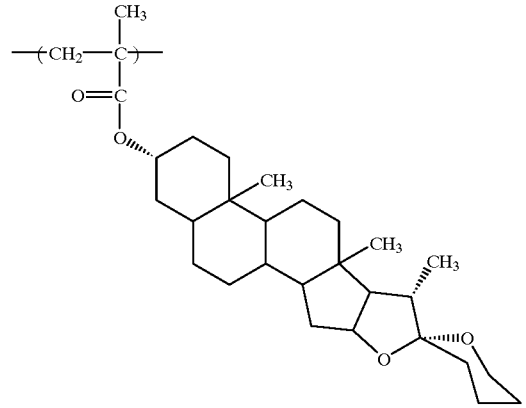
(a13)
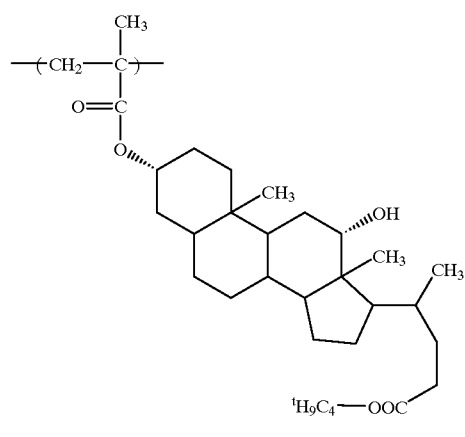
(a14)
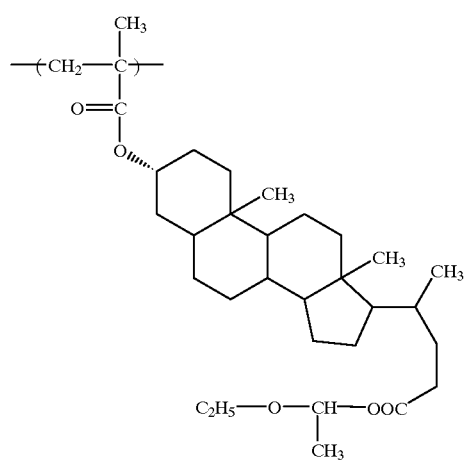
(a15)
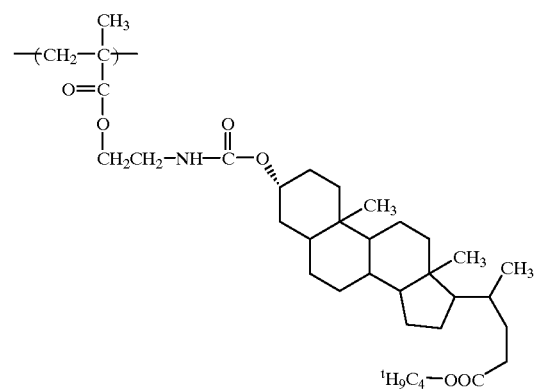
(a16)
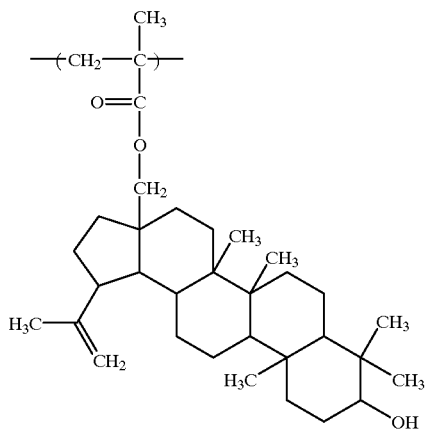

-continued
(a17)
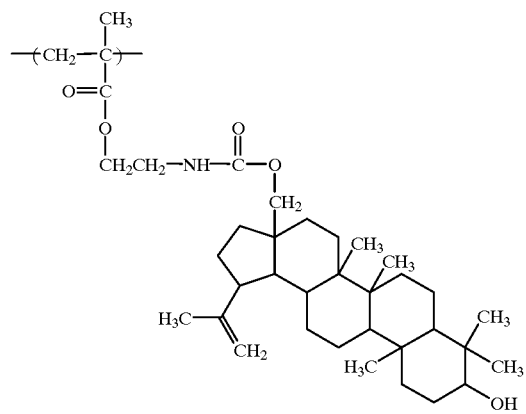
(a18)
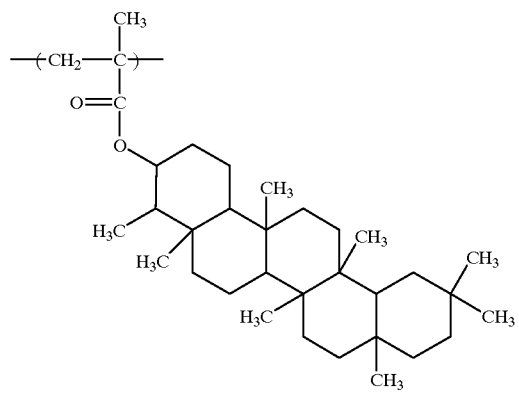
(a19)
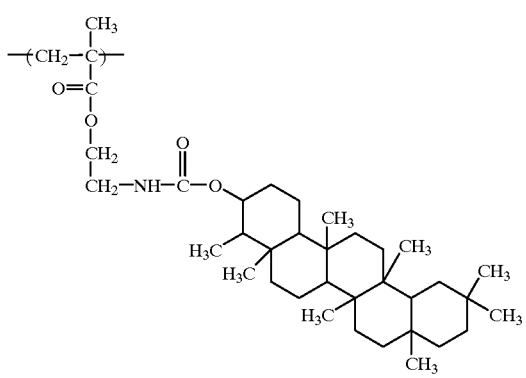
(a20)
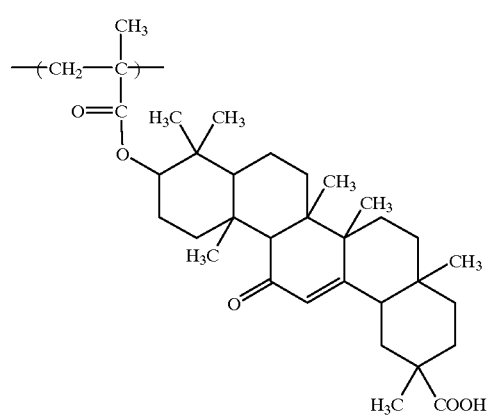
(a21)
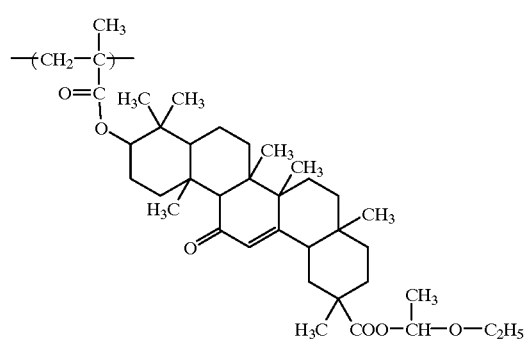
(a22)
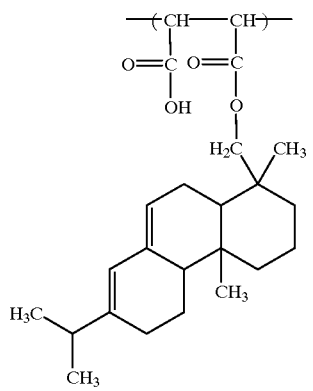

-continued
(a23)
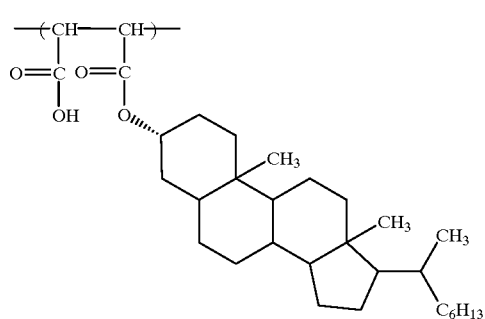
(a24)
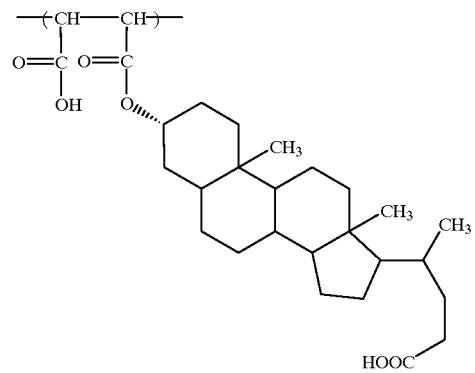
(a25)
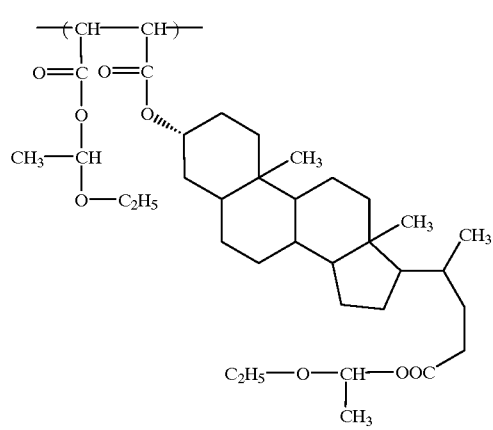
(a26)
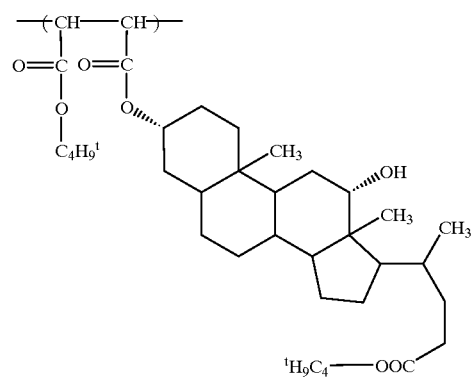
(a27)
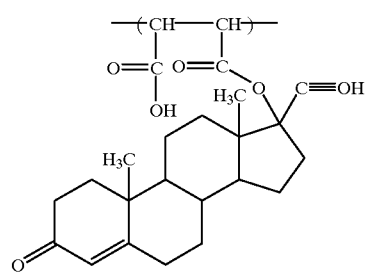
(a28)
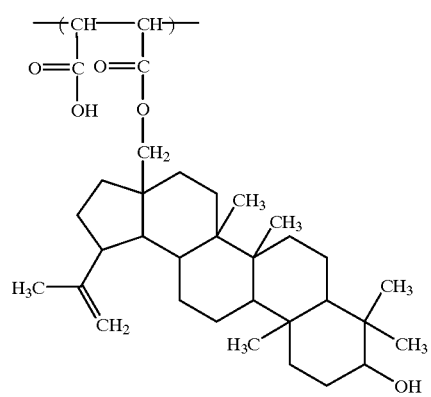
(a29)
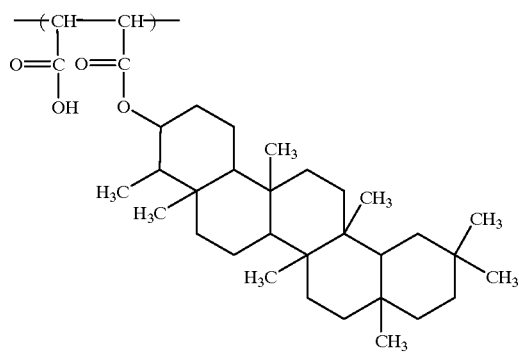
(a30)
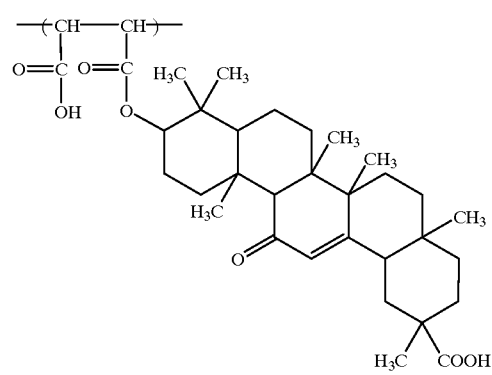

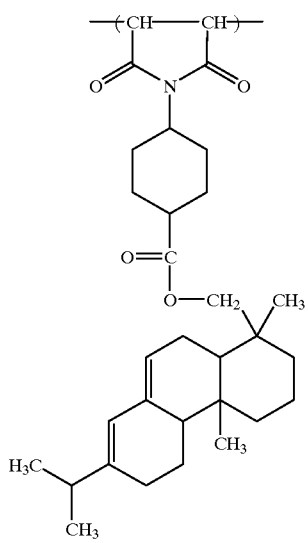 (a31)
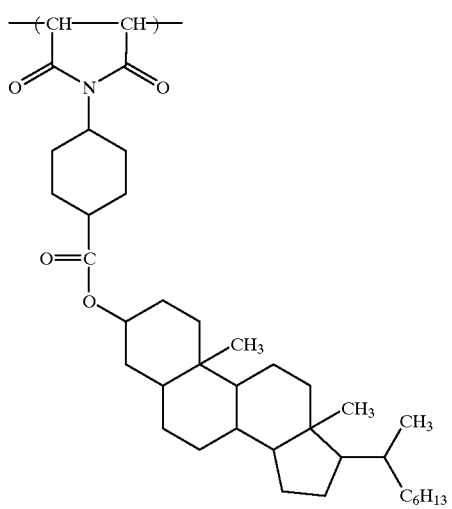 (a32)
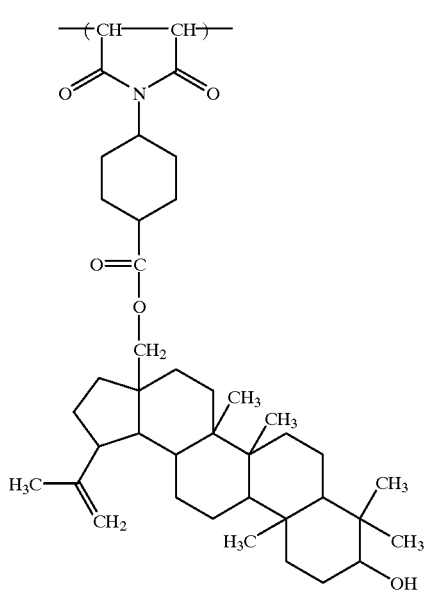 (a33)
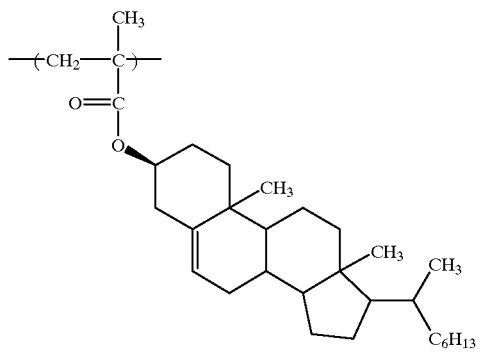 (a34)
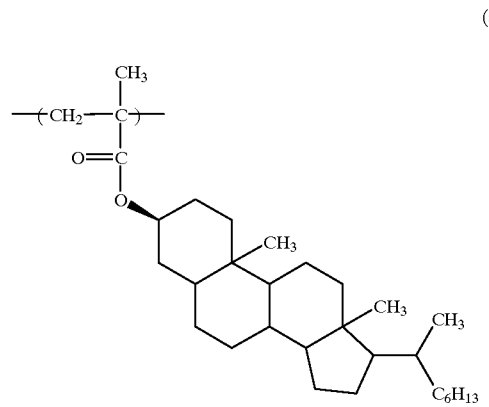 (a35)
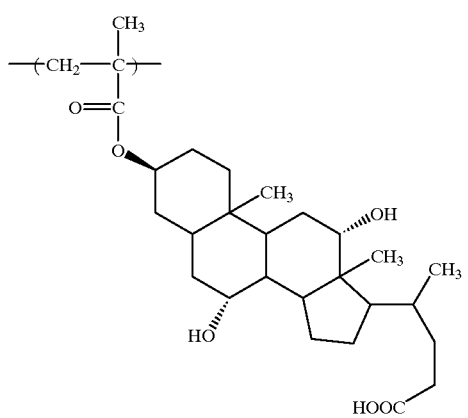 (a36)

(a37)
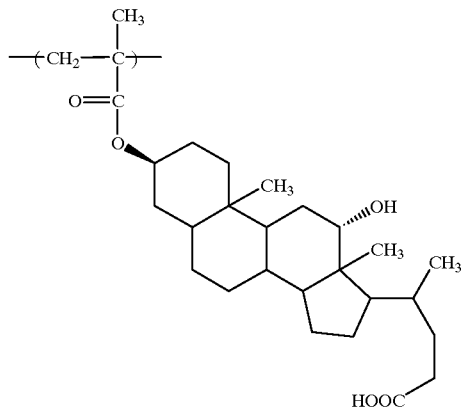
(a38)
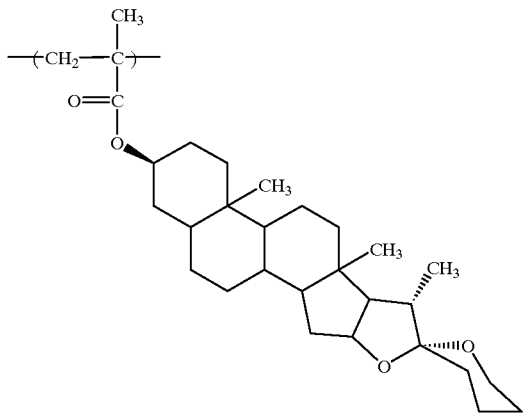
(a39)
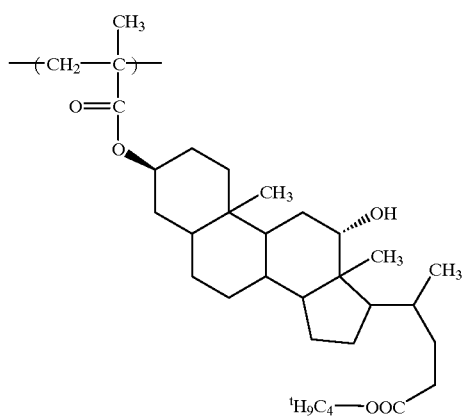
(a40)
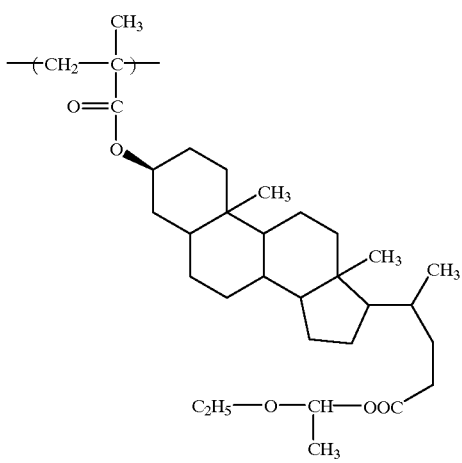
(a41)
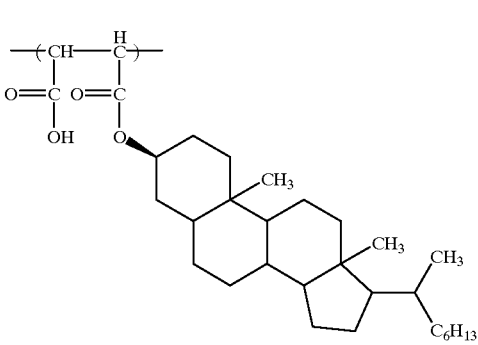
(a42)
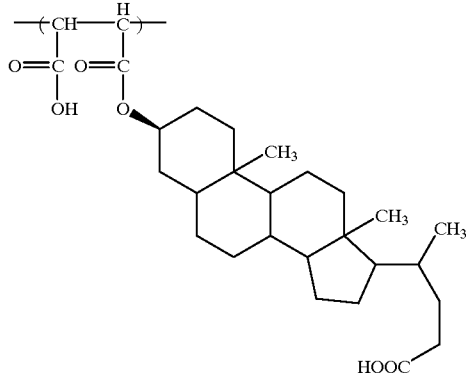

(a43)
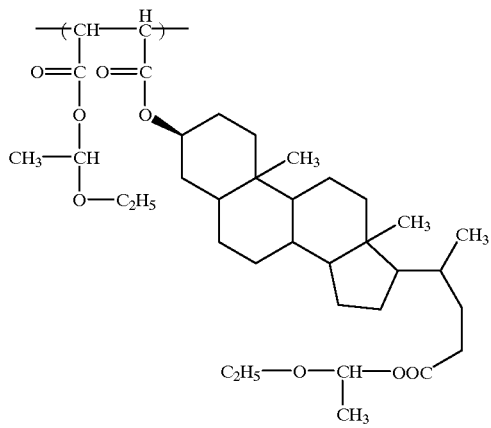
(a44)
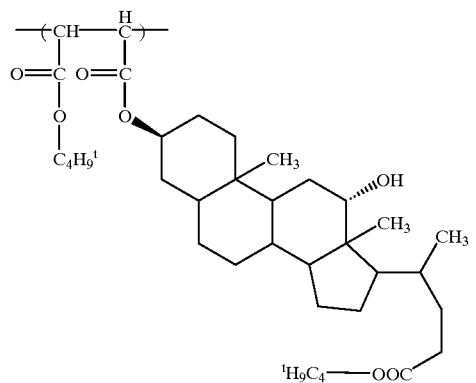
(a45)
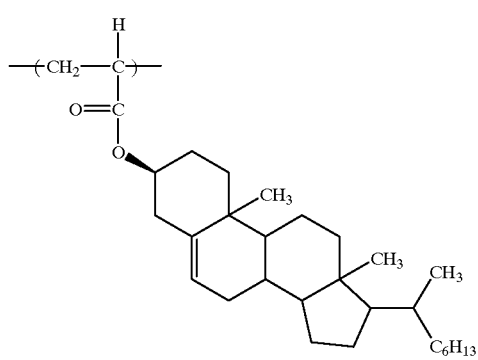
(a46)
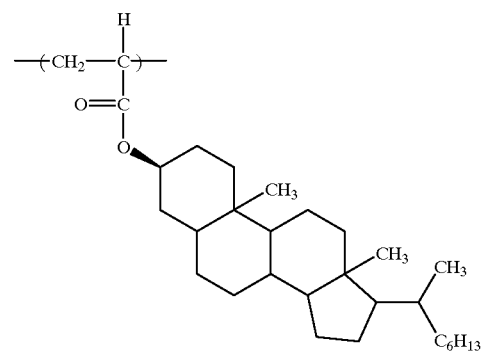
(a47)
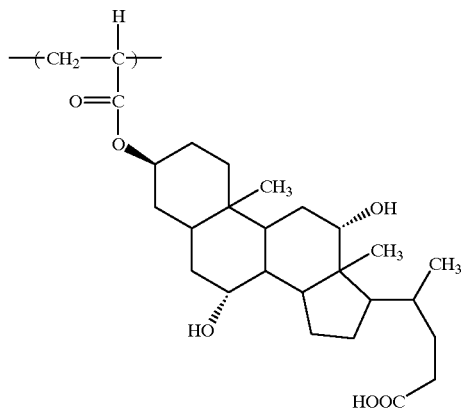
(a48)
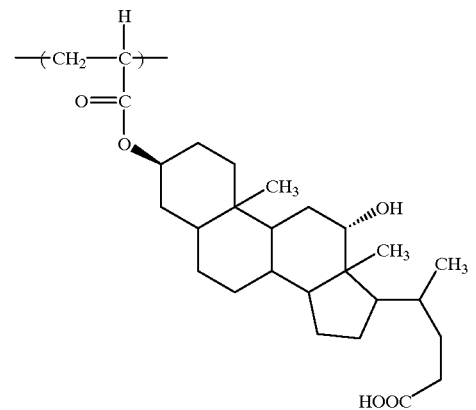

-continued
(a49)
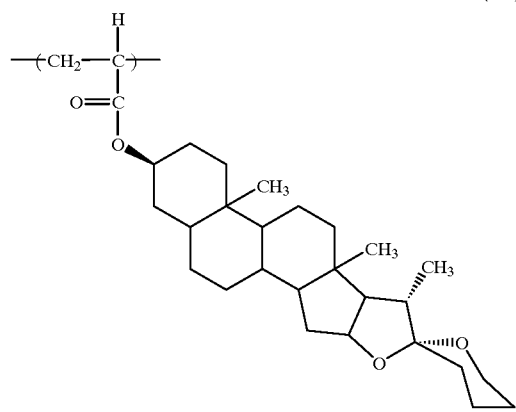
(a50)
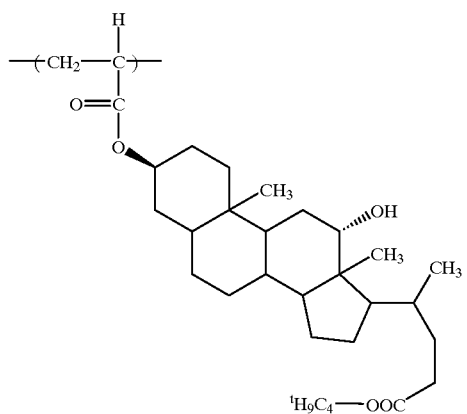
(a51)
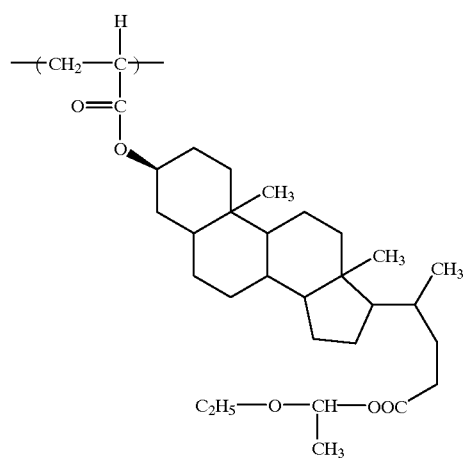
(a52)
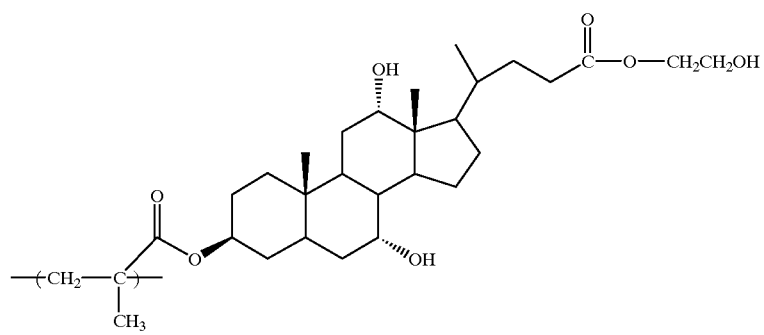
(a53)
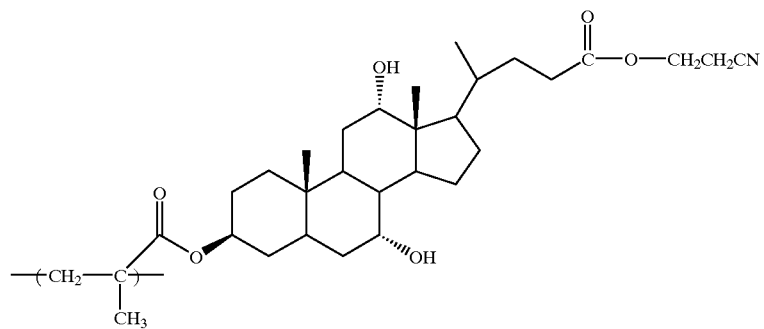

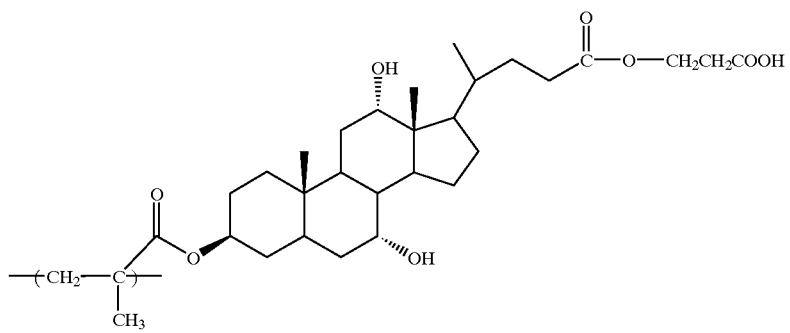
(a54)
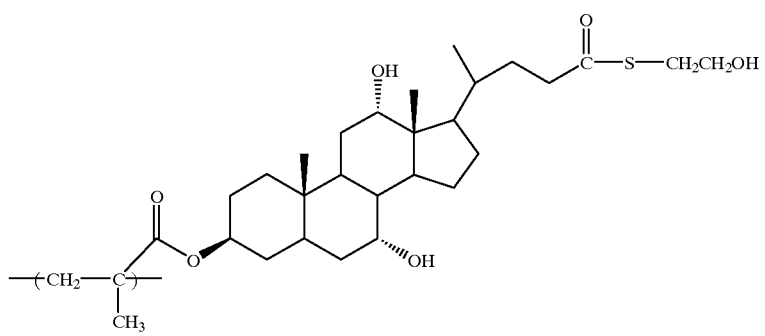
(a55)
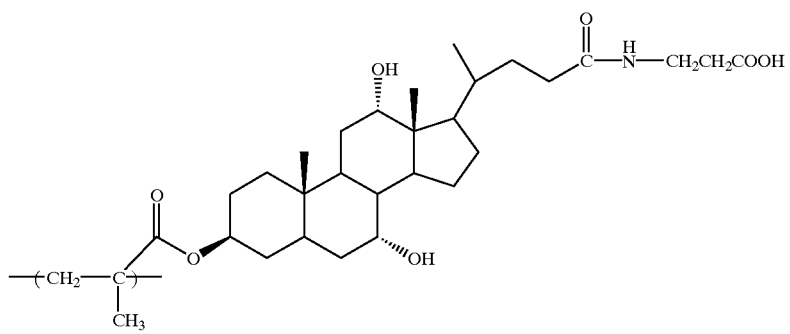
(a56)
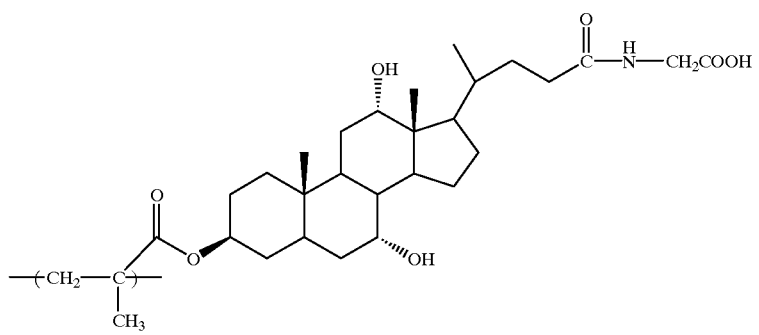
(a57)

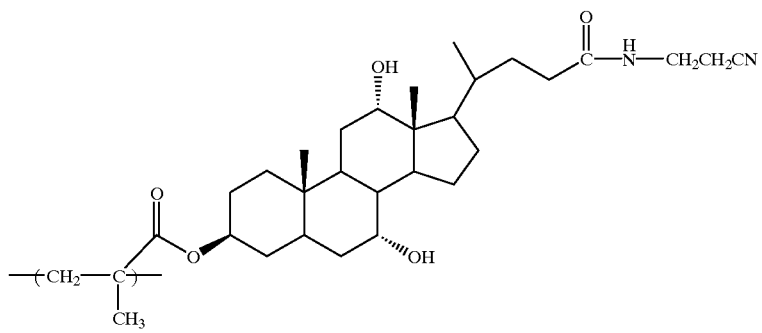
(a58)
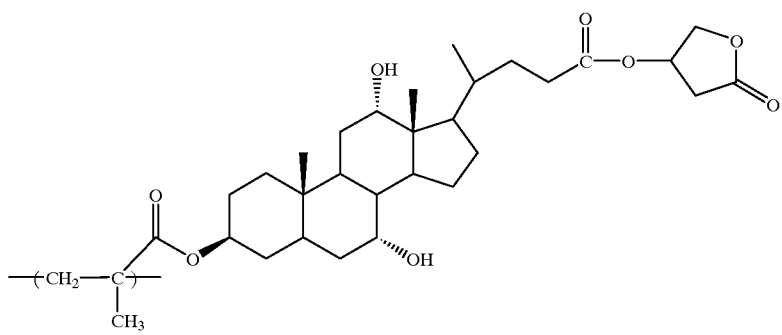
(a59)
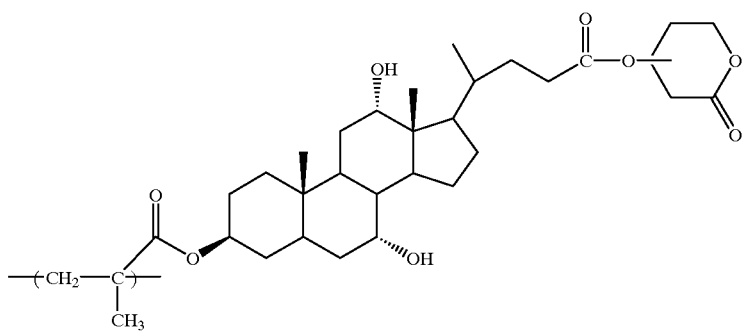
(a60)
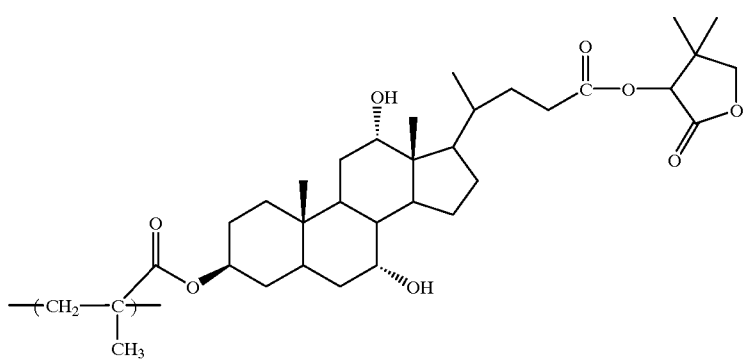
(a61)

(a62)
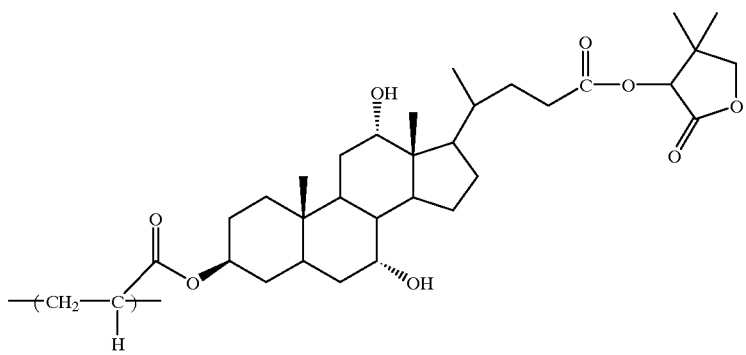
(a63)
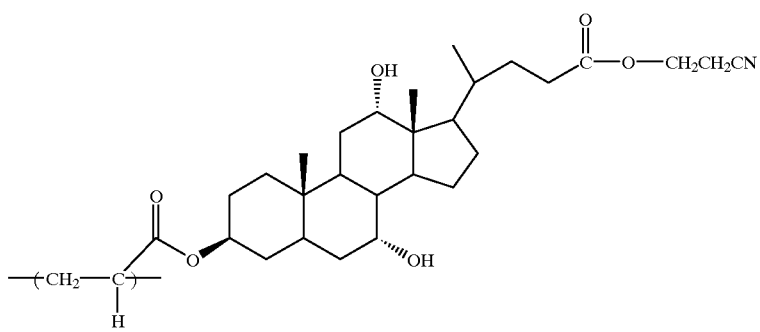
(a64)
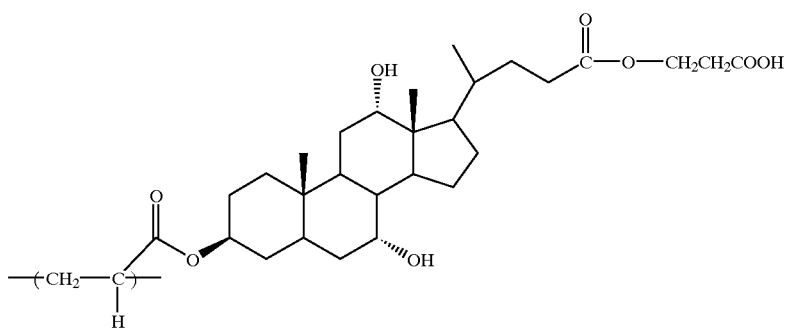
(a65)
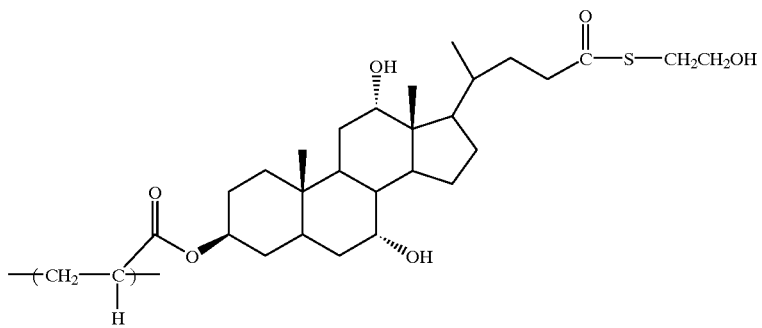

-continued
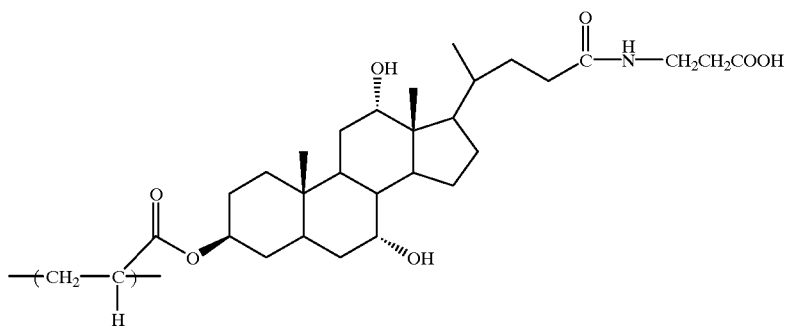
(a66)
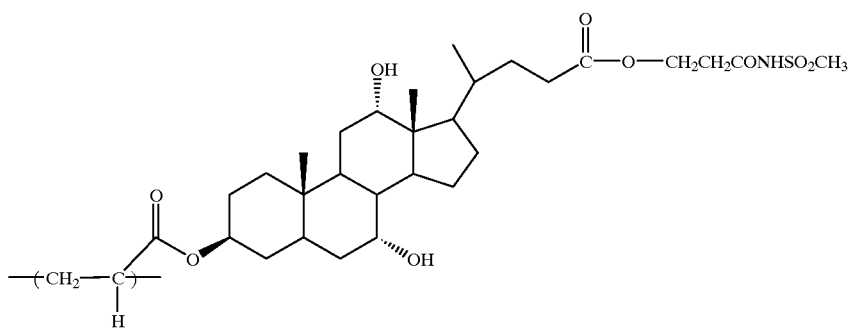
(a67)
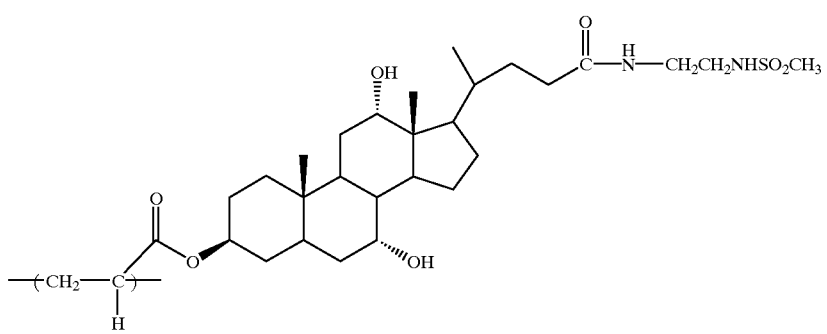
(a68)
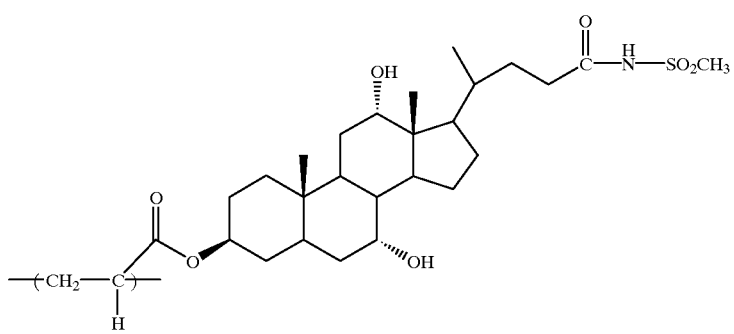
(a69)

-continued
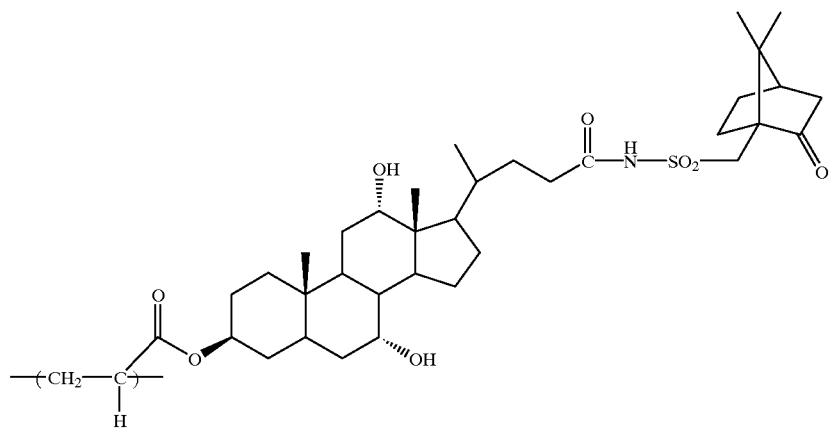
(a70)
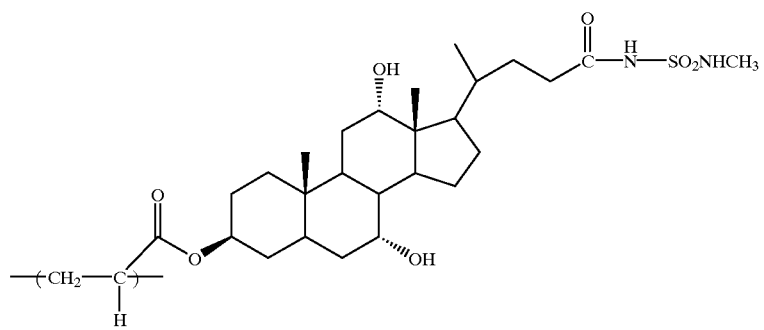
(a71)
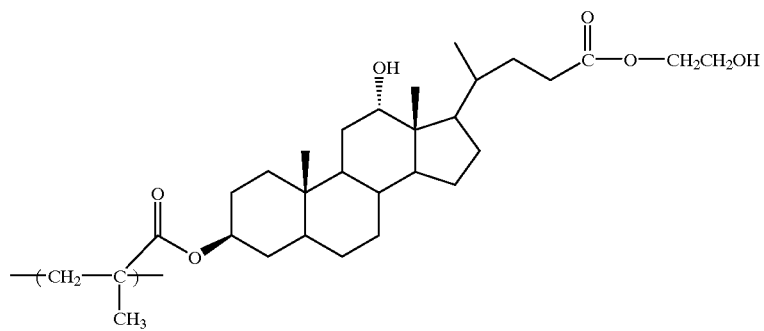
(a72)
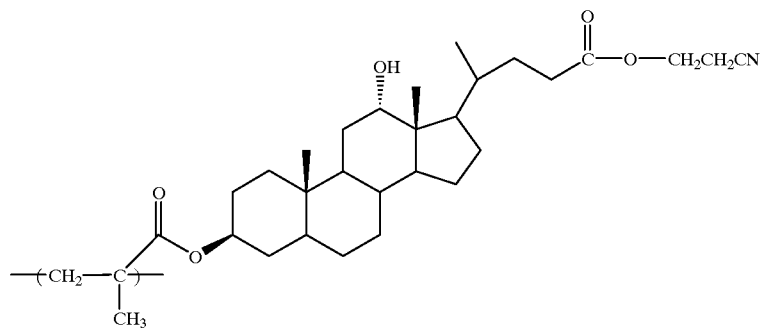
(a73)

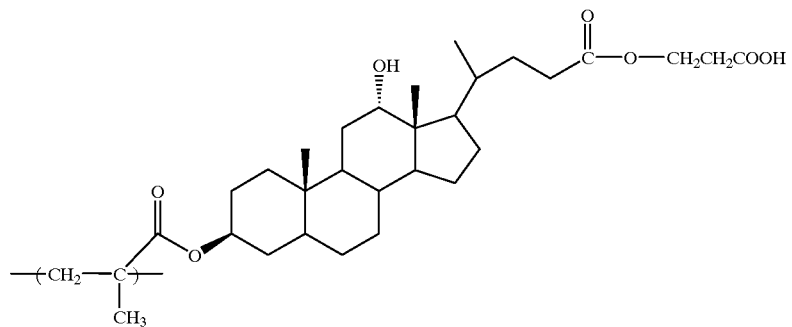
(a74)
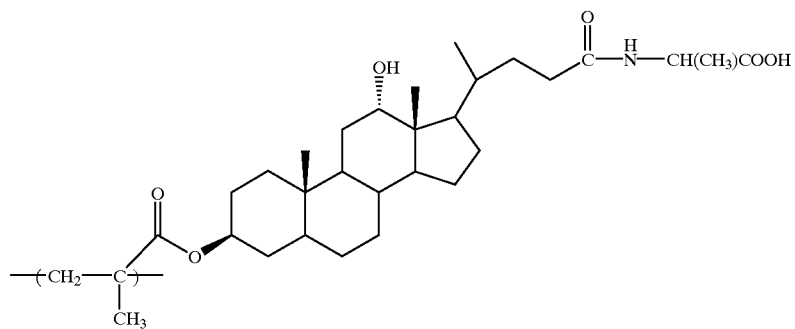
(a75)
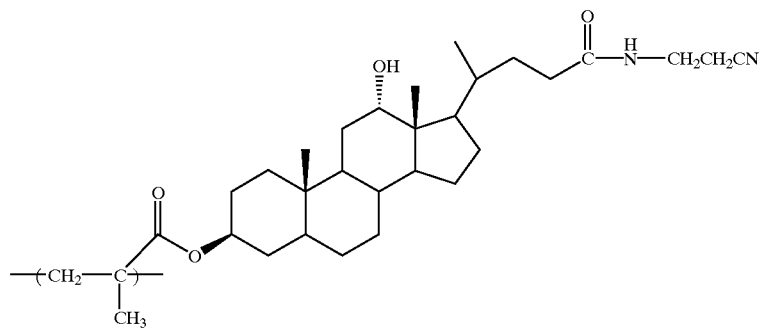
(a76)
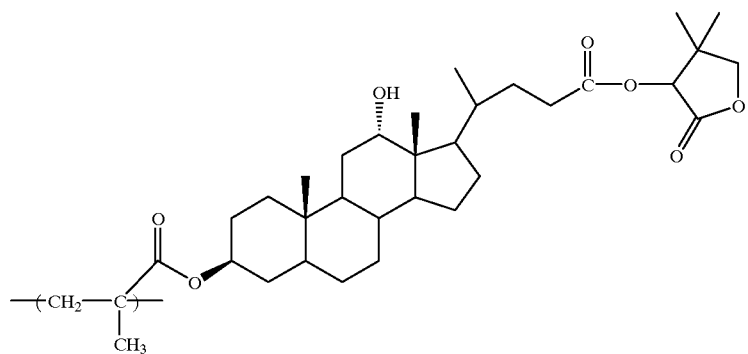
(a77)

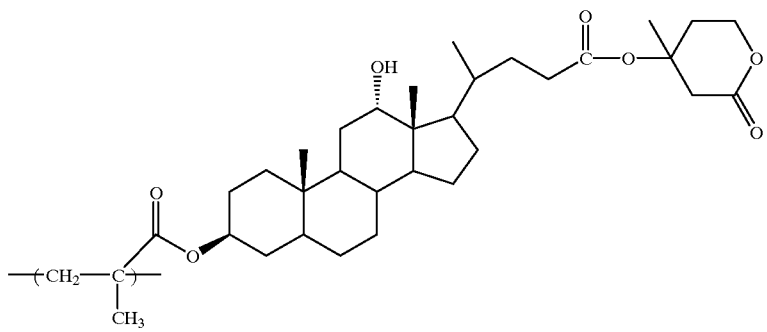
(a78)
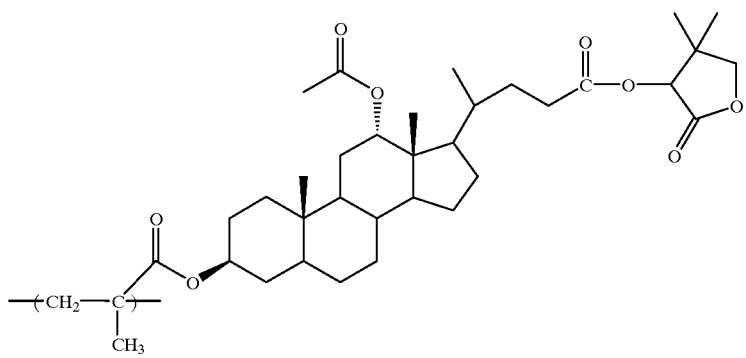
(a79)
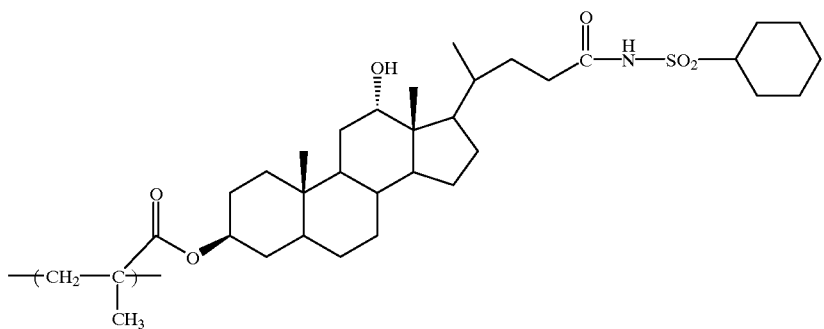
(a80)
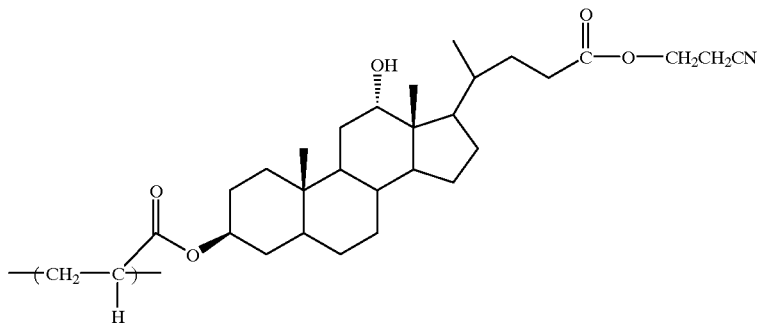
(a81)

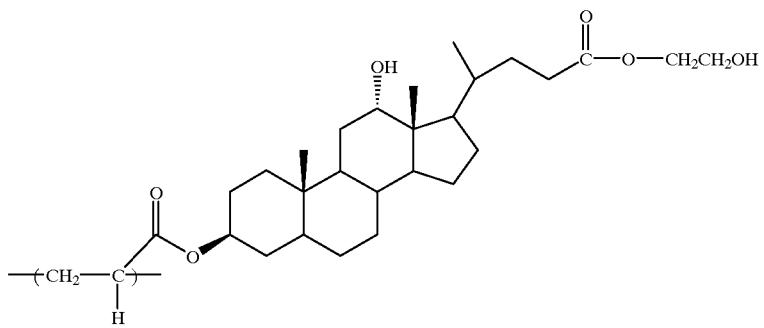
(a82)
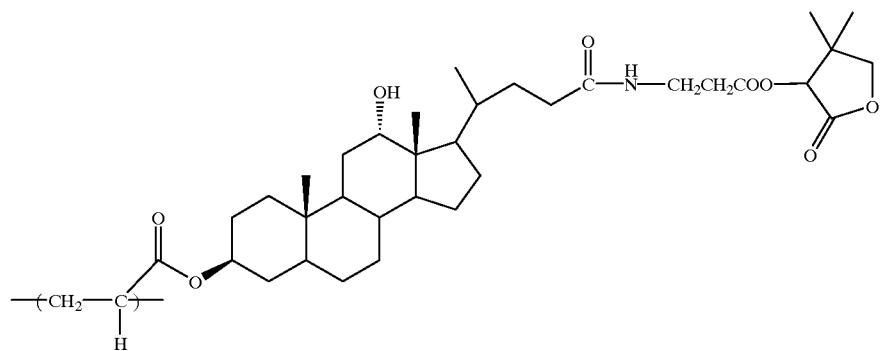
(a83)
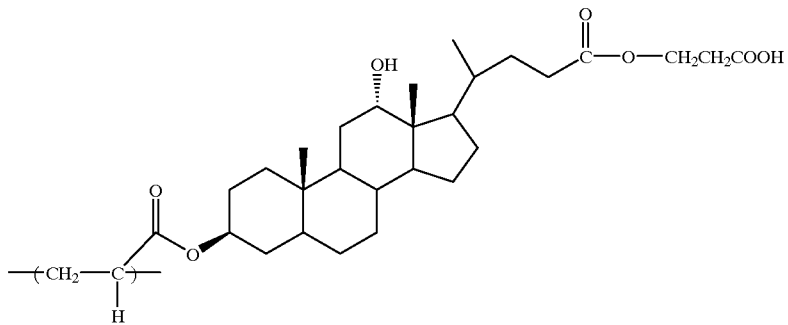
(a84)
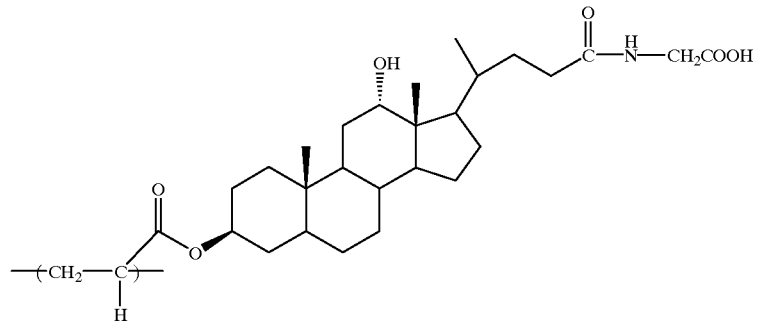
(a85)

(a86)
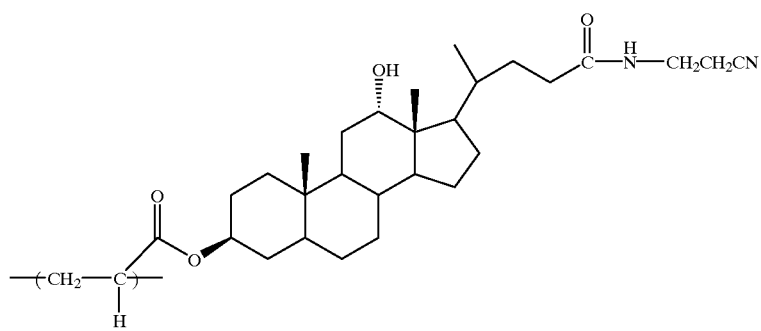
(a87)
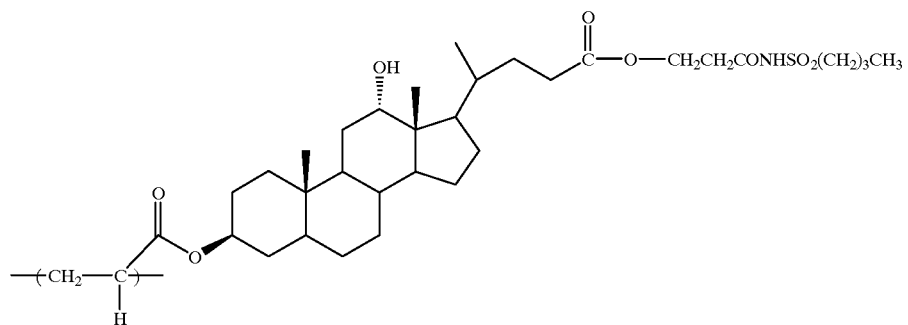
(a88)
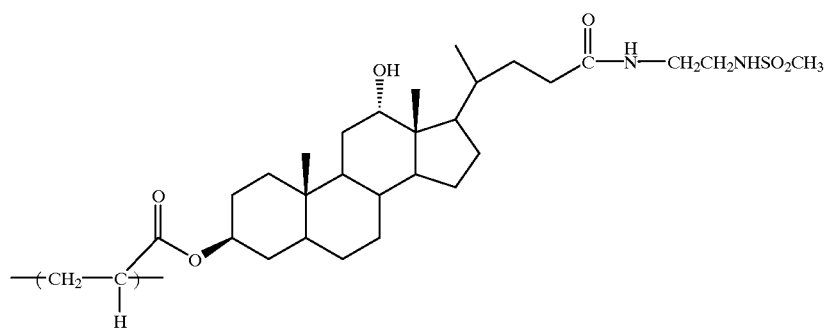
(a89)
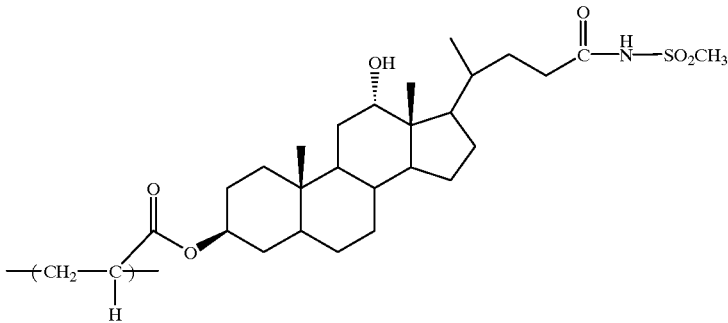

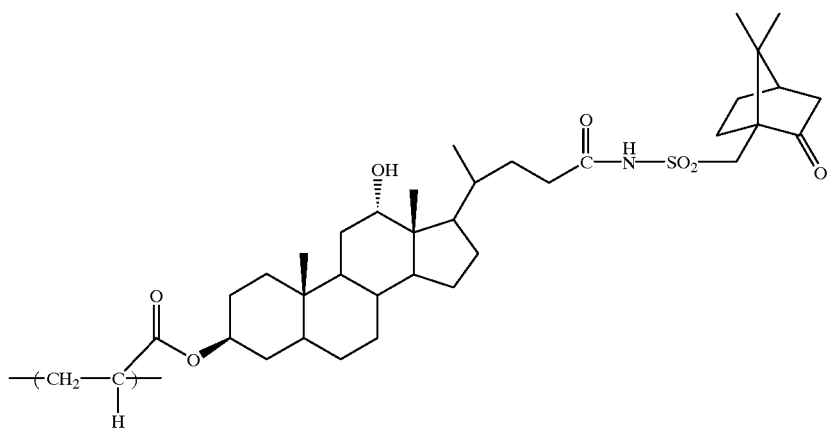
(a90)
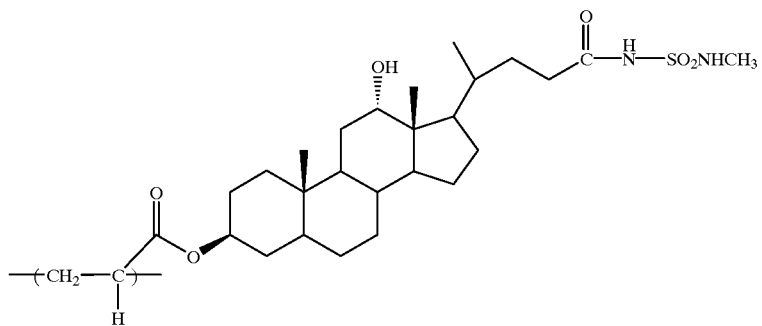
(a91)
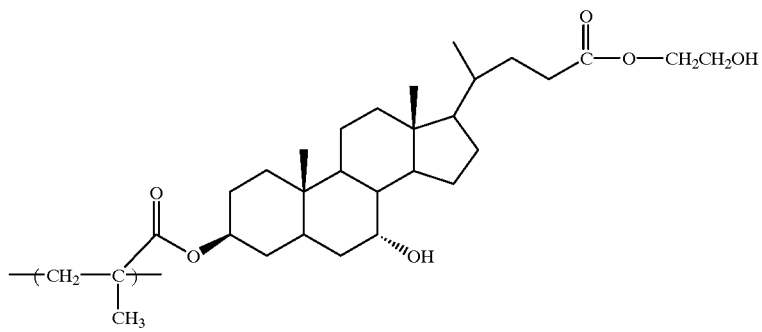
(a92)
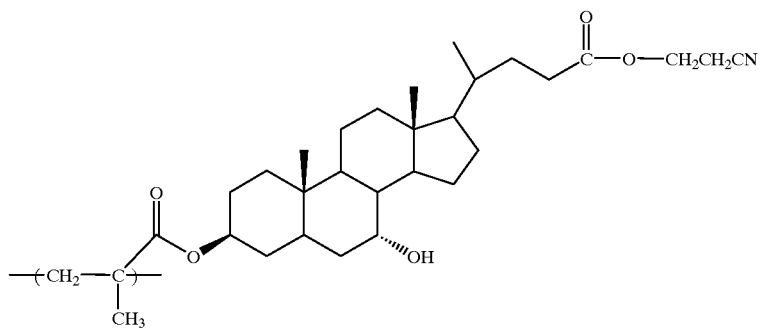
(a93)

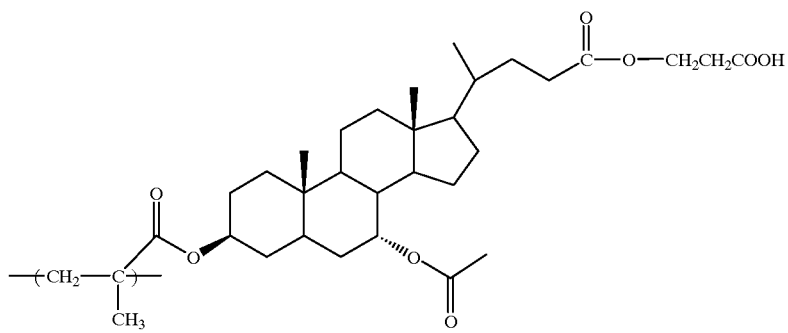
(a94)
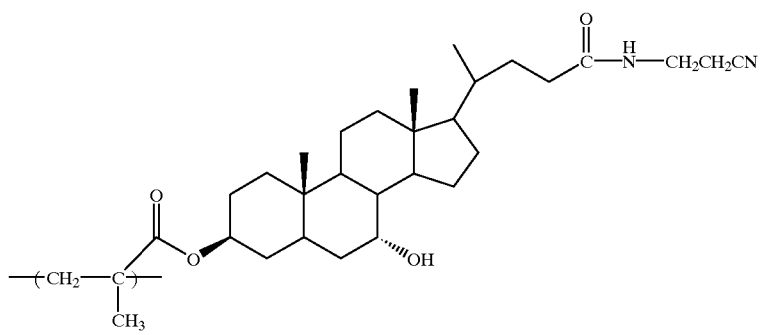
(a95)
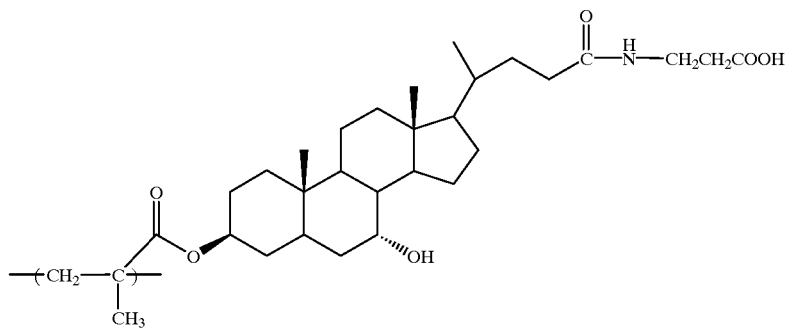
(a96)
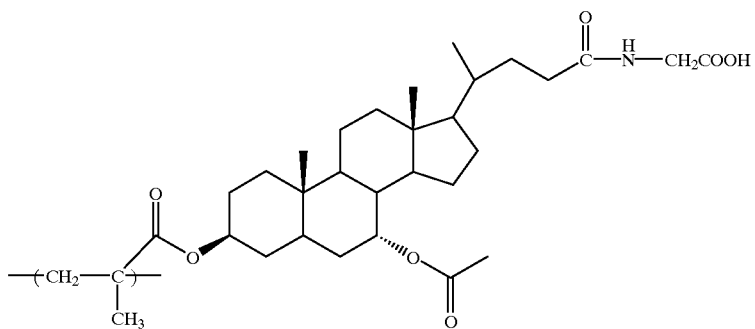
(a97)

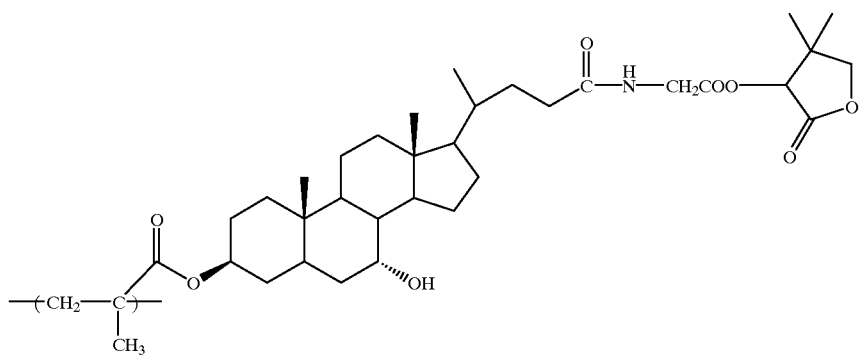
(a98)
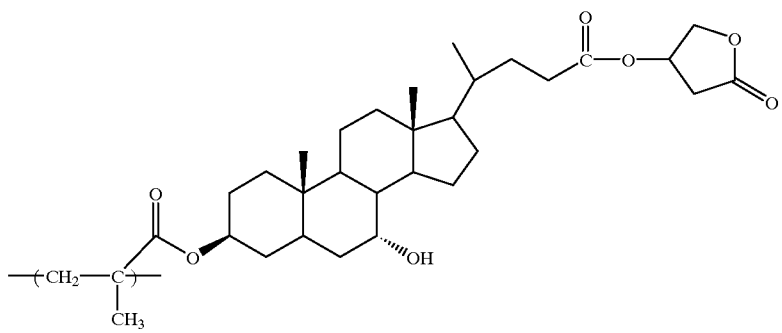
(a99)
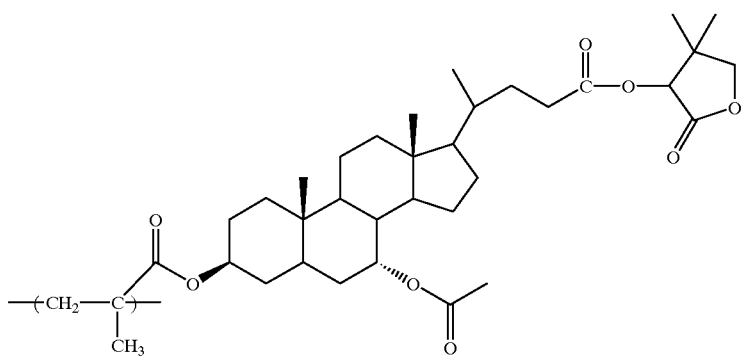
(a100)
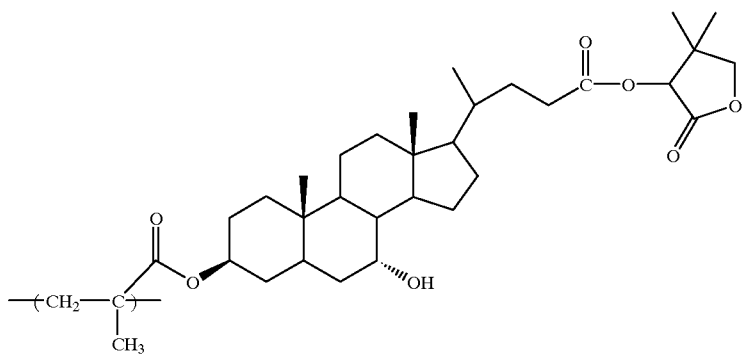
(a101)

-continued
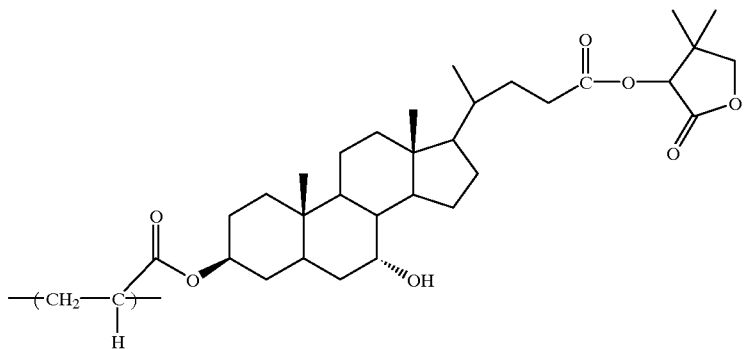
(a102)
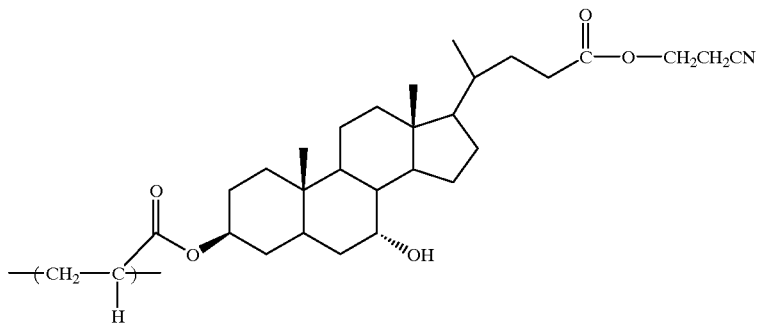
(a103)
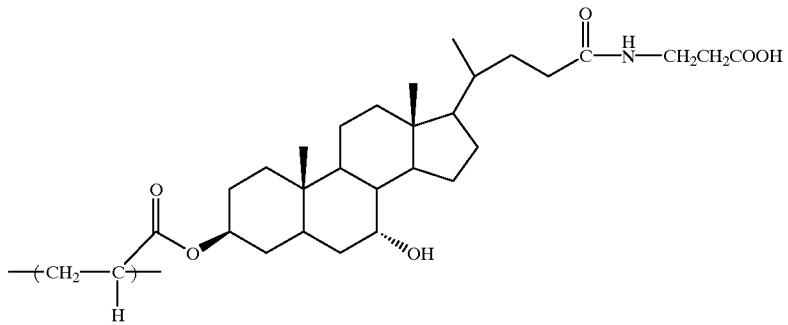
(a104)
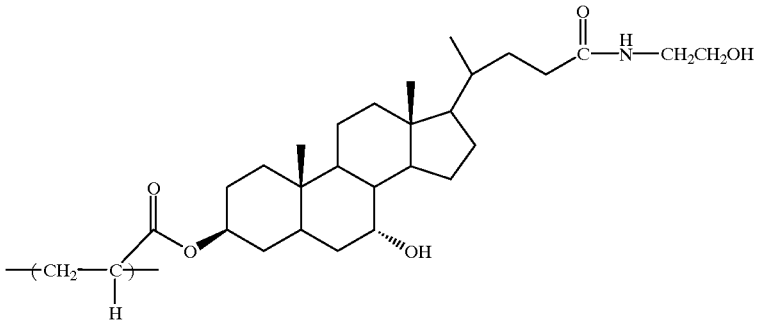
(a105)

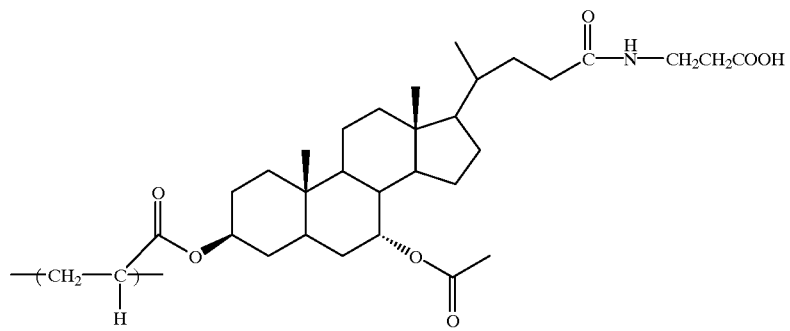
(a106)
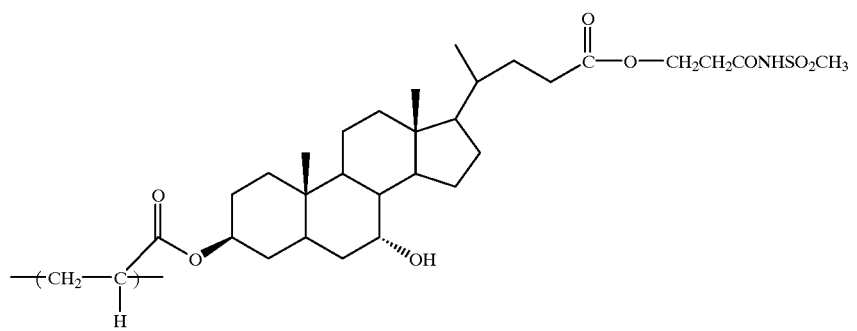
(a107)
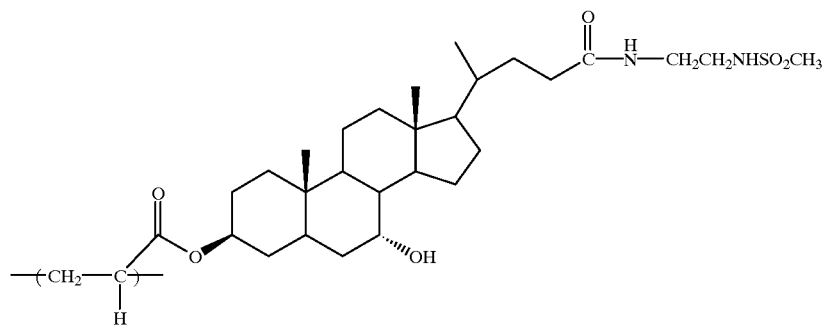
(a108)
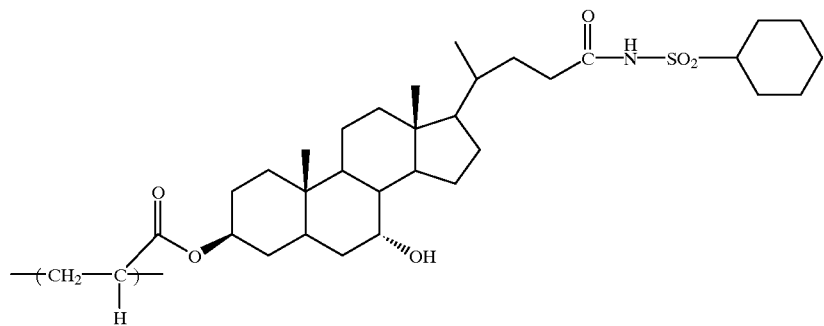
(a109)

(a110)
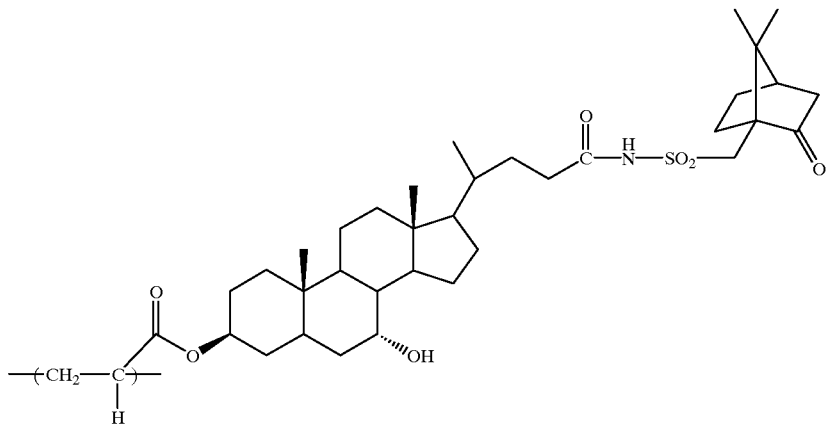
(a111)
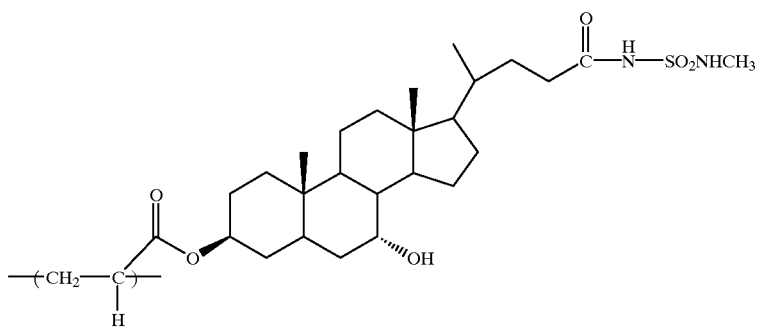
(a112)
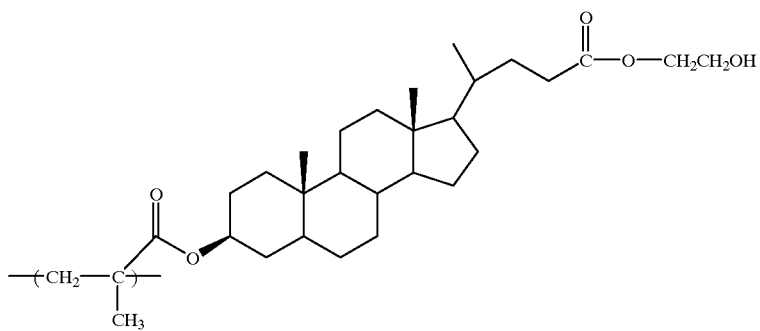
(a113)
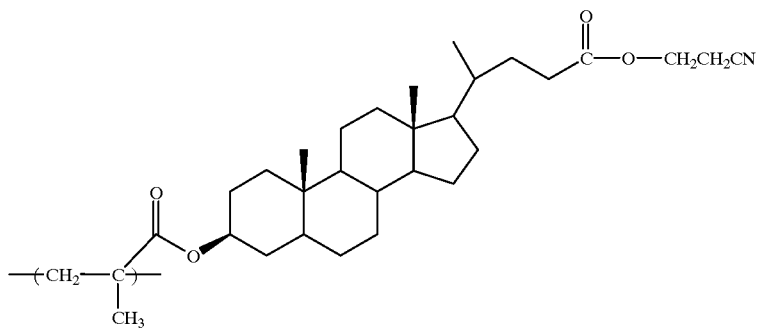

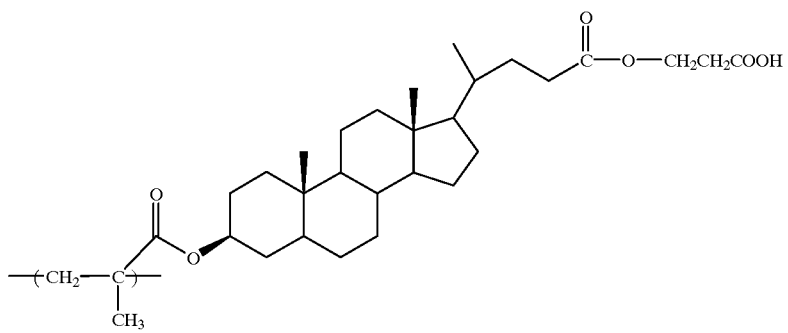
(a114)
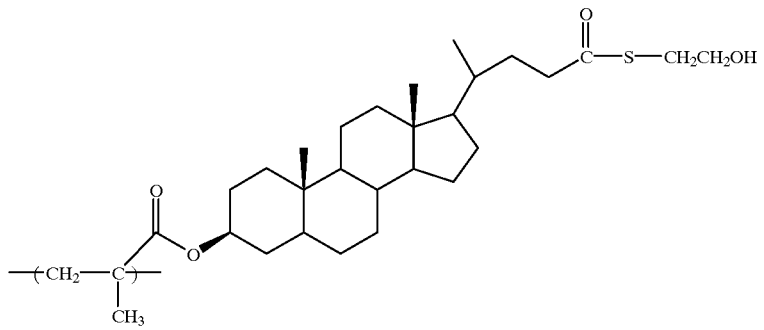
(a115)
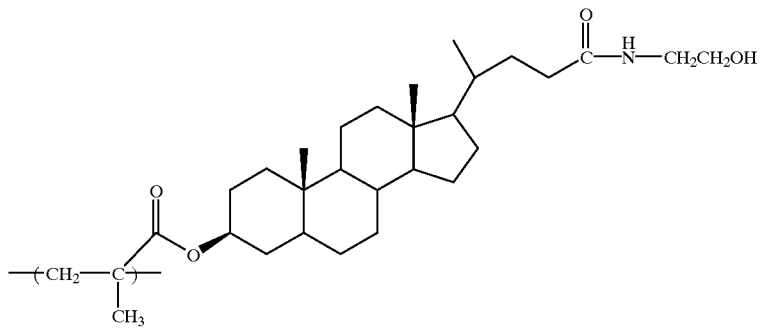
(a116)
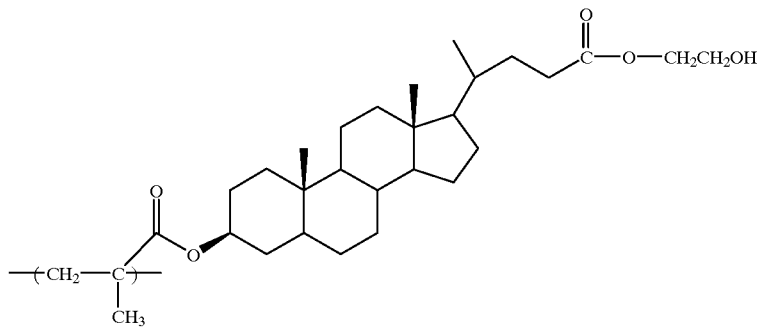
(a117)

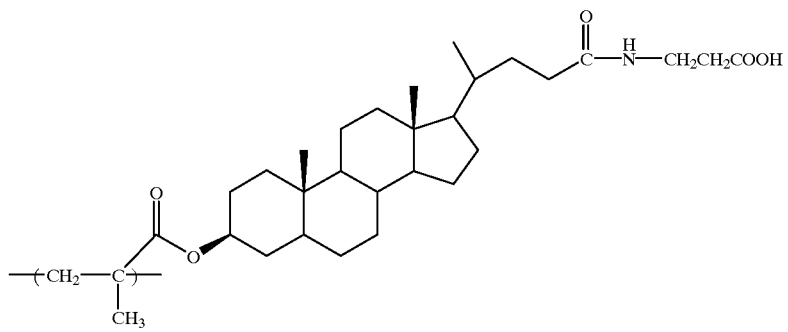
(a118)
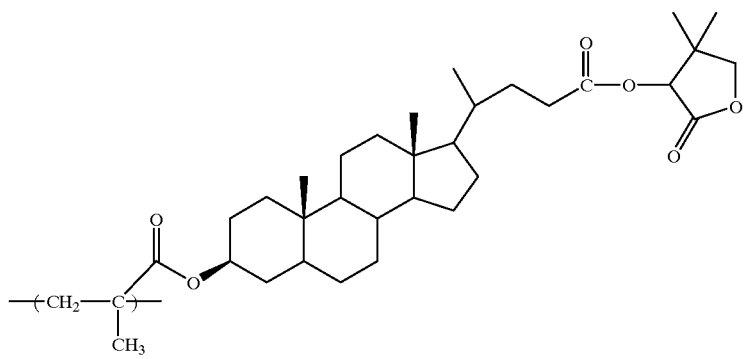
(a119)
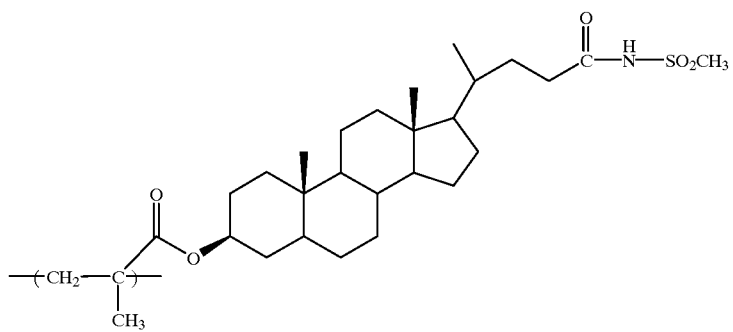
(a120)
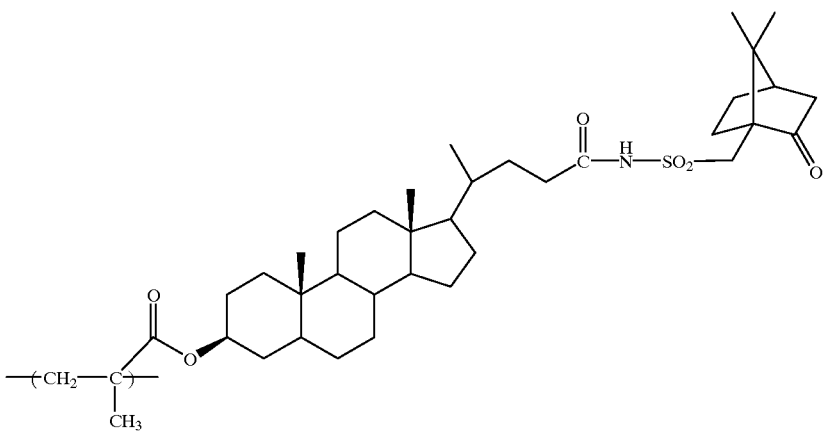
(a121)

-continued
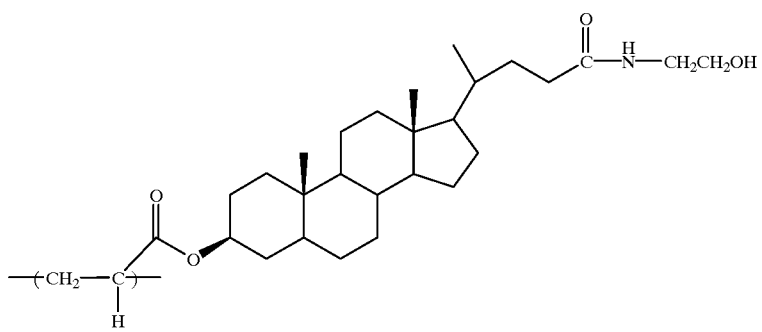
(a122)
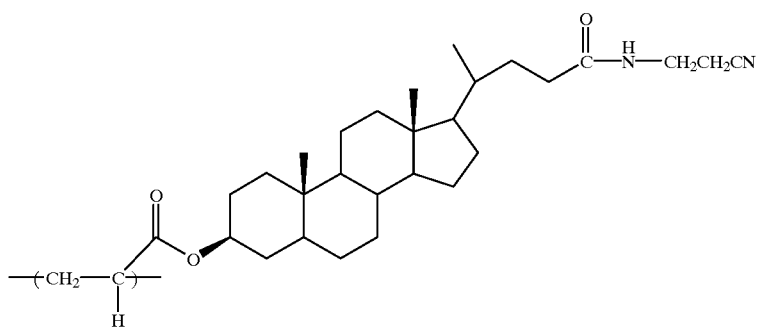
(a123)
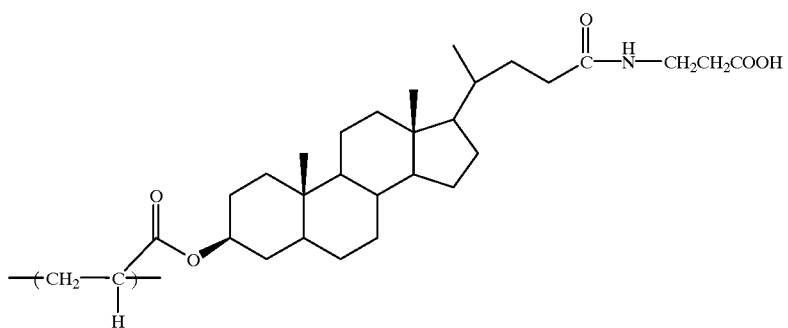
(a124)
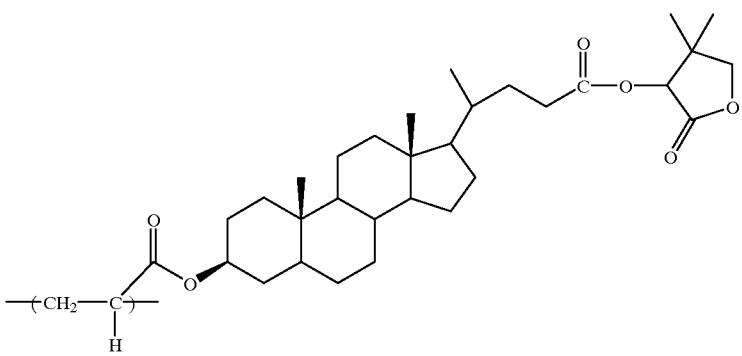
(a125)

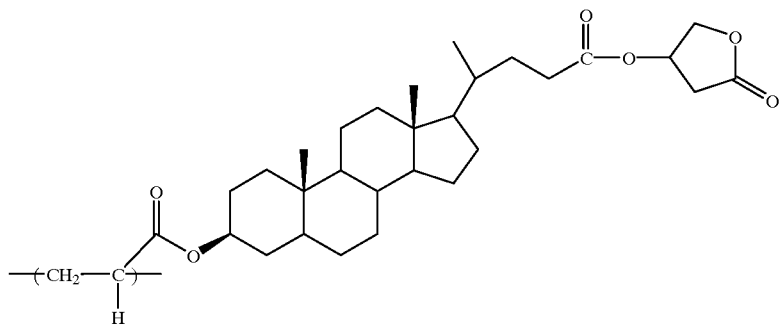
(a126)
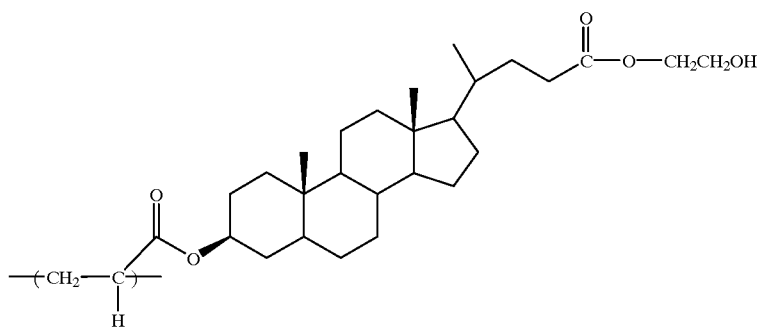
(a127)
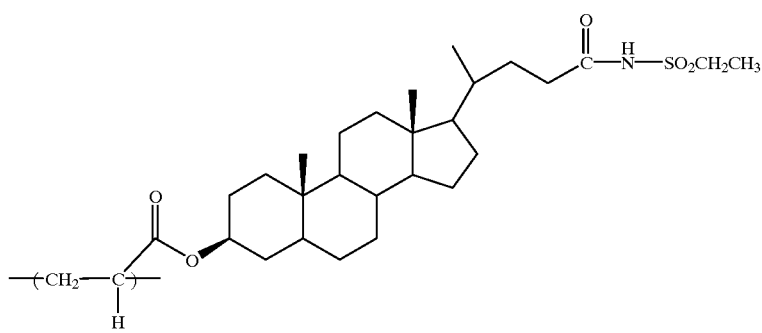
(a128)
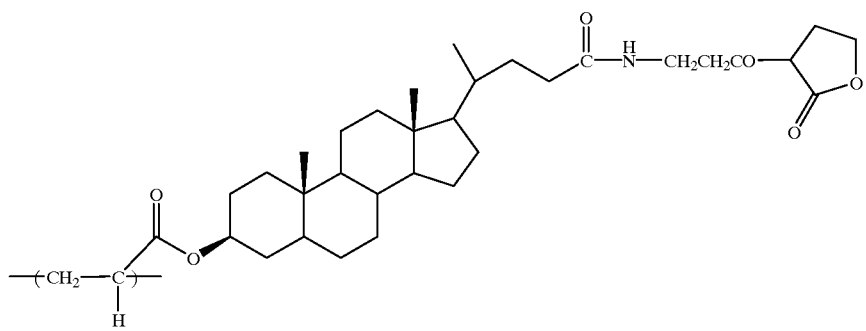
(a129)

-continued
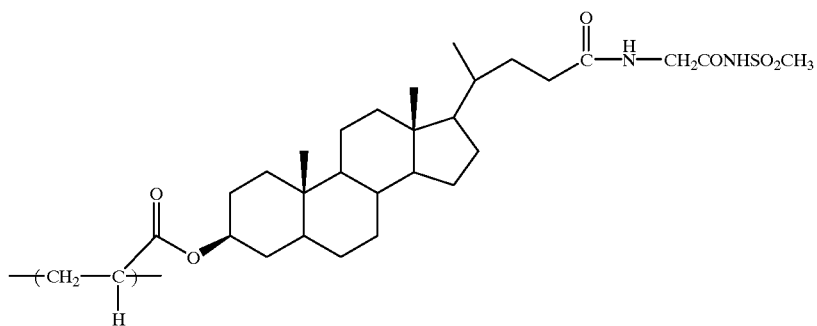
(a130)
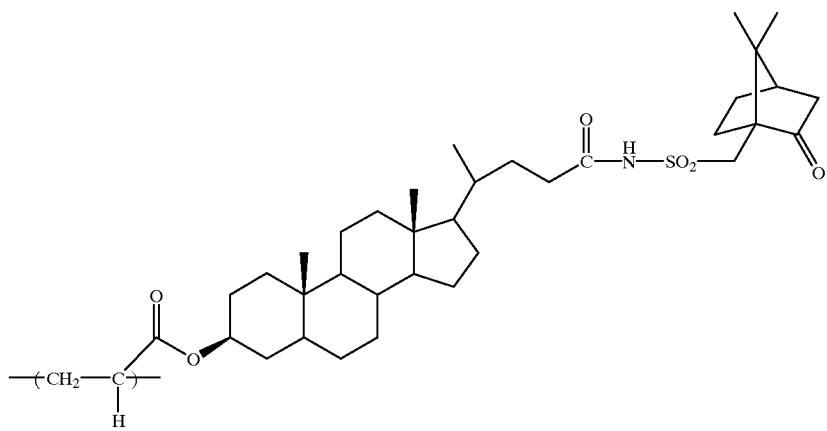
(a131)
Specific examples of the repeating unit represented by formula (aVII) to (aXI) as a repeating unit having the acid-decomposable group are set forth below as (b1) to (b42) and (b-43) to (b-122). However, the present invention should not be construed as being limited thereto.
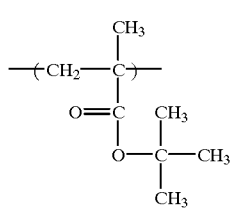 (b1)
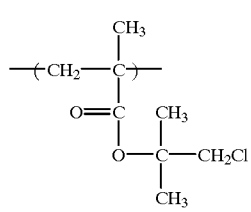 (b2)
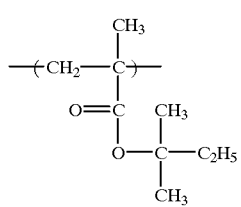 (b3)
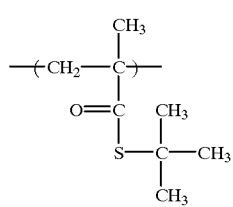 (b4)

-continued
(b5) 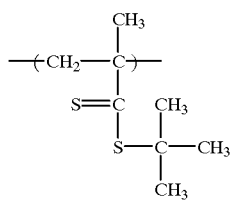
(b6) 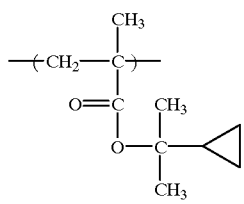
(b7) 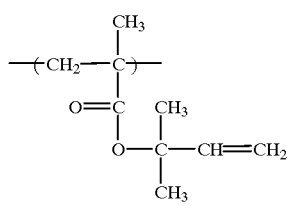
(b8) 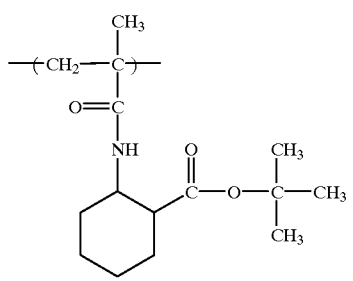
(b9) 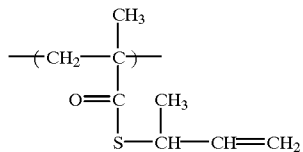
(b10) 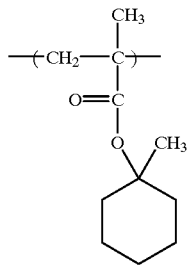
(b11) 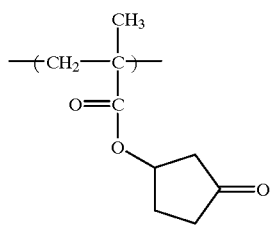
(b12) 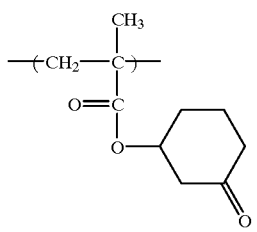
(b13) 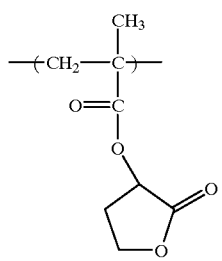
(b14) 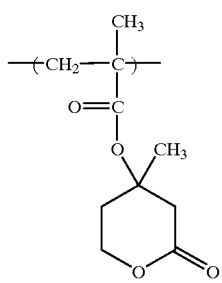
(b15) 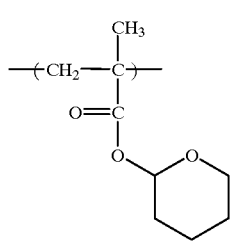
(b16) 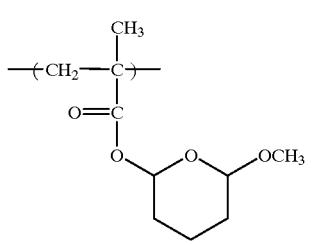

-continued
(b17) 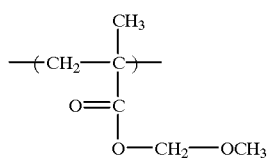
(b18) 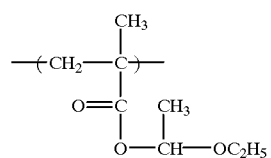
(b19) 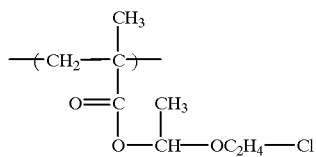
(b20) 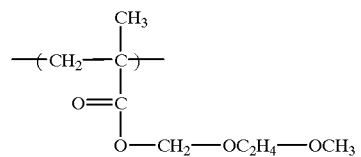
(b21) 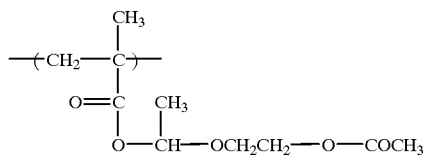
(b22) 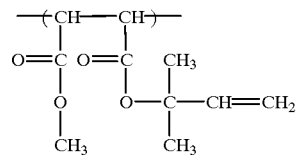
(b23) 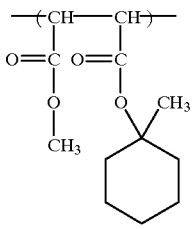
(b24) 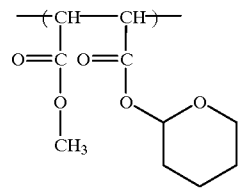
(b25) 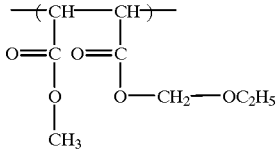
(b26) 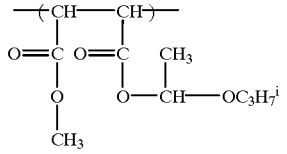
(b27) 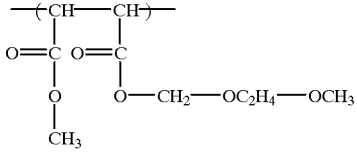
(b28) 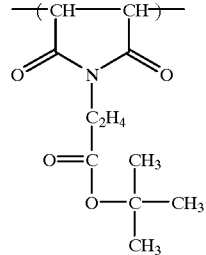
(b29) 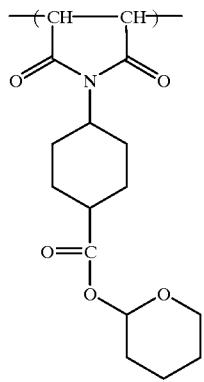
(b30) 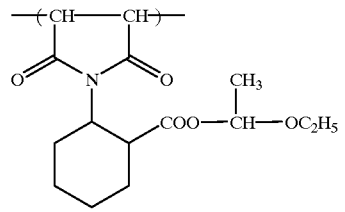

-continued
(b31) 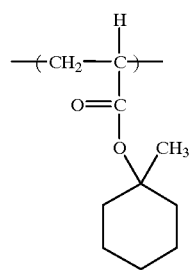
(b32) 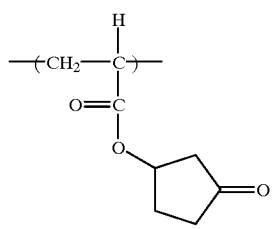
(b33) 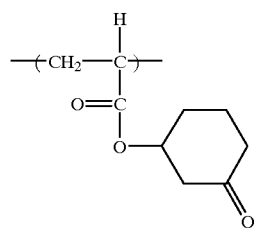
(b34) 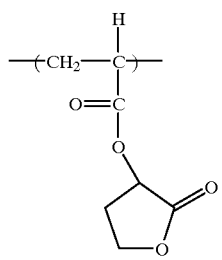
(b35) 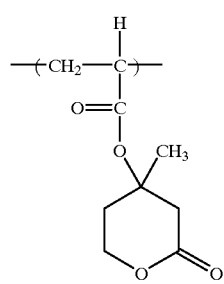
(b36) 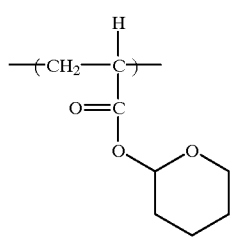
(b37) 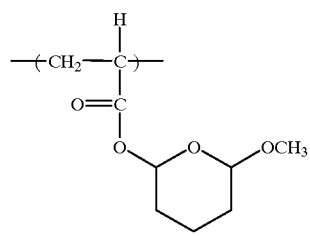
(b38) 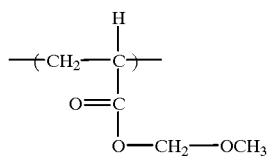
(b39) 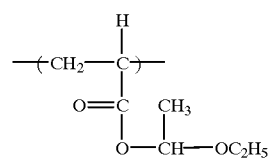
(b40) 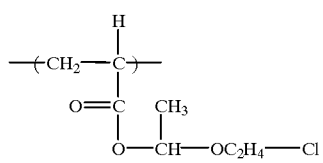
(b41) 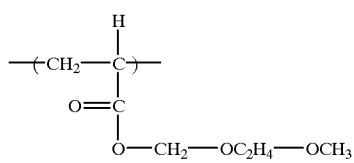
(b42) 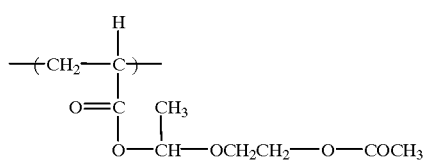

(b-43)
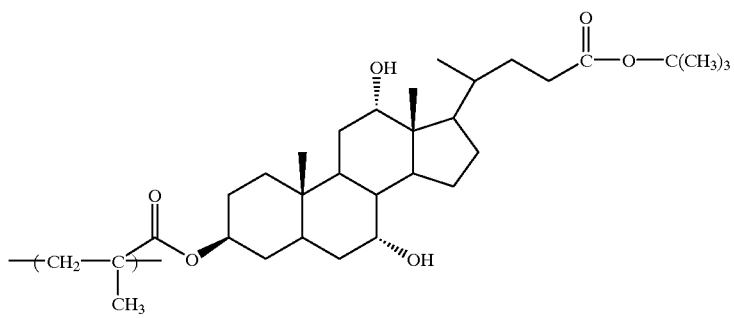
(b-44)
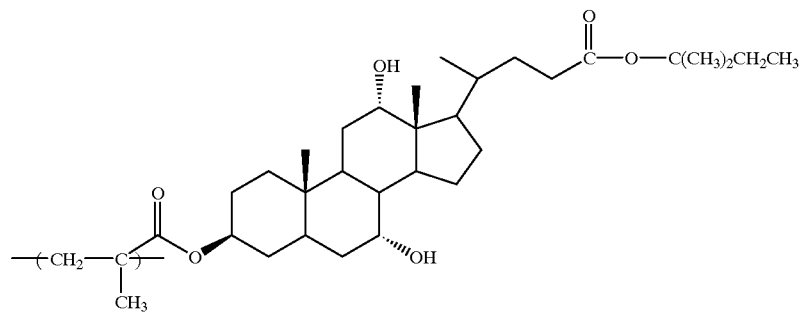
(b-45)
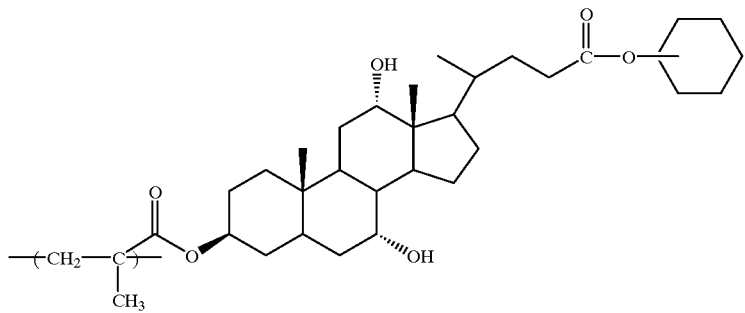
(b-46)
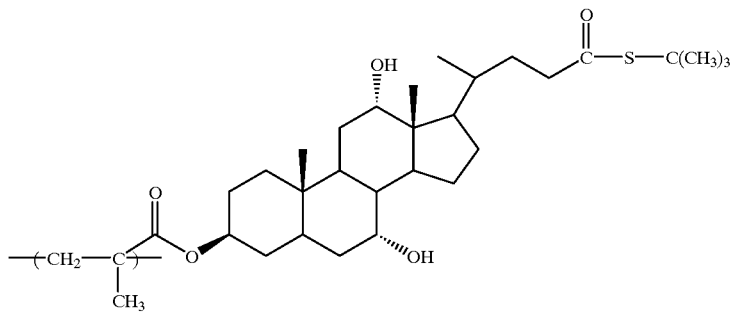
(b-47)
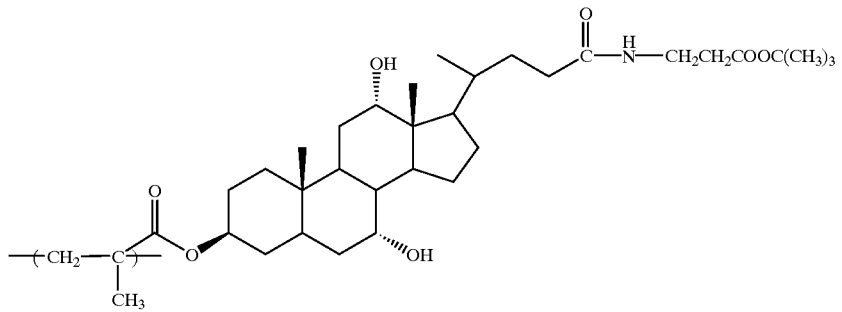

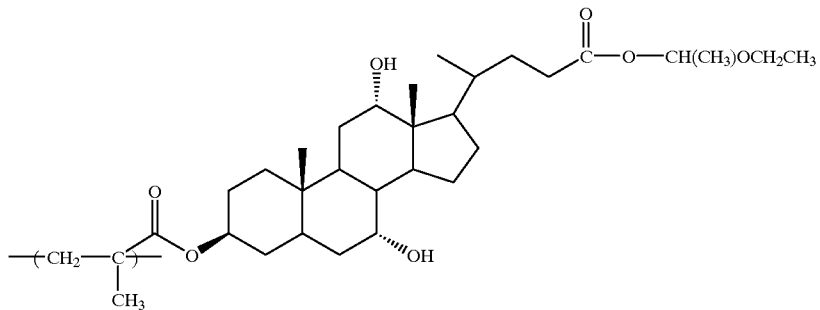
(b-48)
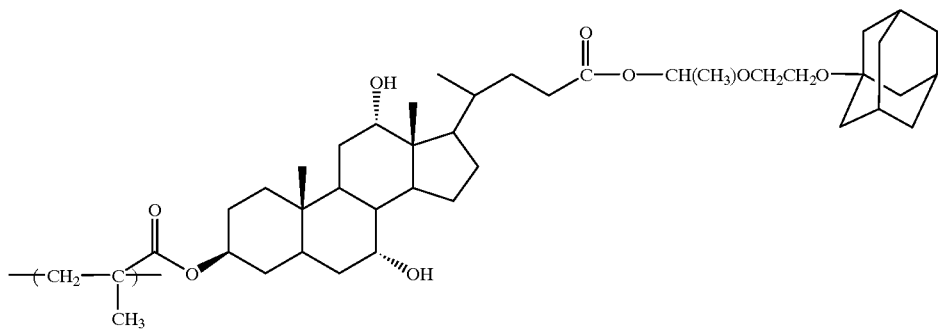
(b-49)
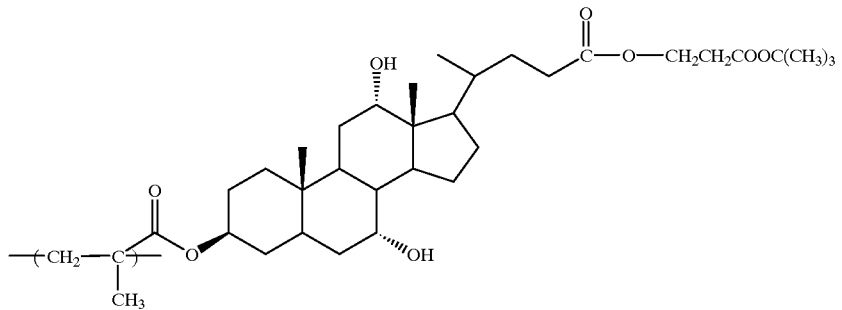
(b-50)
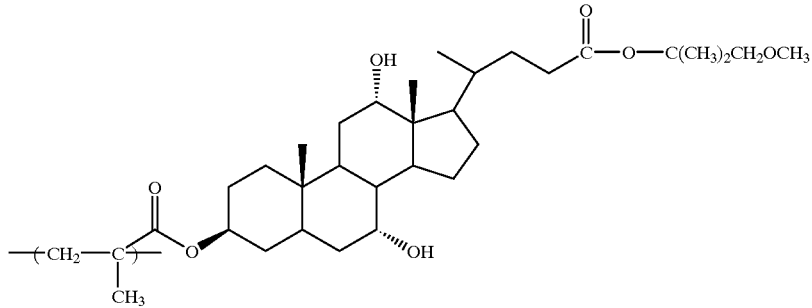
(b-51)

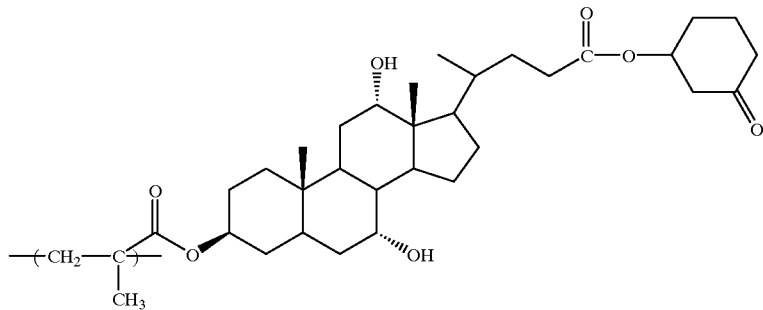
(b-52)
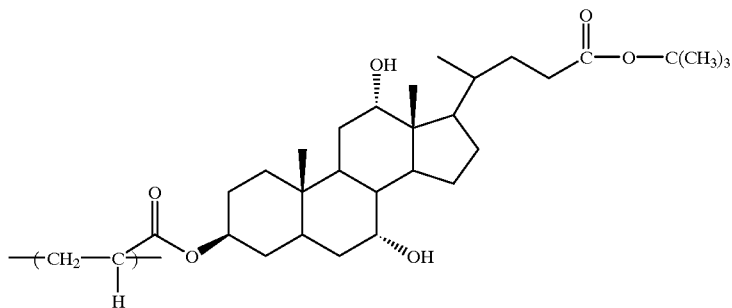
(b-53)
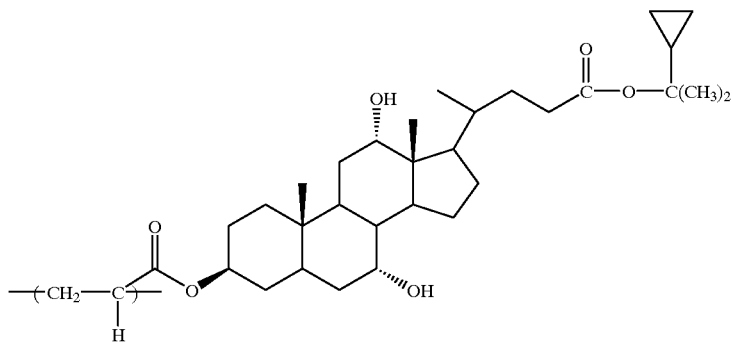
(b-54)
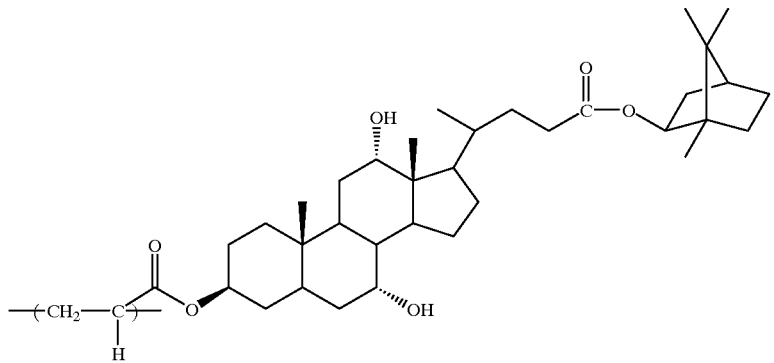
(b-55)

-continued
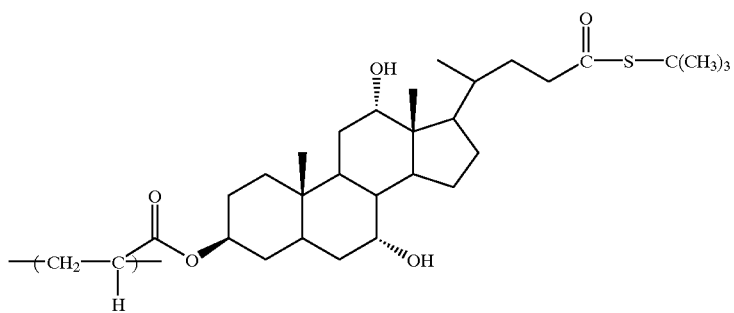
(b-56)
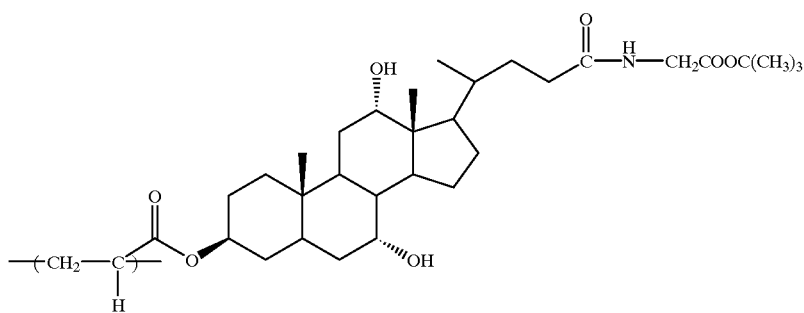
(b-57)
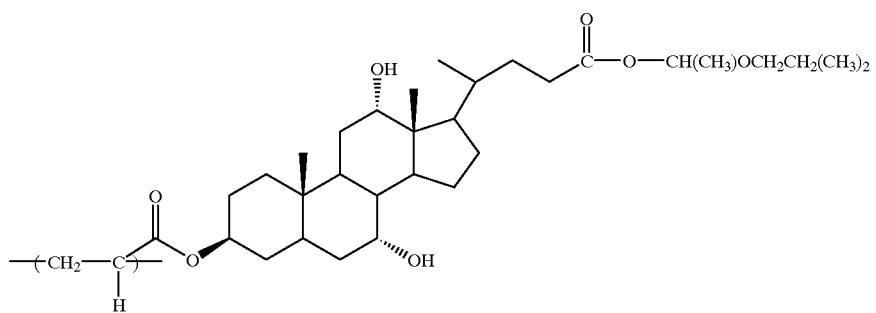
(b-58)
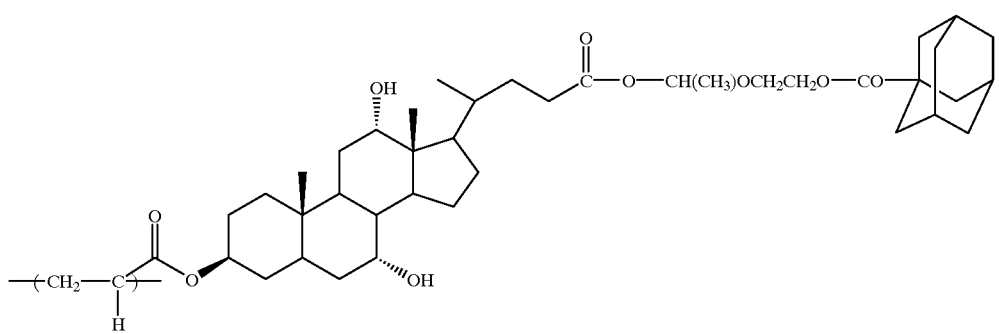
(b-59)
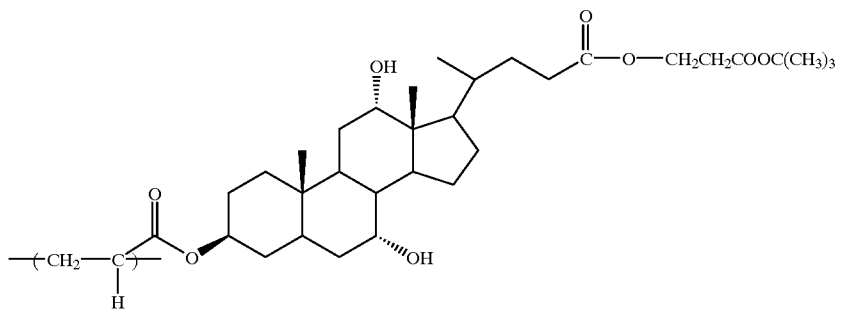
(b-60)

-continued
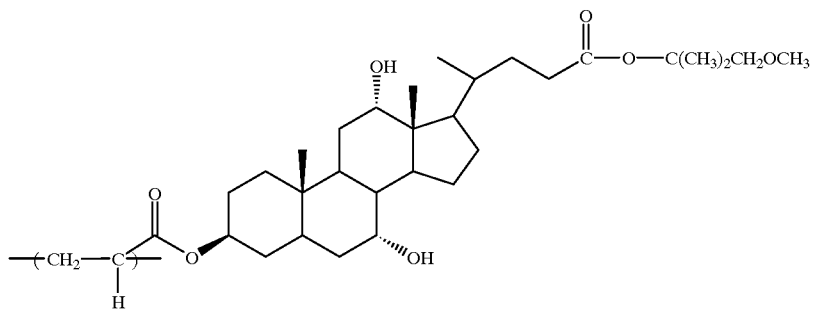
(b-61)
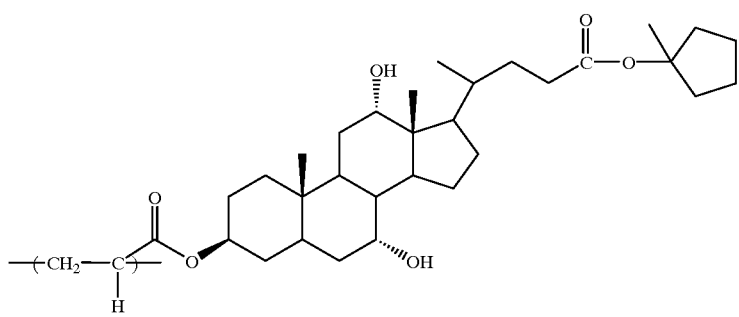
(b-62)
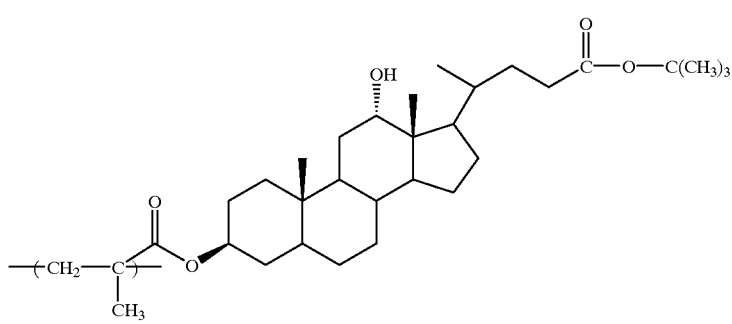
(b-63)
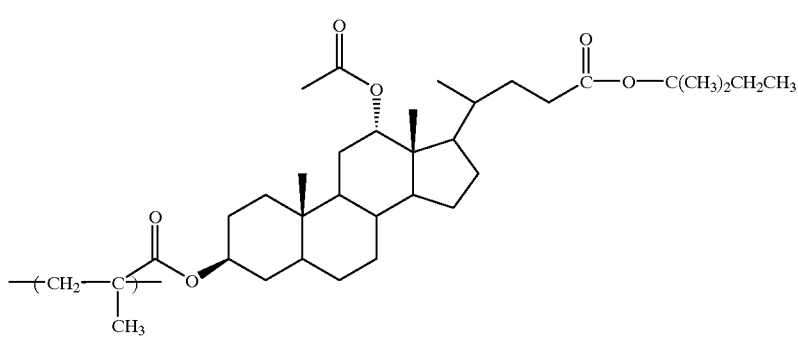
(b-64)
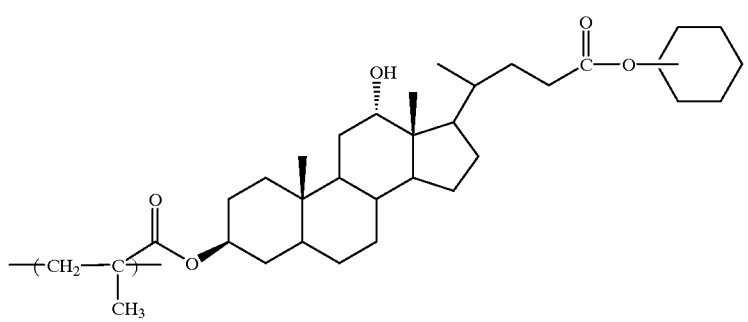
(b-65)

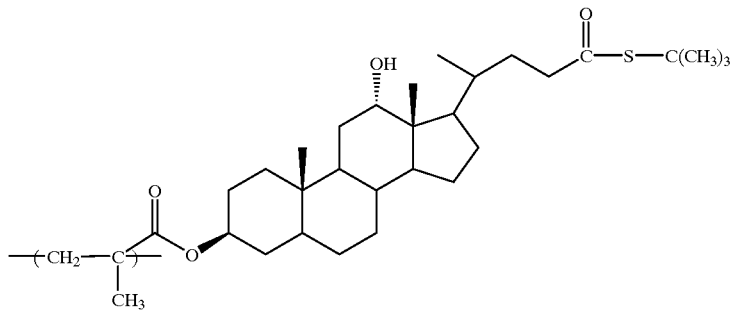
(b-66)
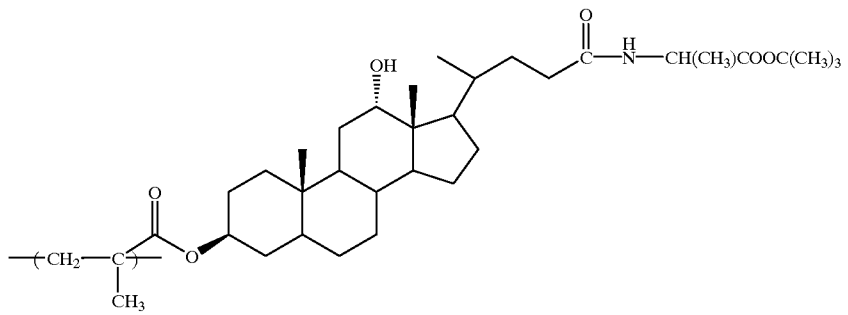
(b-67)
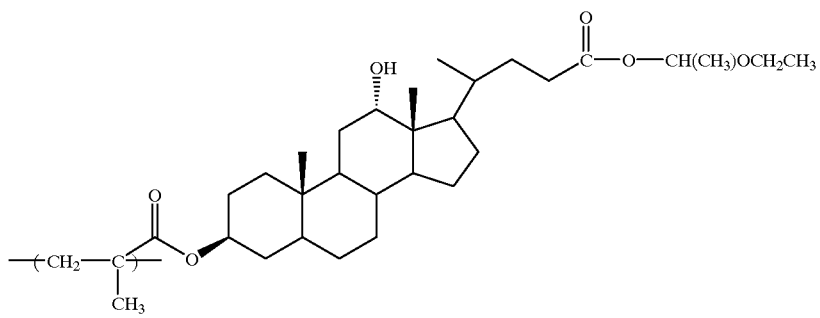
(b-68)
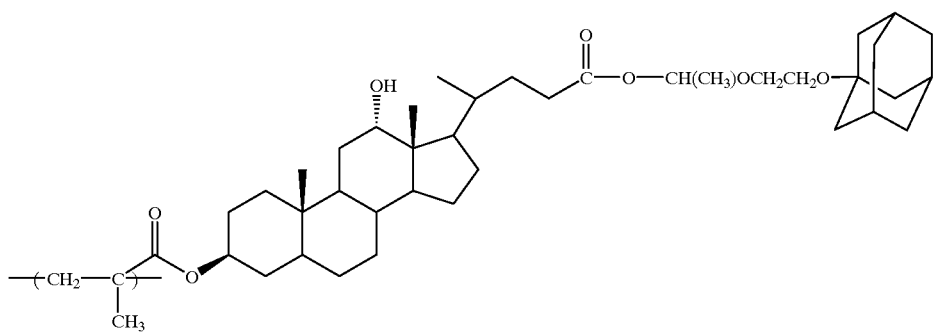
(b-69)

(b-70)
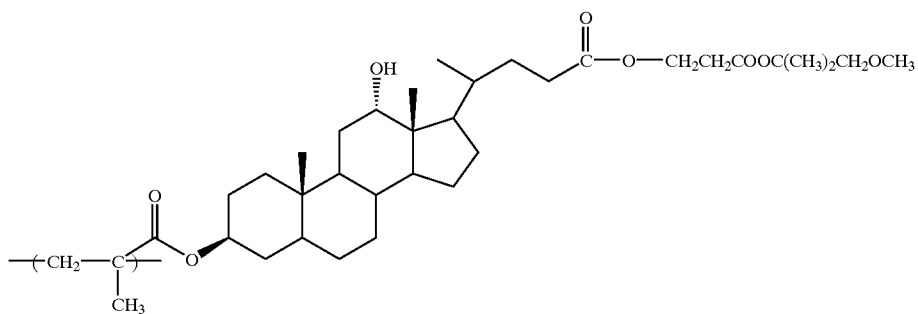
(b-71)
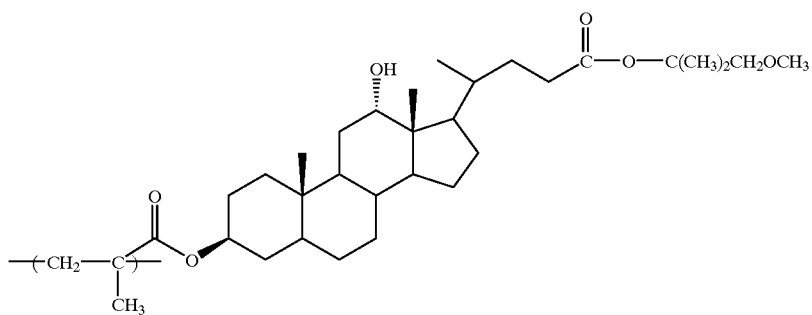
(b-72)
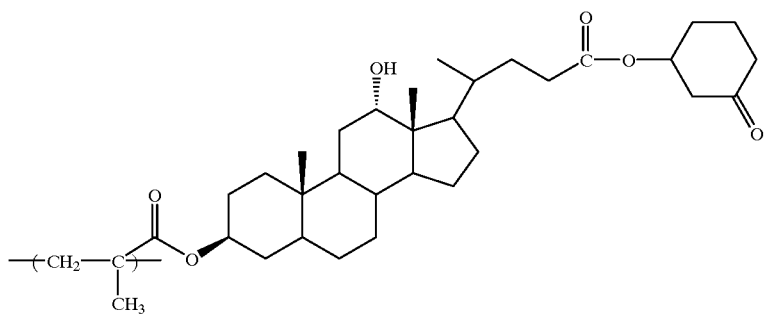
(b-73)
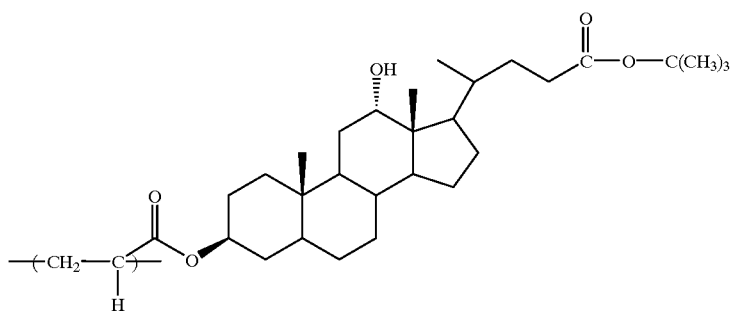

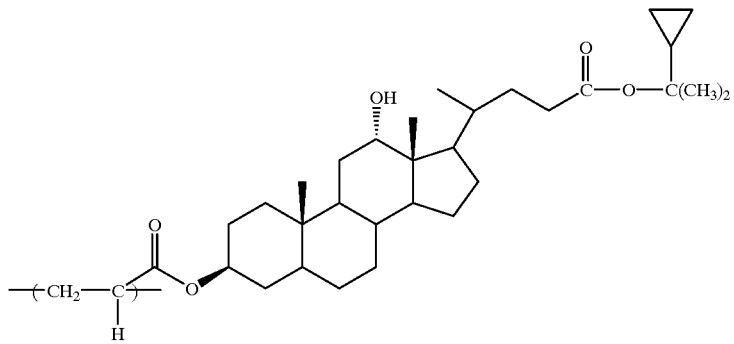
(b-74)
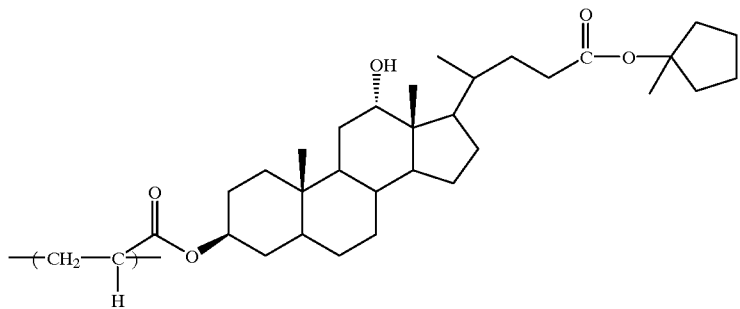
(b-75)
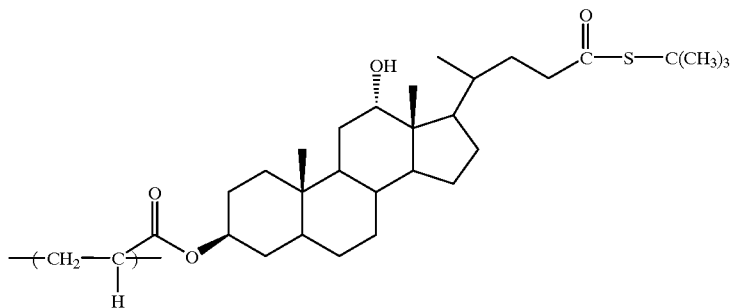
(b-76)
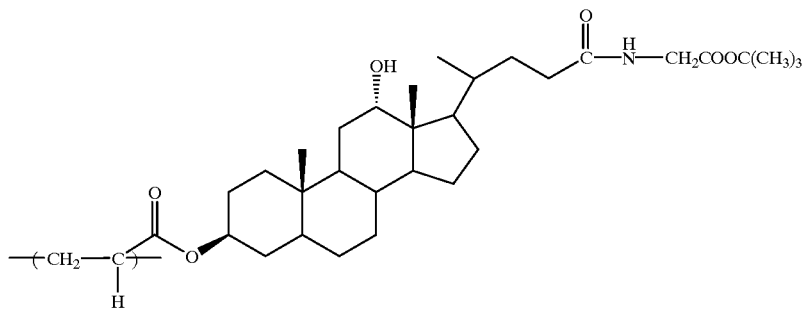
(b-77)

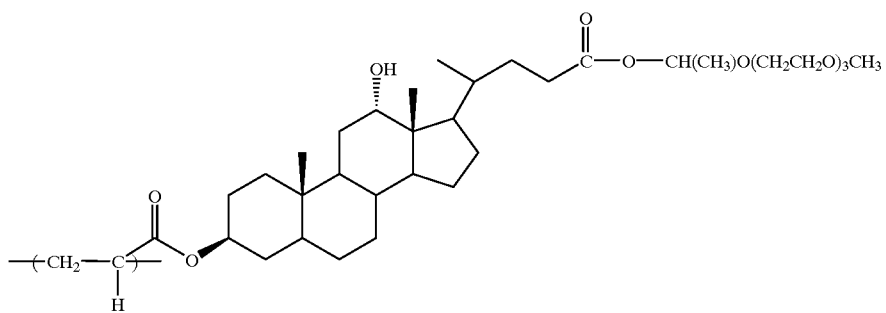
(b-78)
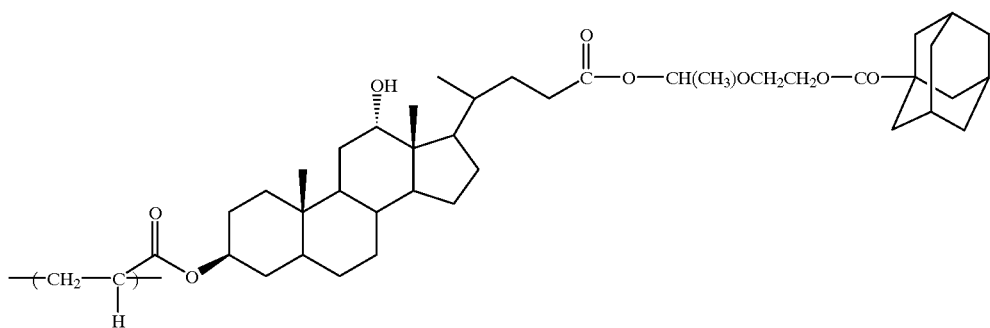
(b-79)
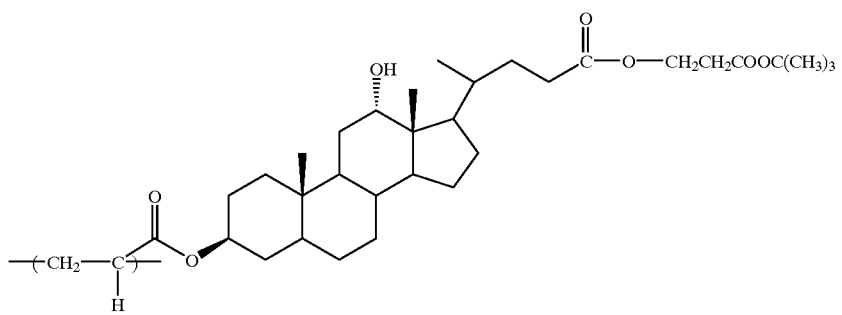
(b-80)
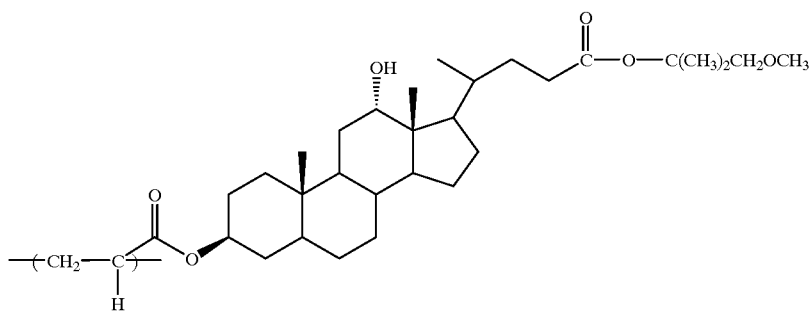
(b-81)
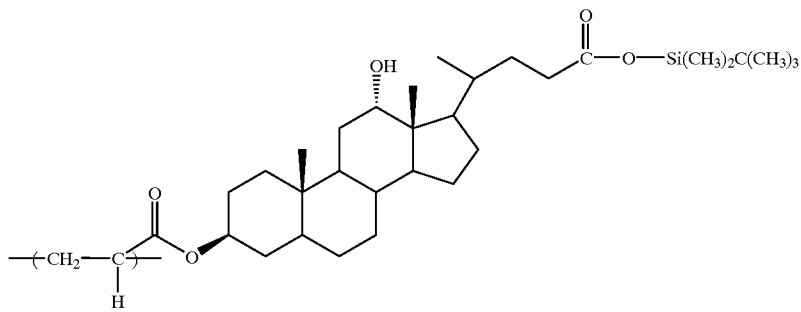
(b-82)

-continued
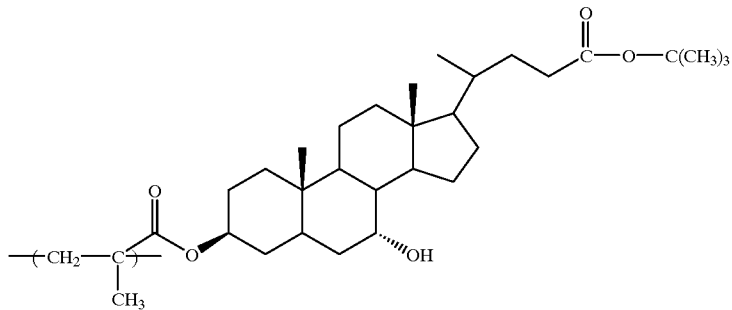
(b-83)
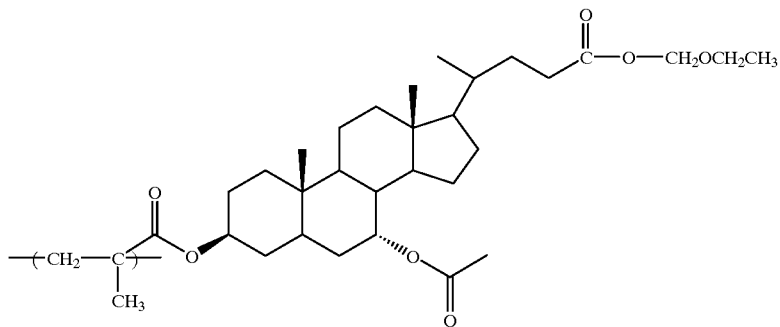
(b-84)
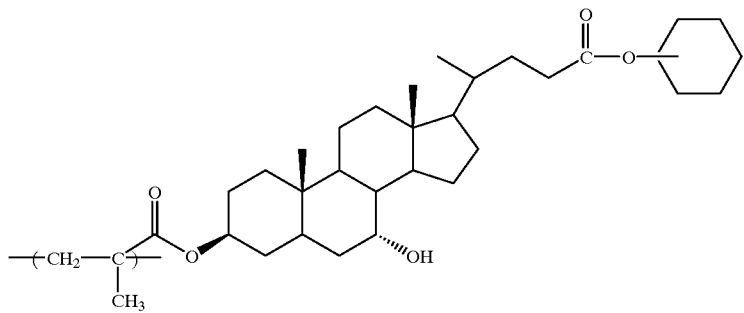
(b-85)
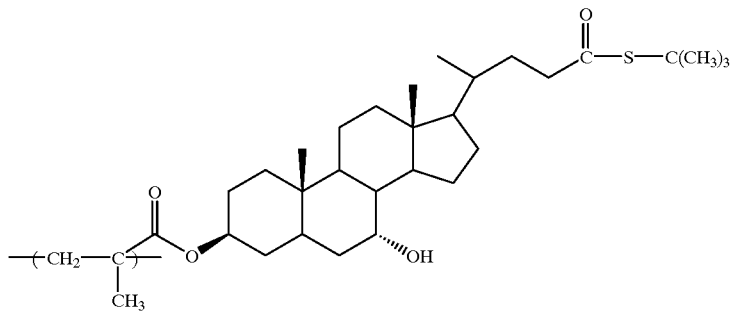
(b-86)

-continued
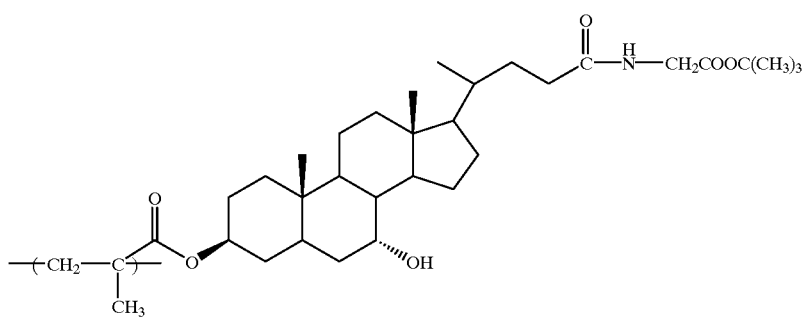
(b-87)
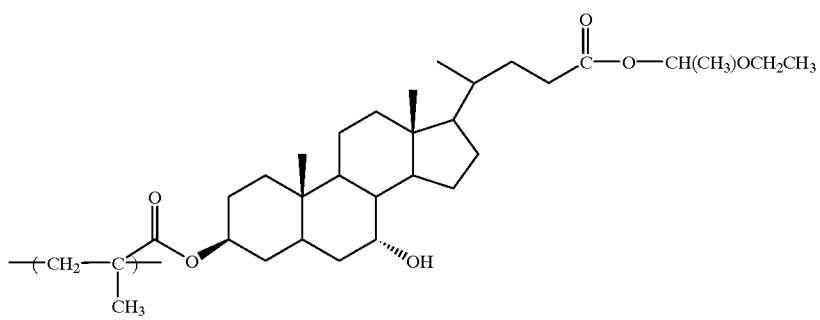
(b-88)
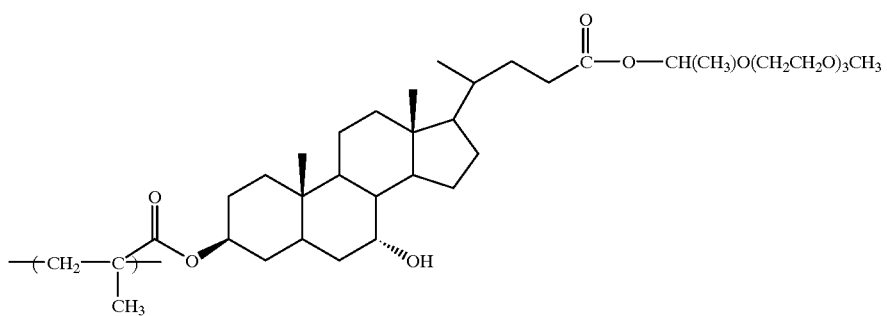
(b-89)
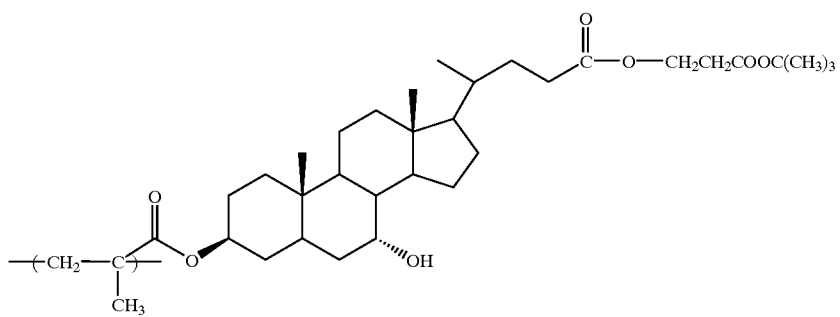
(b-90)
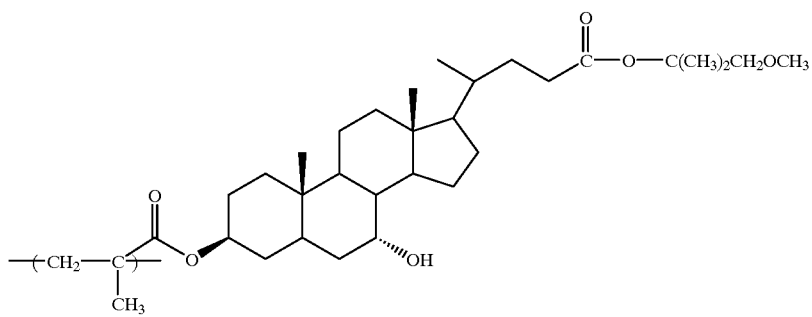
(b-91)

-continued
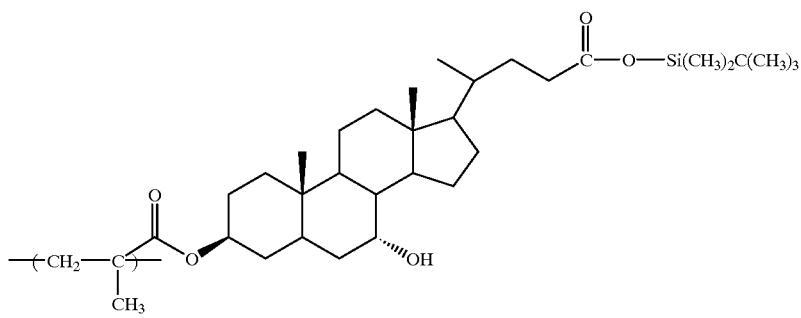
(b-92)
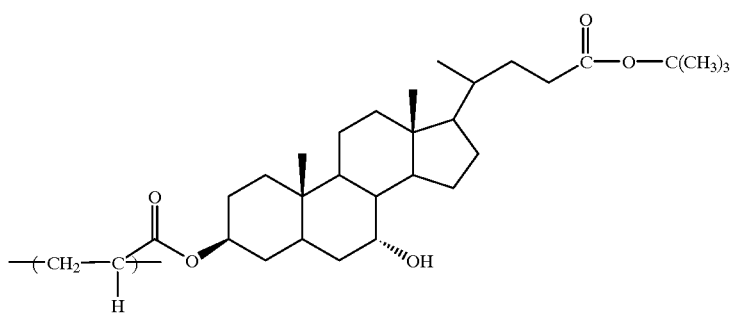
(b-93)
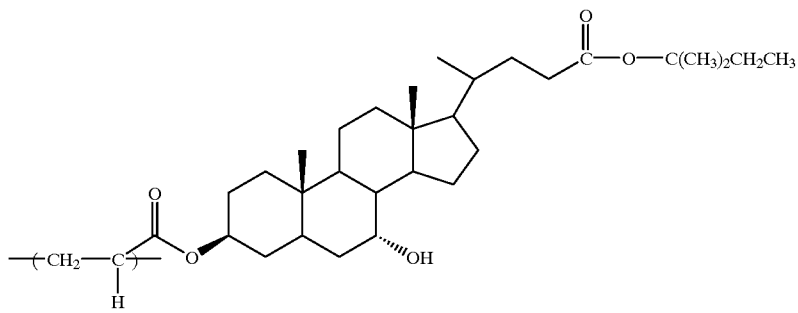
(b-94)
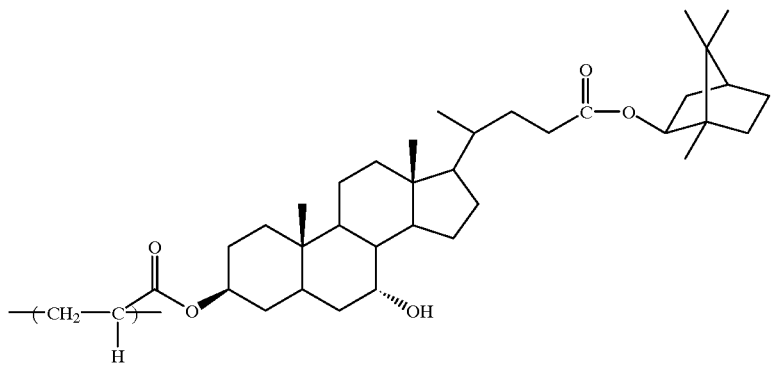
(b-95)

(b-96)
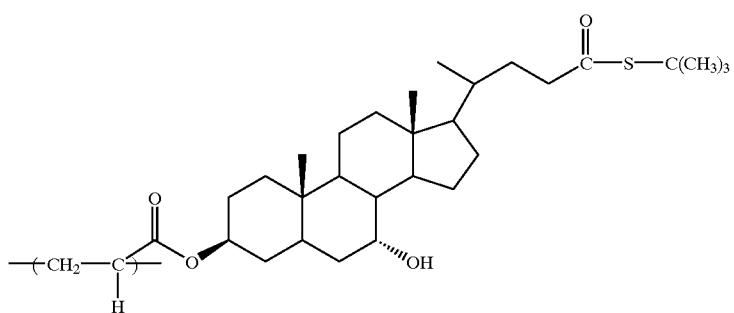
(b-97)
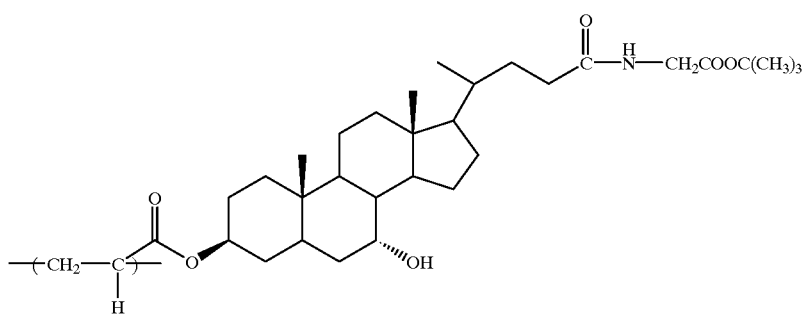
(b-98)
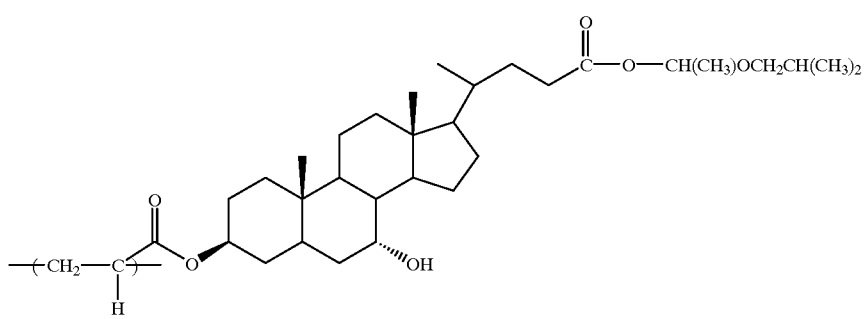
(b-99)
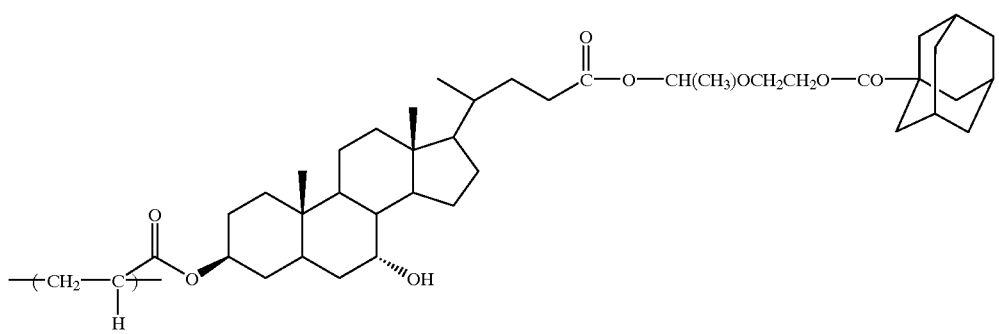
(b-100)
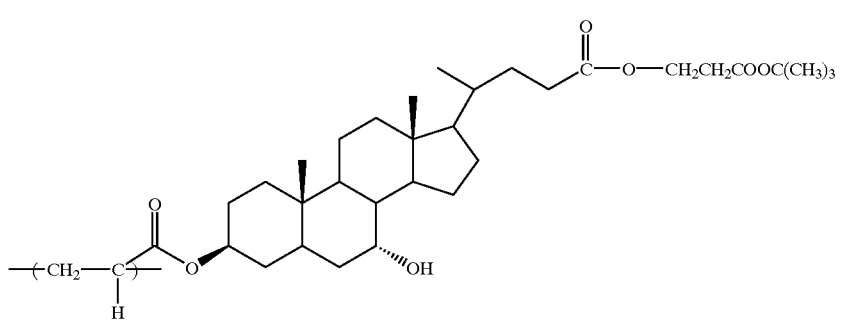

(b-101)
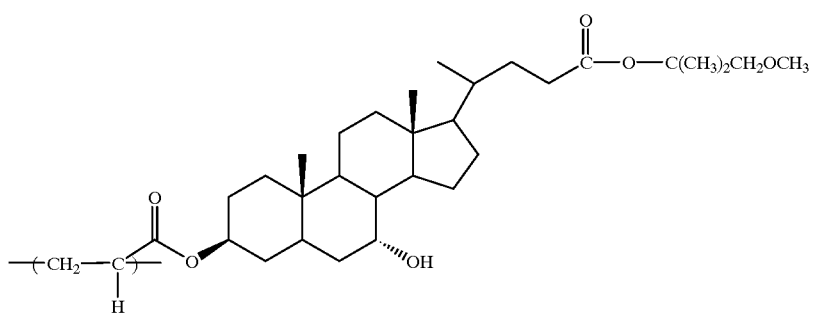
(b-102)
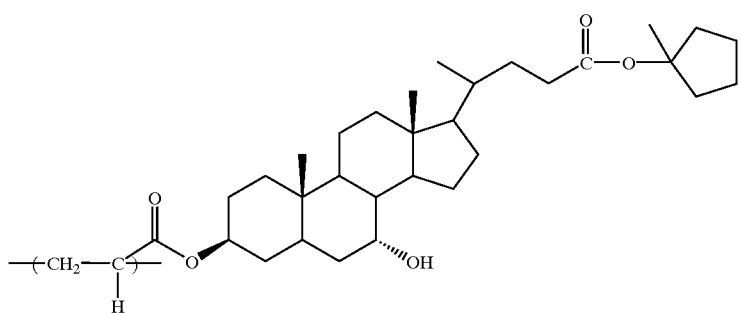
(b-103)
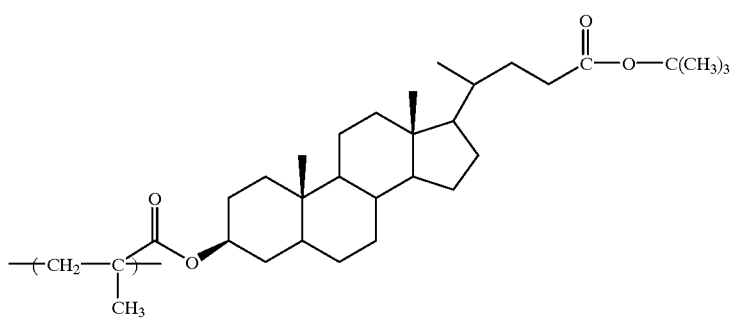
(b-104)
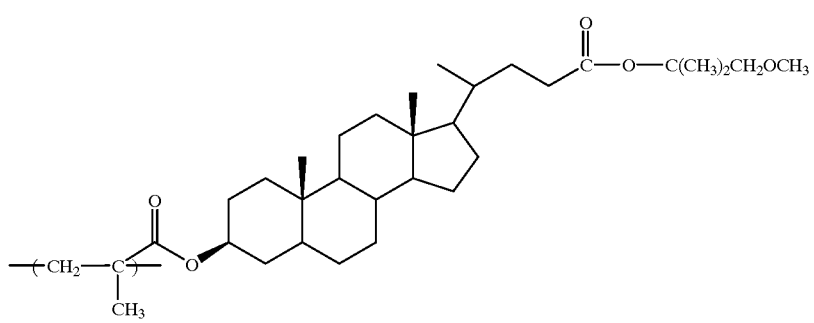
(b-105)
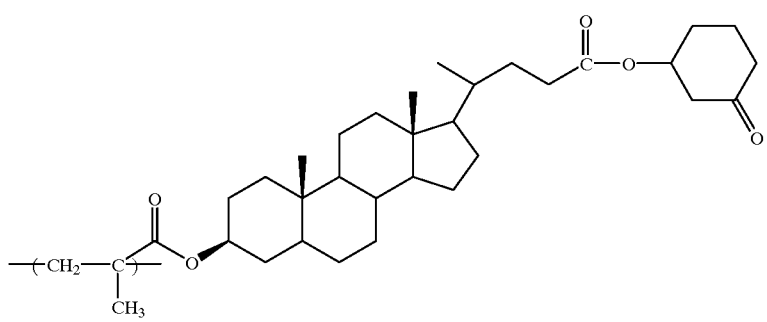

(b-106)
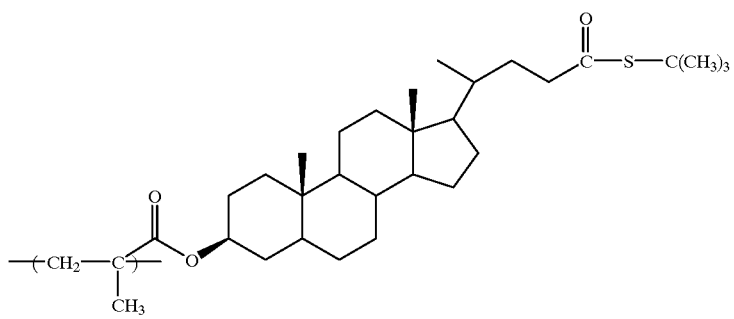
(b-107)
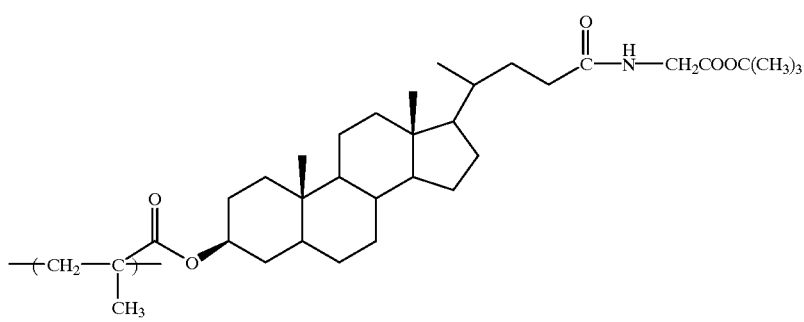
(b-108)
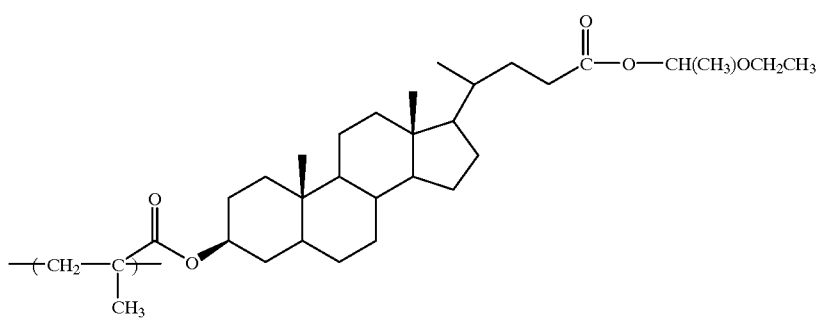
(b-109)
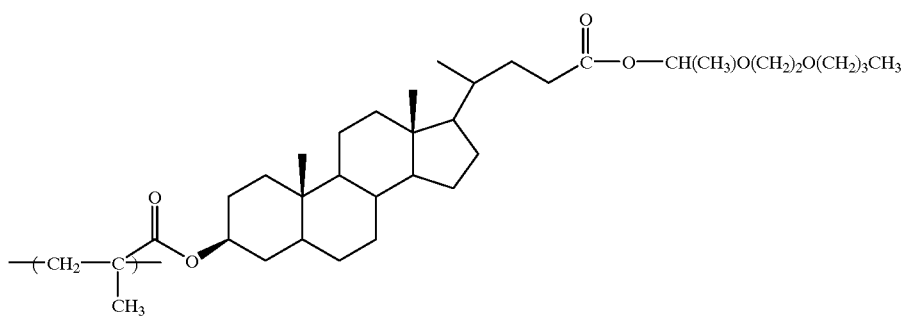
(b-110)
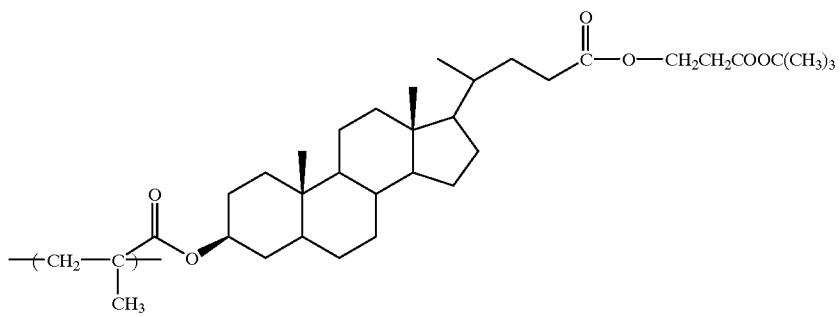

-continued
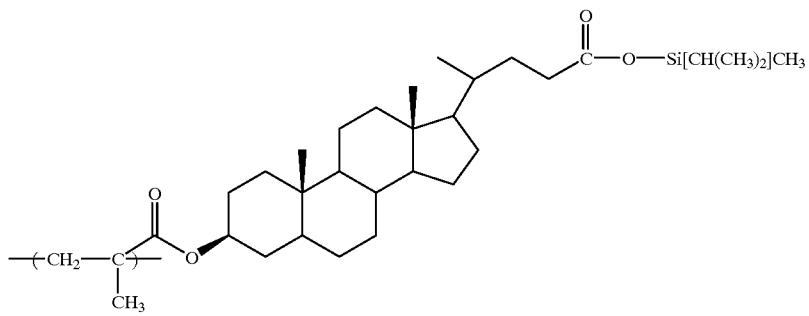
(b-111)
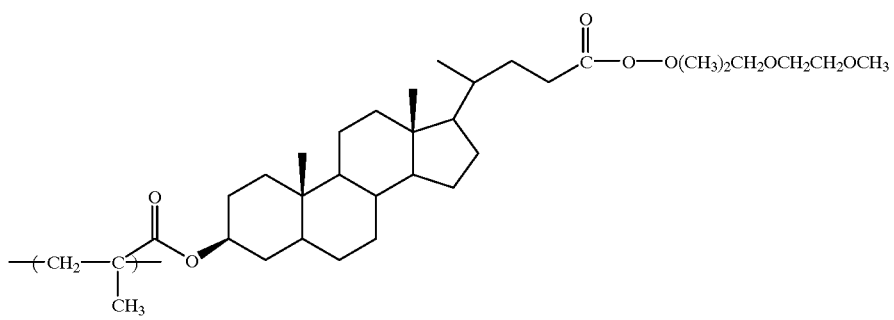
(b-112)
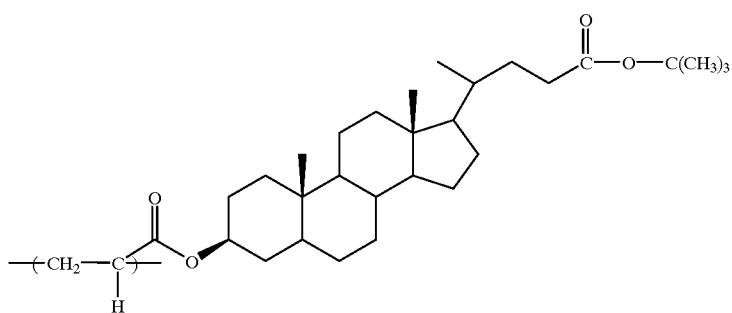
(b-113)
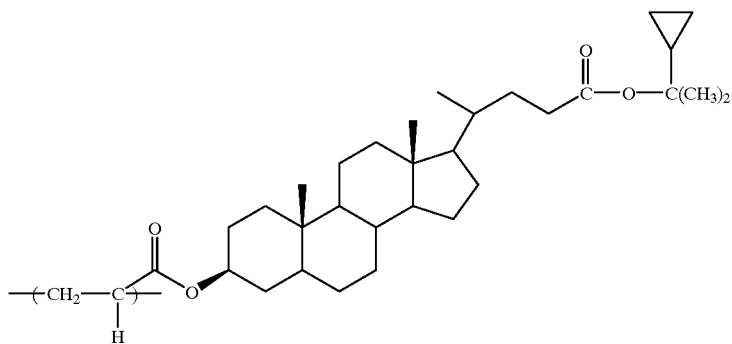
(b-114)

(b-115)
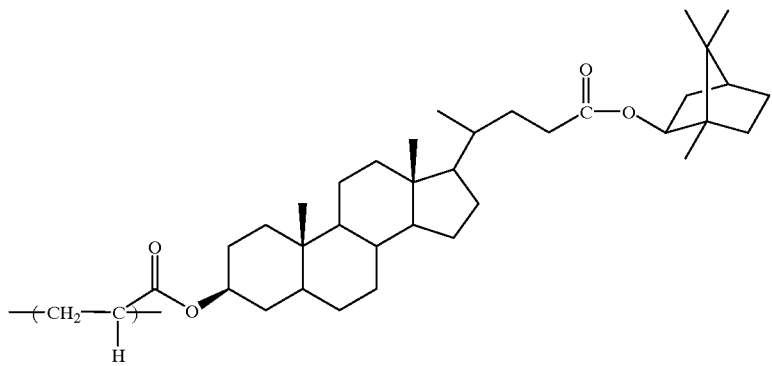
(b-116)
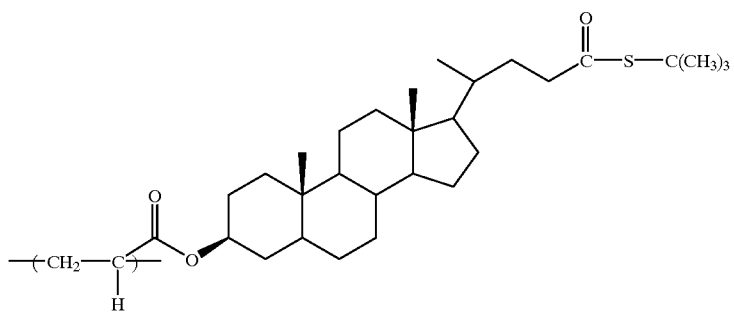
(b-117)
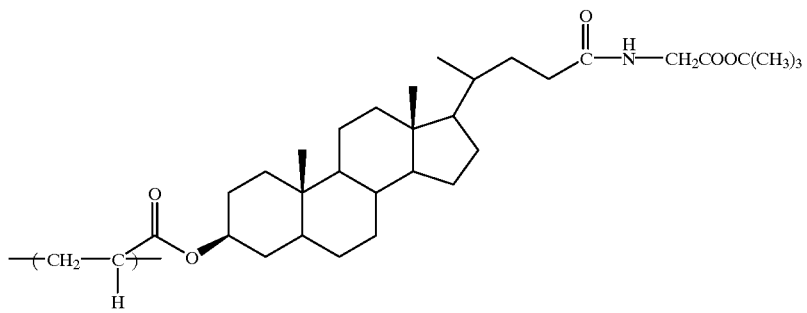
(b-118)
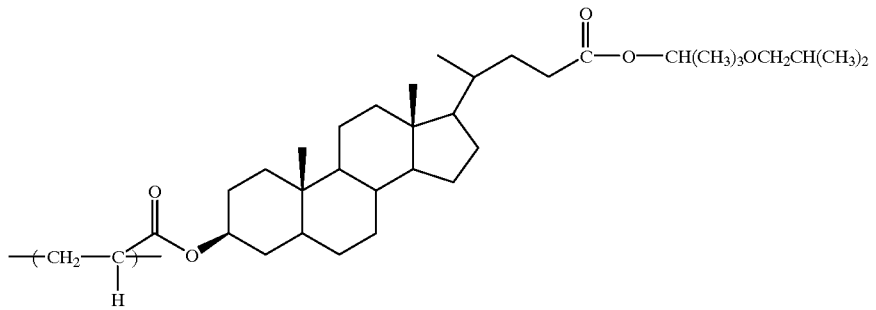

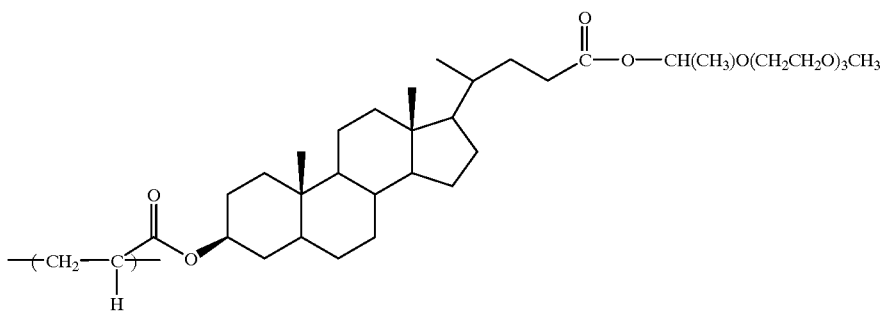
(b-119)

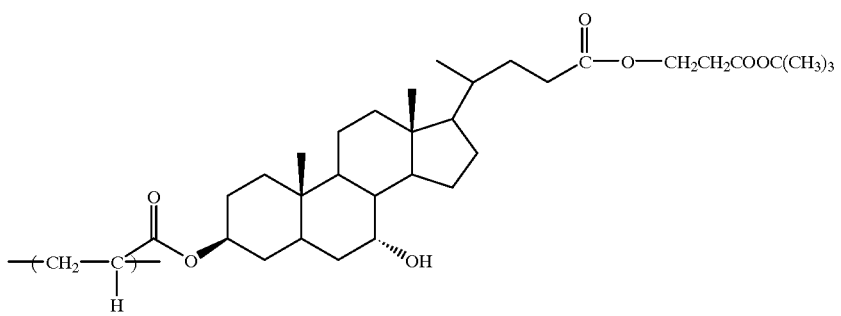
(b-120)

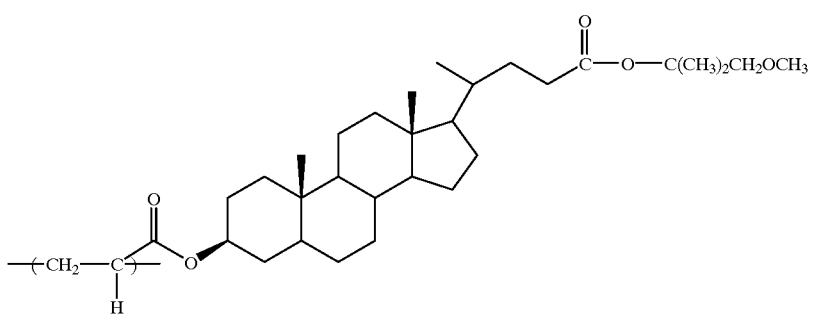
(b-121)

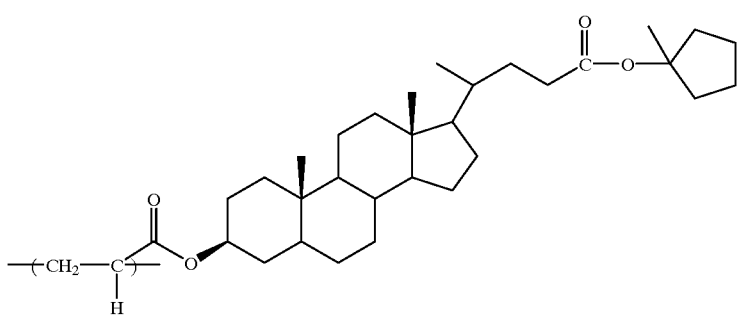
(b-122)

In the acid-decomposable resin (a) according to the present invention, a carboxy group may be contained in the repeating unit having the group represented by formula (aI), (aII) or (aIII), or may be contained in a repeating unit having an acid-decomposable group, or may be contained in a repeating unit other than those repeating units. Carboxy groups may be contained in two or more kinds of such units.

A preferred repeating unit having the carboxy group is a repeating unit represented by formulae (aX) to (aXII).

The content of the repeating unit having a carboxy group in the resin according to the present invention (preferably a repeating unit represented by at least one of formulae (aX) to (aXII)) is regulated while taking account of characteristics such as the developing property with alkali, adhesion to a substrate, and sensitivity and the like. However, the content thereof is preferably from 0 to 60% by mole, more preferably from 0 to 40% by mole, yet more preferably from 0 to 20% by mole, based on the total repeating units. The content of carboxy group-containing repeating unit means an amount of all carboxy group-containing repeating units in the resin, including the repeating unit containing the group represented by formula (aI), (aII) or (aIII) and a carboxy group and the repeating unit containing an acid-decomposable group and a carboxy group.

Specific examples of the repeating unit represented by formula (aX) to (aXII) are set forth below as (c1) to (c18).

However, the present invention should not be construed as being limited thereto.
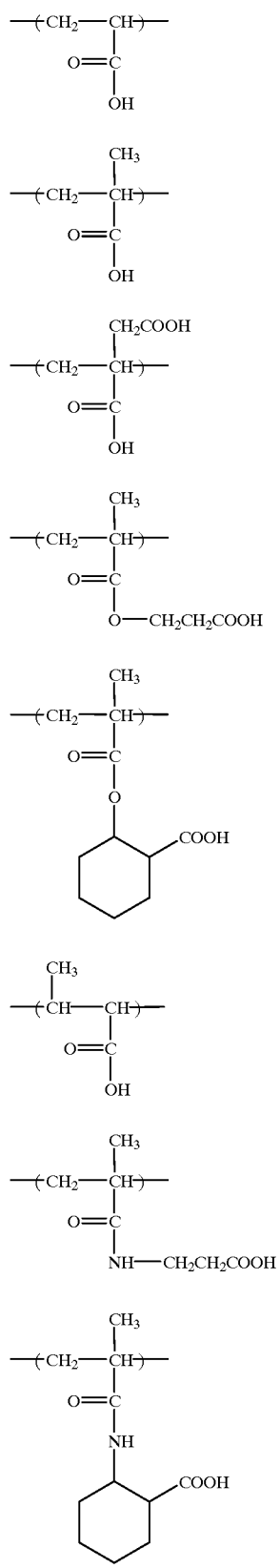
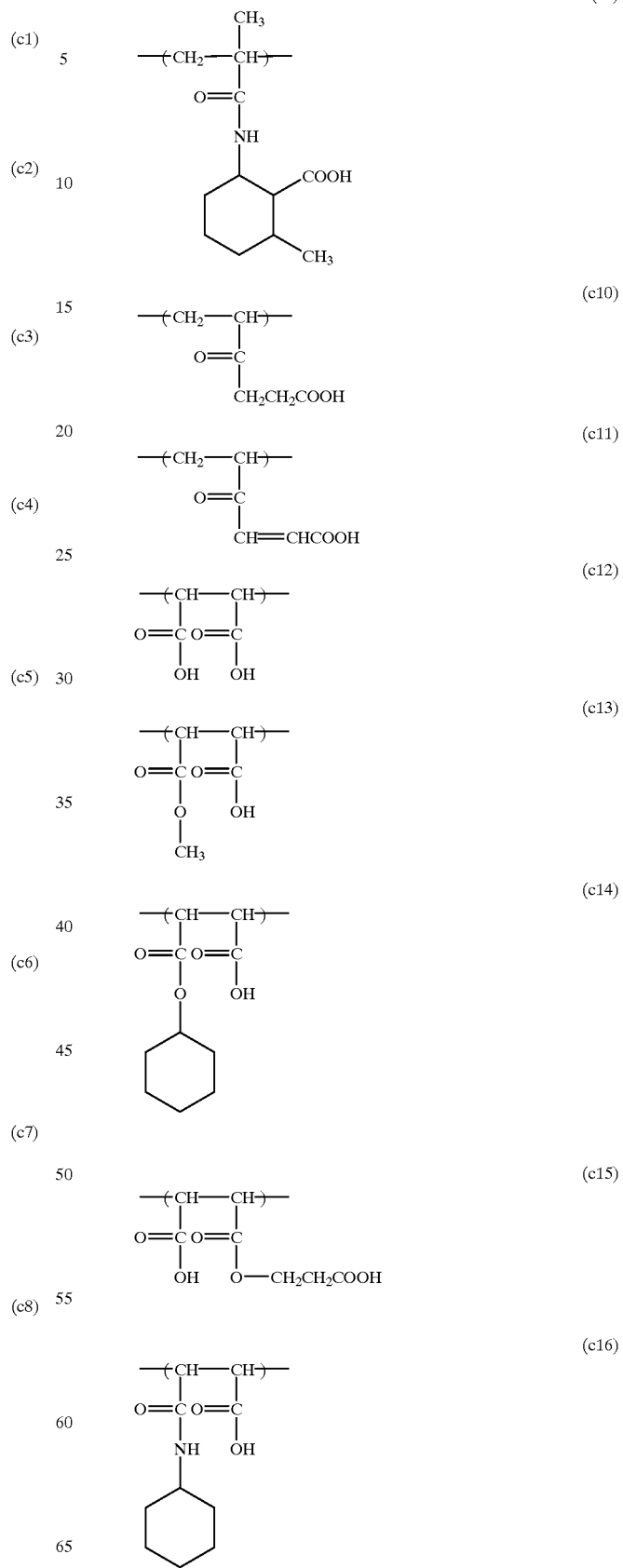

-continued (c17)
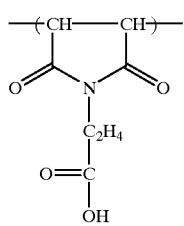

(c18)
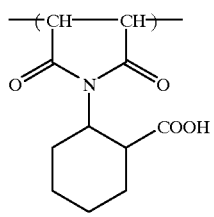

Particularly preferred repeating units each containing the group represented by formula (aI), (aII) or (aIII) according to the present invention are units represented by formula (aIV). The acid-decomposable resin (a) according to the present invention preferably include resins composed of a unit represented by formula (aIV) alone, a combination of units represented by formulae (aIV) and (aVII), a combination of units represented by formulae (aIV) and (aX), and a combination of units represented by formulae (aIV), (aVII) and (aX).

The resin may further contain units derived from one or more other polymerizable monomers such as those described hereinafter.

The acid-decomposable resin (a) for use in the present invention which comprises a repeating unit having a group represented by formula (aI), (aII) or (aIII) (preferably a repeating unit represented by at least one of formulae (aIV) to (aVI)) and a repeating unit having an acid-decomposable group (preferably a repeating unit represented by at least one of formulae (aVII) to (aIX)), and a carboxy group-containing repeating unit (preferably a repeating unit represented by at least one of formulae (aX) to (aXII)) or a repeating unit derived from other polymerizable monomers, if desired, can be synthesized by radical, cation, or anion polymerization of corresponding unsaturated monomers.

More specifically, the monomers in amounts, for example, those corresponding to the preferred composition described above polymerized in an appropriate solvent at a monomer concentration of about from 10 to 40% by weight in the presence of a polymerization catalyst, if desired, with heating.

Acid-Decomposable Resin (b):

A resin having a repeating unit represented by the following formula (bI), a repeating unit represented by the following formula (bII) and a group which is decomposed by the action of an acid:

(bI)
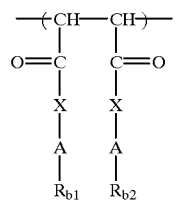

(bII)
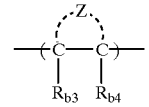

wherein $R_{b1}$ and $R_{b2}$ may be the same or different and each represents a hydrogen atom, a cyano group, a hydroxy group, —COOH, —COOR$_{b5}$, —CO—NH—R$_{b6}$, —CO—NE—SO$_2$—R$_{b6}$, a substituted or unsubstituted alkyl, alkoxy or cyclic hydrocarbon group, or a group —Y; $R_5$ represents a substituted or unsubstituted alkyl or cyclic hydrocarbon group, or a group —Y; the group —Y is represented by

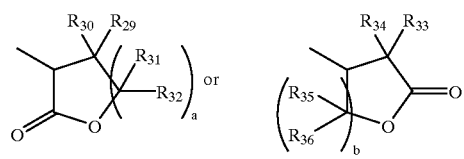

$R_{b6}$ represents a substituted or unsubstituted alkyl or cyclic hydrocarbon group; $R_{29}$ to $R_{36}$ may be the same or different and each represents a hydrogen atom or a substituted or unsubstituted alkyl group; a and b each represents 1 or 2; $R_{b3}$ and $R_{b4}$ may be the same or different and each represents a hydrogen atom, a cyano group, a halogen atom or a substituted or unsubstituted alkyl group;, X represents an oxygen atom, a sulfur atom, —NH—, —NHSO$_2$— or —NHSO$_2$NH—; A represents a single bond or a divalent linkage group; and Z represents an atomic group necessary for forming a substituted or unsubstituted alicyclic structure together with the two carbon atoms (C—C).

In formula (bII), z preferably represents an atomic group necessary for forming a substituted or unsubstituted alicyclic structure having a bridged linkage together with the two carbon atoms (C—C).

Of the repeating units of formula (bII), a repeating unit represented by the following formula (bII-A) or (bII-B) is preferred.

(bII-A)
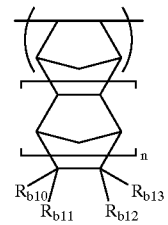

(bII-B)

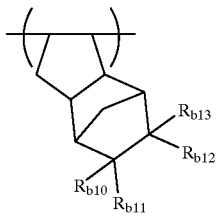

wherein $R_{b10}$ to $R_{b13}$ may be the same or different and each represents a hydrogen atom, a halogen atom, a cyano group, —COOH, —COOR$_{b5}$, an acid-decomposable group, —C(=O)—X—A—R$_{b14}$ or an unsubstituted or substituted alkyl or cyclic hydrocarbon group, or at least two of $R_{b10}$ to $R_{b13}$ combine with each other to form a ring; n is 0 or 1; $R_{b5}$ represents an unsubstituted or substituted alkyl or cyclic hydrocarbon group, or the group —Y as defined above; X represents an oxygen atom, a sulfur atom, —NH—, —NHSO$_2$— or —NHSO$_2$NH—; $R_{b14}$ represents —COOH, —COOR$_{b5}$, —CN, a hydroxy group, an unsubstituted or substituted alkoxy group, —CO—NH—R$_{b6}$, —CO—NH—SO$_2$—R$_{b6}$, or the group —Y as defined above; $R_{b6}$ represents a substituted or unsubstituted alkyl or cyclic hydrocarbon group; and A represents a single bond or a divalent linkage group.

Now, the acid-decomposable resin (b) will be described in greater detail below.

In formula (bI) above, $R_{b1}$ and $R_{b2}$ each represents a hydrogen atom, a cyano group, a hydroxy group, —COOH, —COOR$_{b5}$, —CO—NH—R$_{b6}$, —CO—NH—SO$_2$—R$_{b6}$, a substituted or unsubstituted alkyl, alkoxy or cyclic hydrocarbon group, or the above-described group —Y. $R_{b6}$ represents an unsubstituted or substituted alkyl or cyclic hydrocarbon group. $R_5$ represents a substituted or unsubstituted alkyl or cyclic hydrocarbon group, or the above-described group —Y. $R_{29}$ to $R_{36}$ in the group —Y each represents a hydrogen atom or an unsubstituted or substituted alkyl group. a and b each represents 1 or 2. X represents an oxygen atom, a sulfur atom, —NH—, —NHSO$_2$— or —NHSO$_2$NH—. A represents a divalent linkage group.

Preferred examples of the alkyl group represented by each of $R_{b1}$, $R_{b2}$, $R_{b5}$, $R_{b6}$ and $R_{29}$ to $R_{36}$ include a straight-chain or branched alkyl group containing from 1 to 10 carbon atoms, more preferably containing form 1 to 6 carbon atoms, and yet more preferably methyl, ethyl, propyl, isopropyl, n-butyl, isobutyl, sec-butyl and tert-butyl groups.

Examples of the cyclic hydrocarbon group represented by each of $R_{b1}$, $R_{b2}$, $R_{b5}$ and $R_{b6}$ include a cyclopropyl group, a cyclopenthyl group, a cyclohexyl group, an adamantyl group, a 2-methyl-2-adamantyl group, a norbornyl group, a bornyl group, an isobornyl group, a tricyclodecanyl group, a dicyclopentenyl group, a norbonane epoxy group, a menthyl group, an isomenthyl group, a neomenthyl group and a tetracyclododecanyl group.

Examples of the alkoxy group represented by each of $R_{b1}$ and $R_{b2}$ include an alkoxy group containing form 1 to 4 carbon atoms such as a methoxy, ethoxy, propoxy or butoxy group.

Examples of the substituent present in the above alkyl, cyclic hydrocarbon or alkoxy group include a hydroxy group, a halogen atom, a carboxy group, an alkoxy group, an acyl group, a cyano group and an acyloxy group. The halogen atom includes a chlorine atom, a bromine atom, a fluorine atom and an iodine atom. The alkoxy group includes an alkoxy group containing from 1 to 4 carbon atoms, e.g., a methoxy group, an ethoxy group, a propoxy group or a butoxy group. The acyl group includes a formyl group and an acetyl group. The acyloxy group includes an acetoxy group.

Examples of the divalent linkage group represented by A in the formula (bI) include an alkylene group, a substituted alkylene group, an ether group, a tioether group, a carbonyl group, an ester group, an amido group, a sulfonamideo group, an urethane group, an urea group and a group formed by combining two or more of these groups.

Examples of the alkylene group or substituted alkylene group represented by A include a group having the following formula;

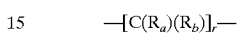

wherein $R_a$ and $R_b$, which may be the same or different, each represents a hydrogen atom, an alkyl group, a substituted alkyl group, a halogen atom, a hydroxy group or an alkoxy group; and r represents an integer of from 1 to 10. The alkyl group suitable for $R_a$ or $R_b$ includes a lower alkyl group such as a methyl, ethyl, propyl, isopropyl or butyl group. More preferably, the alkyl group is a methyl, ethyl, propyl or isopropyl group. Examples of the substituent present in the substituted alkyl group include a hydroxy group, a halogen atom and an alkoxy group. The alkoxy group suitable for $R_a$ or $R_b$ includes an alkoxy group containing from 1 to 4 carbon atoms such as a methoxy, ethoxy, propoxy or butoxy group. The halogen atom suitable for $R_a$ or $R_b$ includes a chlorine, bromine, fluorine or iodine atom.

Specific examples of the repeating unit represented by formula (bI) above are set forth below as [bI-1] to [bI-65], but it should be understood that these examples are not to be construed as limiting the scope of the present invention in any way.

[bI-1]

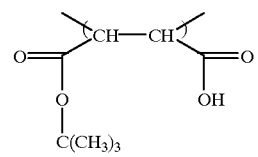

[bI-2]

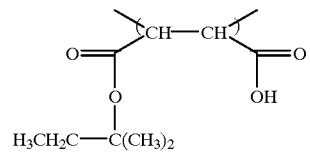

[bI-3]

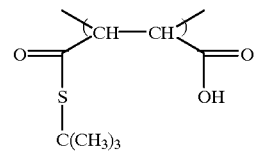

[bI-4]

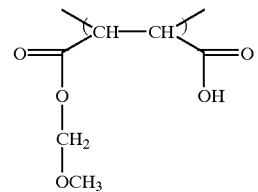

-continued
[bI-5] 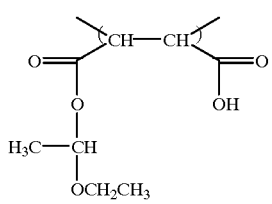
[bI-6] 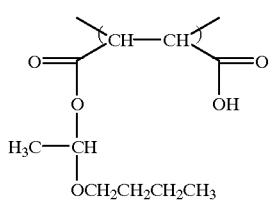
[bI-7] 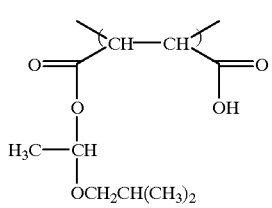
[bI-8] 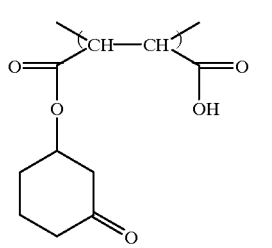
[bI-9] 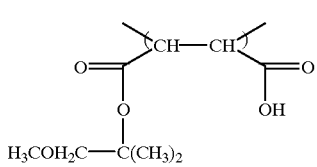
[bI-10] 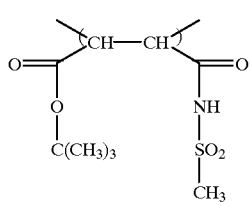
[bI-11] 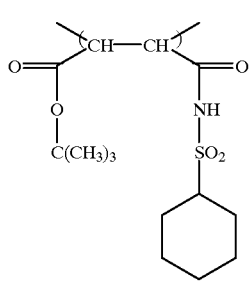
-continued
[bI-12] 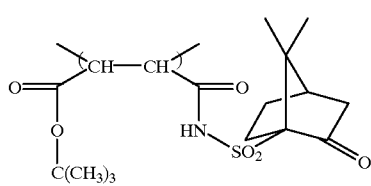
[bI-13] 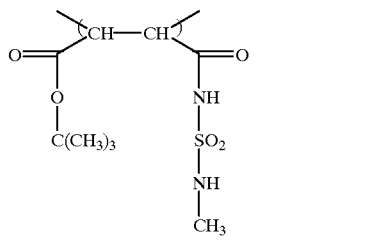
[bI-14] 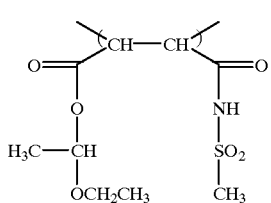
[bI-15] 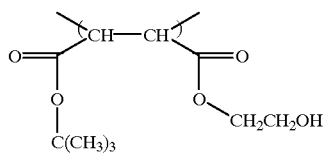
[bI-16] 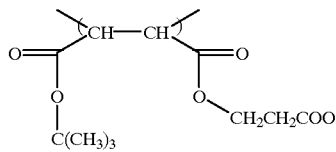
[bI-17] 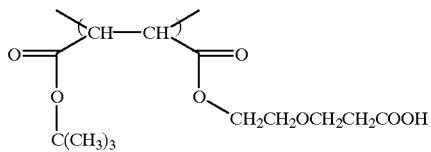
[bI-18] 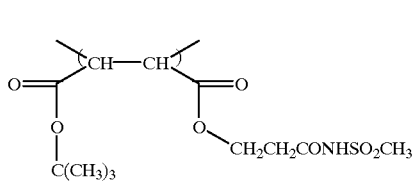
[bI-19] 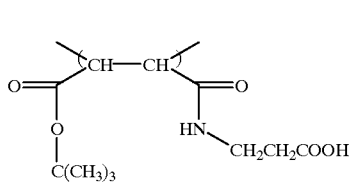

[bI-20]
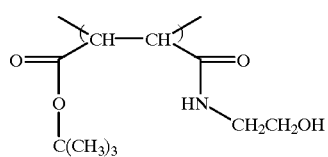
[bI-21]
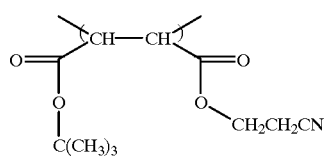
[bI-22]
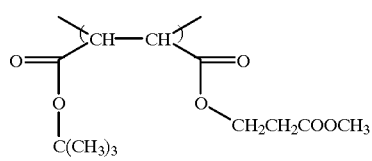
[bI-23]
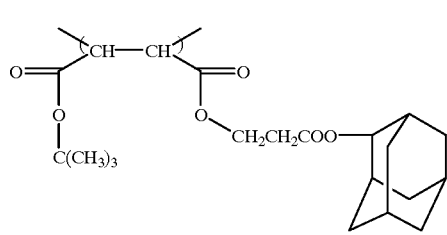
[bI-24]
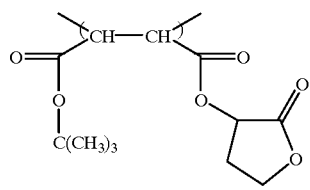
[bI-25]
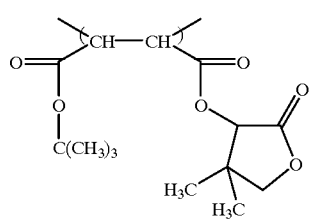
[bI-26]
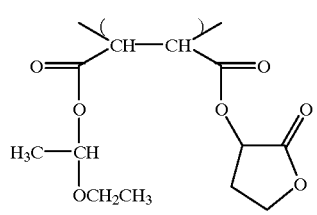
[bI-27]
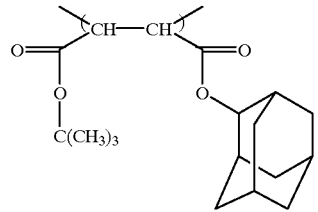
[bI-28]
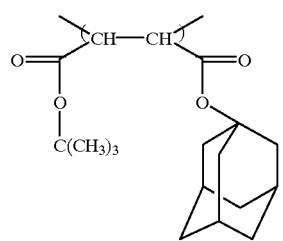
[bI-29]
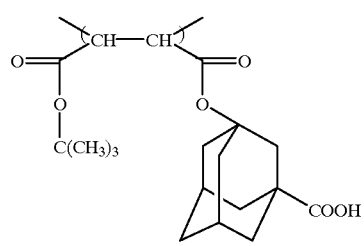
[bI-30]
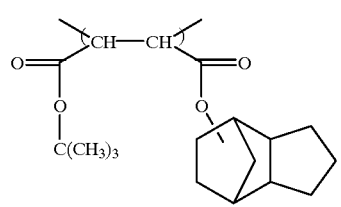
[bI-31]
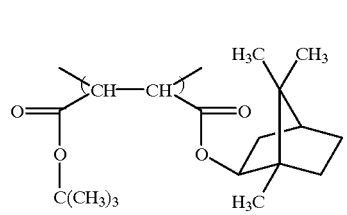
[bI-32]
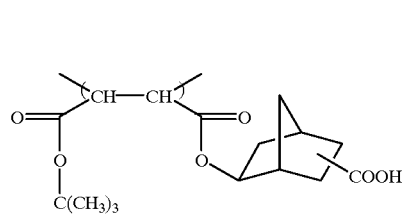
[bI-33]
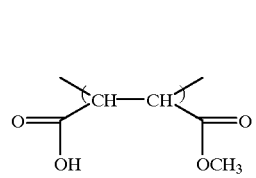

[bI-34]
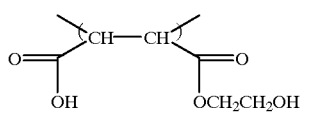
[bI-35]
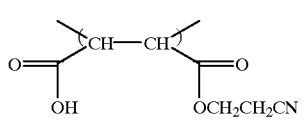
[bI-36]
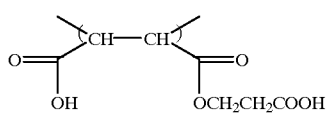
[bI-37]
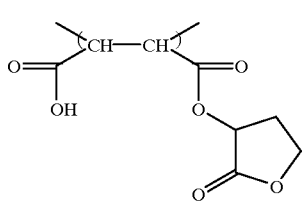
[bI-38]
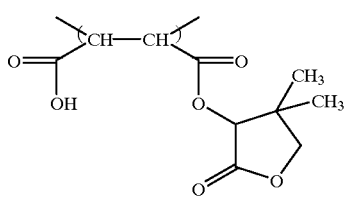
[bI-39]
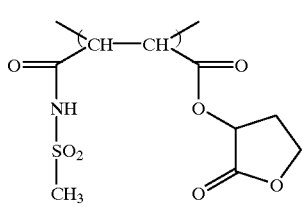
[bI-40]
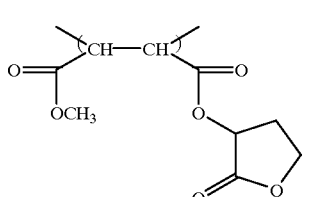
[bI-41]
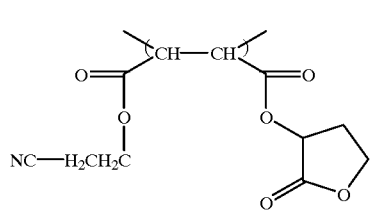
[bI-42]
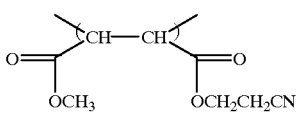
[bI-43]
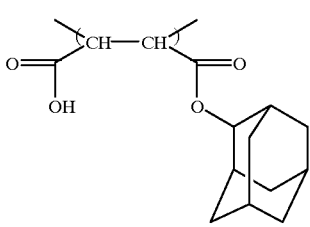
[bI-44]
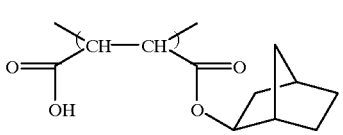
[bI-45]
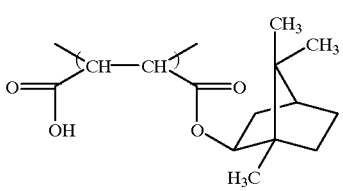
[bI-46]
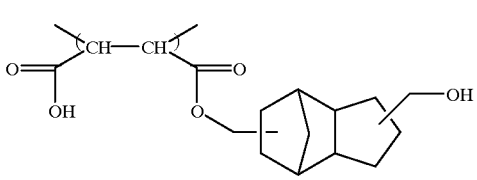
[bI-47]
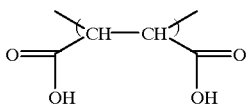
[bI-48]
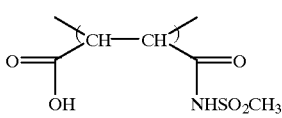
[bI-49]
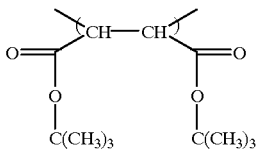
[bI-50]
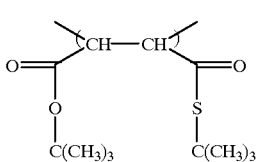

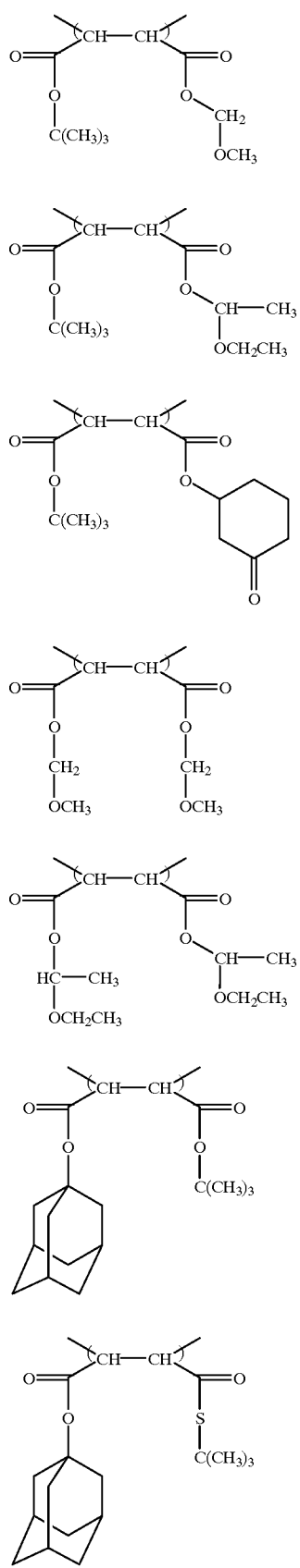
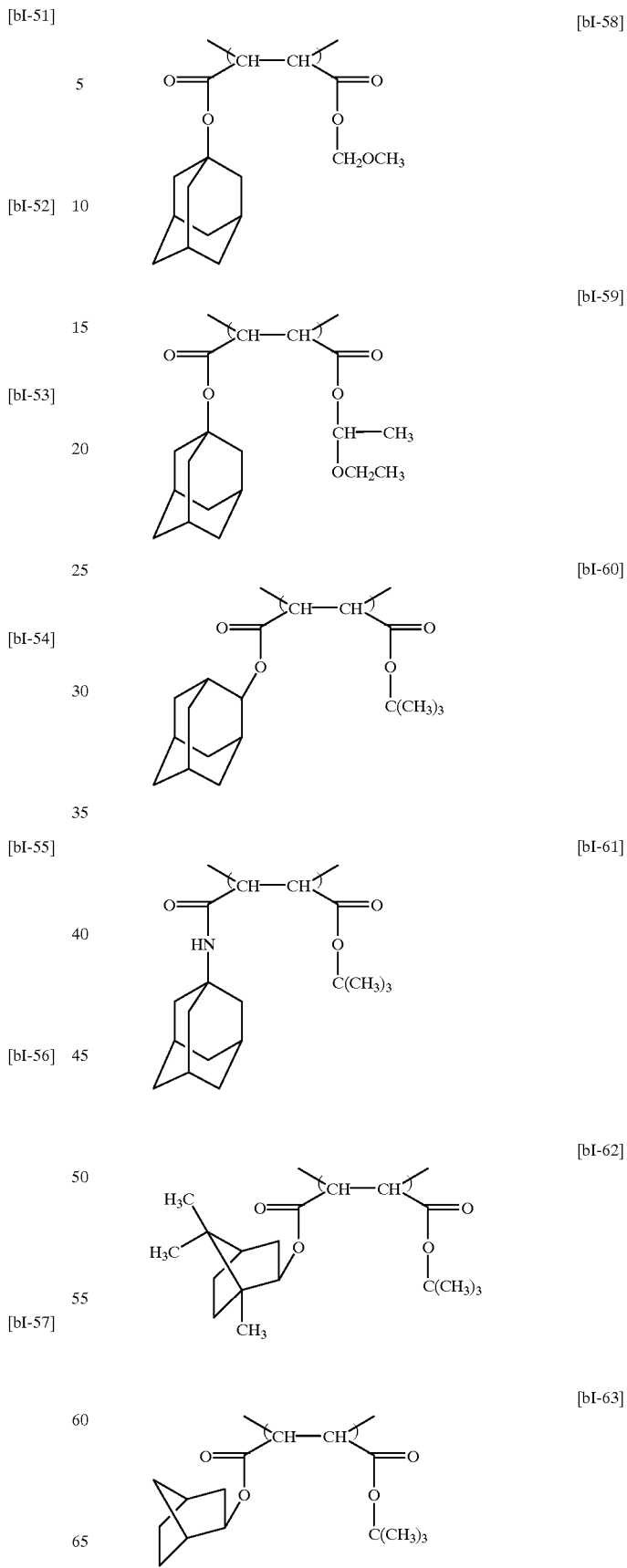

[bI-64]

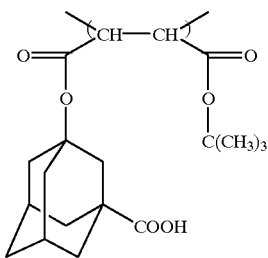

[bI-65]

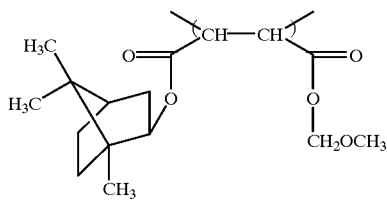

In formula (bII) above, $R_{11}$ and $R_{12}$ each represents a hydrogen atom, a cyano group, a halogen atom or an alkyl group which may have a substituent. Z represents atomic groups necessary for forming an alicyclic structure, which may have a substituent, together with the two carbon atoms (C—C).

Examples of the halogen atom suitable for $R_{b3}$ or $R_{b4}$ include chlorine, bromine, fluorine and iodine atoms.

Preferred examples of the alkyl group suitable for $R_{b3}$ or $R_{b4}$ include a straight-chain or branched alkyl group containing form 1 to 10 carbon atoms, more preferably a straight-chain or branched alkyl group containing form 1 to 6 carbon atoms, yet more preferably methyl, ethyl, propyl, isopropyl, n-butyl, isobutyl, sec-butyl and tert-butyl groups.

Examples of the substituent present in the alkyl group as $R_{b3}$ or $R_{b4}$ include a hydroxy group, a halogen atom, a carboxy group, an alkoxy group, an acyl group, a cyano group and an acyloxy group. The halogen atom as the substituent includes chlorine, bromine, fluorine and iodine atoms. The alkoxy group as the substituent includes an alkoxy group containing from 1 to 4 carbon atoms such as methoxy, ethoxy, propoxy and butoxy groups. The acyl group as the substituent includes formyl and acetyl groups. The acyloxy group as the substituent includes an acetoxy group.

The atomic group necessary for forming an alicyclic structure represented by Z is an atomic group for forming an unsubstituted or substituted alicyclic hydrocarbon as a repeating unit. In particular, an atomic group necessary for forming an alicyclic structure having a bridged linkage, by which the bridged alicyclic hydrocarbon as a repeating unit is completed, is preferred.

The skeleton of the alicyclic hydrocarbon formed includes those described hereinbefore.

The alicyclic hydrocarbon skeleton described above may have substituent(s). Examples of the substituent include those represented by $R_{b10}$ to $R_{b13}$ in formula (bII-A) or (bII-B) described above.

Of the repeating units containing the bridged alicyclic hydrocarbon, the repeating unit represented by formula (bII-A) or (bII-B) is more preferred.

In formula (bII-A) or (bII-B) above, $R_{b10}$ or $R_{b13}$ each represents a hydrogen atom, a halogen atom, a cyano group, —COOH, —COOR$_{b5}$ (wherein $R_{b5}$ represents an unsubstituted or substituted alkyl or cyclic hydrocarbon group, or the group —Y as defined above, an acid-decomposable group, —C(=O)—X—A—R$_{b14}$ or an unsubstituted or substituted alkyl or cyclic hydrocarbon group. n is 0 or 1. X represents an oxygen atom, a sulfur atom, —NH—, —NHSO$_2$— or —NHSO$_2$NH—. $R_{b14}$ represents —COOH, —COOR$_{b5}$, —CN, a hydroxy group, an unsubstituted or substituted alkoxy group, —CO—NH—R$_{b6}$, —CO—NH—SO$_2$—R$_{b6}$ or the group —Y as defined above (wherein $R_{b5}$ and $R_{b6}$ each has the same meaning as defined above). A represents a single bond or a divalent linkage group.

In the acid-decomposable resin (b), the acid-decomposable group may be included in —C(=O)—X—A—R$_{b1}$, —(C=O)—X—A—R$_{b2}$, or as a substituent of Z in formula (bII). The acid-decomposable group is represented by —C(=O)—X$_1$—R$_0$.

Examples of $R_0$ in the formula above include a tertiary alkyl group such as a t-butyl or t-amyl group, an isobornyl group, an 1-alkoxyethyl group such as an 1-ethoxyethyl, 1-butoxyethyl, 1-isobutoxyethyl or 1-cyclohexyloxyethyl group, an alkoxymethyl group such as a methoxymethyl or ethoxymethyl group, a tetrahydropyranyl group, a tetrahydrofuryl group, a trialkylsilyl group, and a 3-oxocyclohexyl group. $X_1$ has the same meaning as defined for X above.

Examples of the halogen atom for each of $R_{b10}$ or $R_{b13}$ include chlorine, bromine, fluorine and iodine atoms.

Preferred examples of the alkyl group for each of $R_{b10}$ to $R_{b13}$ include a straight-chain or branched alkyl group containing from 1 to 10 carbon atoms, more preferably a straight-chain or branched alkyl group containing from 1 to 6 carbon atoms, yet more preferably methyl, ethyl, propyl, isopropyl, n-butyl, isobutyl, sec-butyl and tert-butyl groups.

Examples of the cyclic hydrocarbon group for each of $R_{b10}$ or $R_{b13}$ include a cyclic alkyl group and a bridged hydrocarbon group, for example, cyclopropyl, cyclopentyl, cyclohexyl, admantyl, 2-methyl-2-adamantyl, norbornyl, bornyl, isobornyl, tricyclodecanyl, dicyclopentenyl, norbornane epoxy, menthyl, isomenthyl, neomenthyl and tetracyclodecanyl groups.

Examples of the ring formed by combining at least two of $R_{b10}$ to $R_{b13}$ include a ring containing from 5 to 12 carbon atoms such as cyclopentene, cyclohexene, cycloheptane and cyclooctane rings.

Examples of the alkoxy group for $R_{b14}$ include an alkoxy group containing from 1 to 4 carbon atoms, such as methoxy, ethoxy, propoxy and butoxy groups.

Examples of the substituent present in the alkyl, cyclic hydrocarbon or alkoxy group above include a hydroxy group, a halogen atom, a carboxy group, an alkoxy group, an acyl group, a cyano group and an acyloxy group. The halogen atom includes chlorine, bromine, fluorine and iodine atoms. The alkoxy group includes an alkoxy group containing from 1 to 4 carbon atoms, e.g., methoxy, ethoxy, propoxy and butoxy groups. The acyl group includes, e.g., formyl and acetyl groups. The acyloxy group includes, e.g., an acetoxy group.

Examples of the divalent linkage group for A above include, similar to the divalent linkage group as the A in formula (bI) above, a single bond, an alkylene group, a substituted alkylene group, an ether group, a thioether group, a carbonyl group, an ester group, an amido group, a sulfonamido group, a urethane group, a urea group and a combination of two or more of these groups.

Examples of the alkylene group or substituted alkylene group represented by A include a group having the following formula:

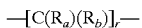

wherein $R_a$ and $R_b$, which may be the same or different, each represents a hydrogen atom, an alkyl group, a substituted alkyl group, a halogen atom, a hydroxy group or an alkoxy group; and r represents an integer of from 1 to 10. The alkyl group suitable for $R_a$ or $R_b$ includes a lower alkyl group such as a methyl, ethyl, propyl, isopropyl or butyl group. More preferably, the alkyl group is a methyl, ethyl, propyl or isopropyl group. Examples of the substituent present in the substituted alkyl group include a hydroxy group, a halogen atom and an alkoxy group. The alkoxy group suitable for $R_a$ or $R_b$ includes an alkoxy group containing from 1 to 4 carbon atoms, such as a methoxy, ethoxy, propoxy or butoxy group. The halogen atom suitable for $R_a$ or $R_b$ includes a chlorine, bromine, fluorine or iodine atom.

In the acid-decomposable resin (b), the acid-decomposable group may be present in at least either the repeating unit of formula (bI) or (bII), or a repeating unit of a copolymerizing component described hereinafter.

The various substituents as $R_{b10}$ to $R_{b13}$ in formula (bI-A) or (bI-B) above become the substituents of the atomic group for forming an alicyclic structure or the atomic group Z for forming a bridged alicyclic structure in formula (bII).

Specific examples of the repeating unit represented by formula (bII-A) or (bII-B) above are set forth below as [bII-1] to [bII-166], but it should be understood that these examples are not to be construed as limiting the scope of the present invention in any way.

[bII-1]
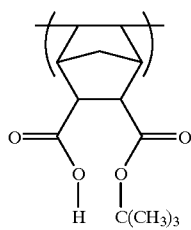

[bII-2]
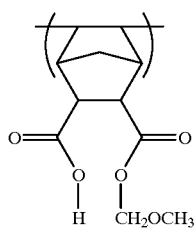

[bII-3]
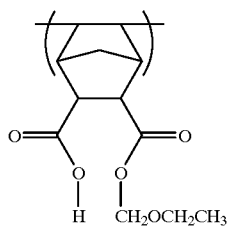

[bII-4]
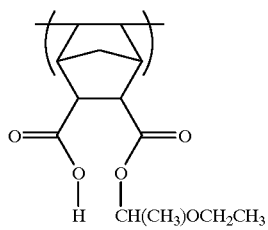

[bII-5]
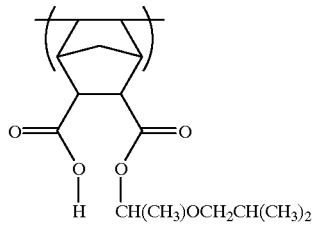

[bII-6]
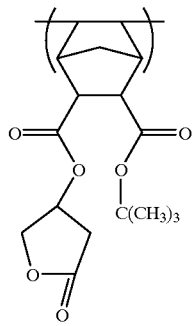

[bII-7]
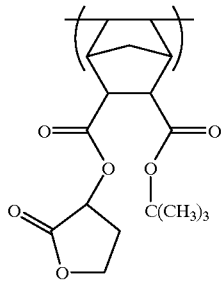

[bII-8]
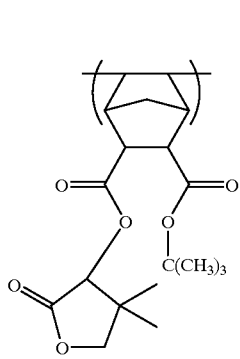

[bII-9]
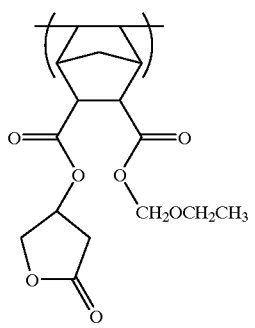

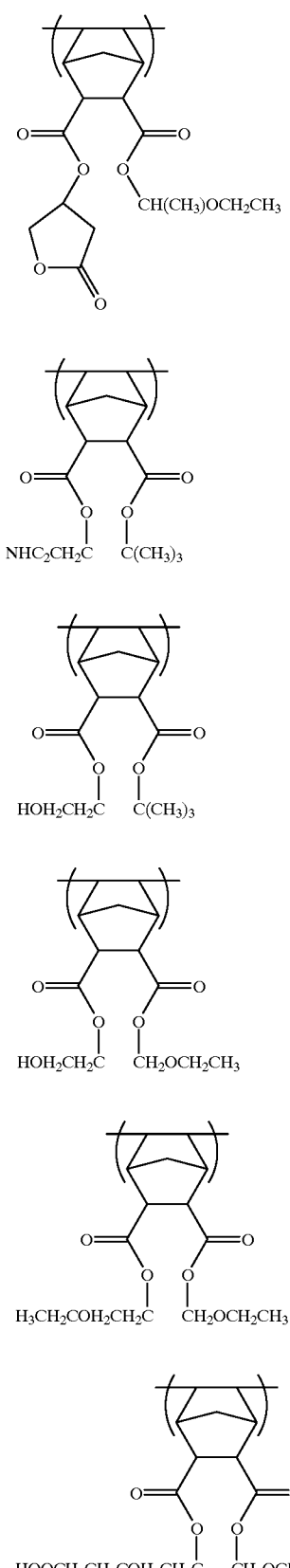
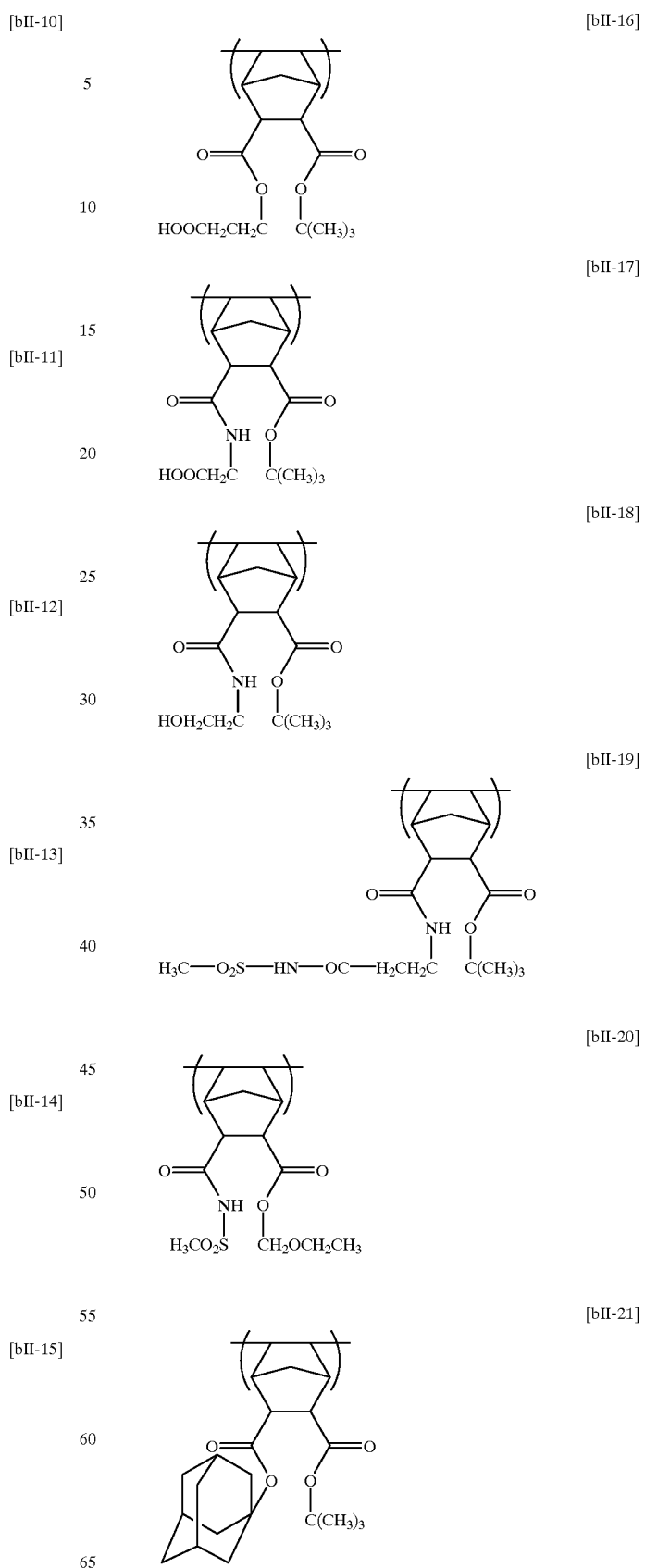

[bII-22] 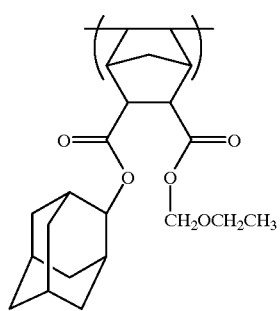
[bII-23] 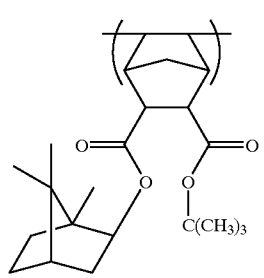
[bII-24] 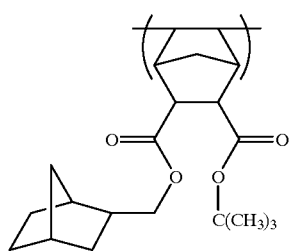
[bII-25] 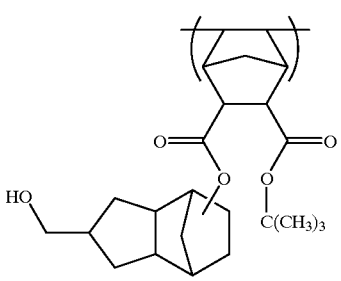
[bII-26] 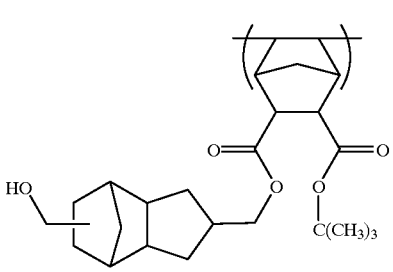
[bII-27] 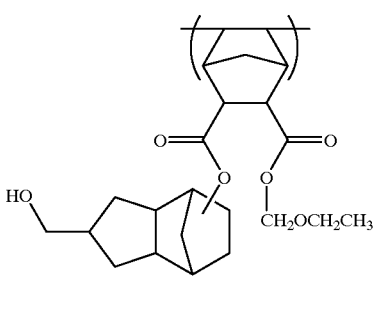
[bII-28] 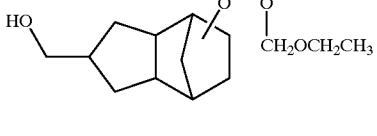
[bII-29] 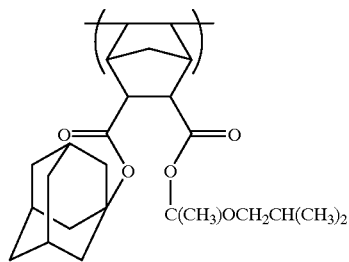
[bII-30] 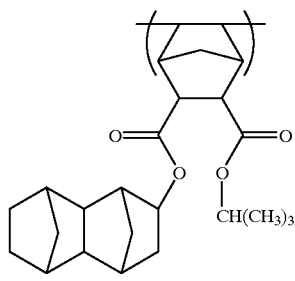
[bII-31] 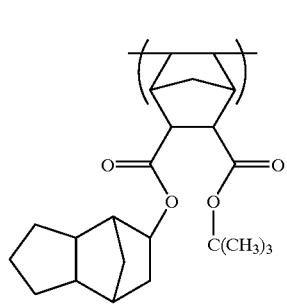
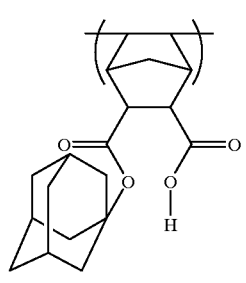

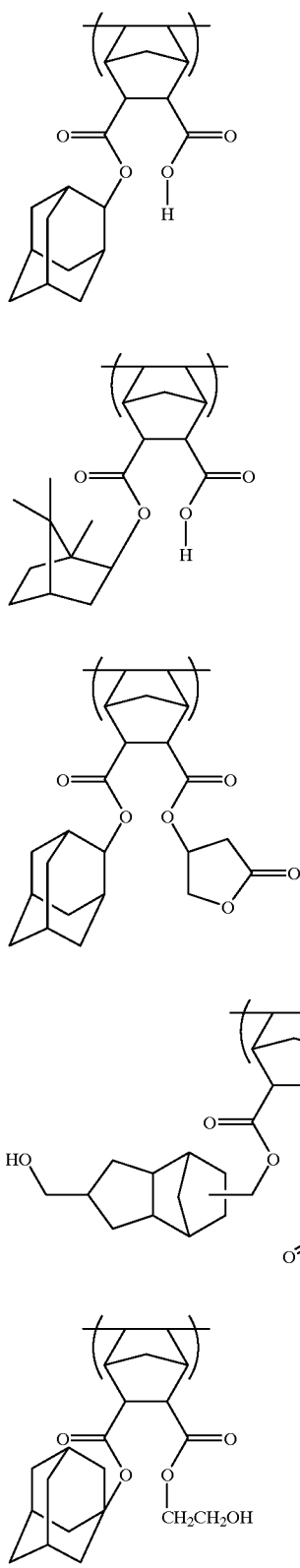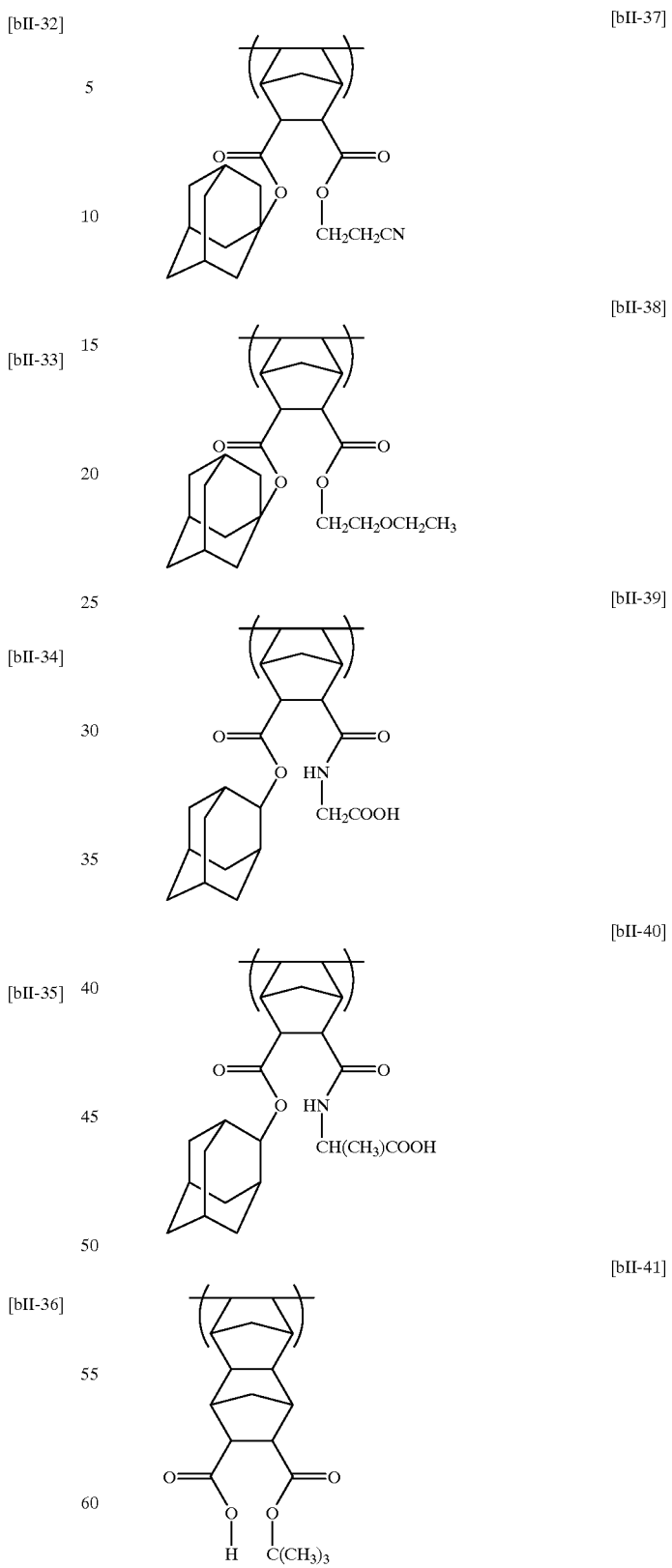

[bII-42]
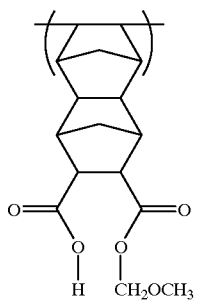
[bII-43]
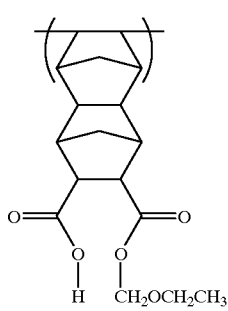
[bII-44]
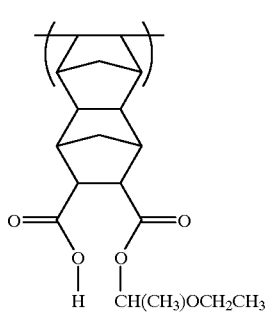
[bII-45]
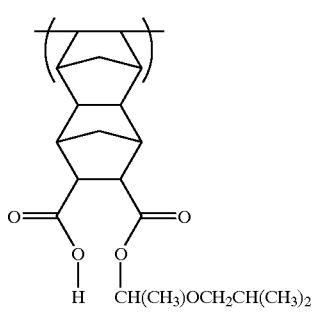
[bII-46]
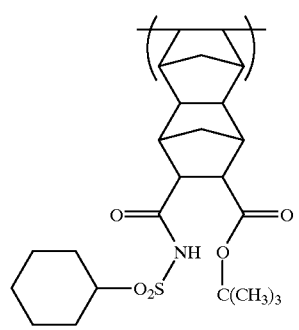
[bII-47]
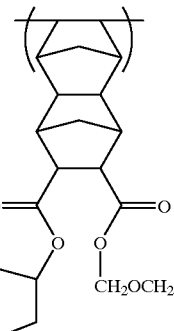
[bII-48]
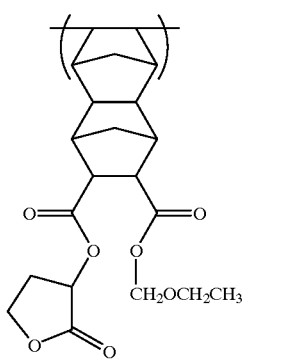
[bII-49]
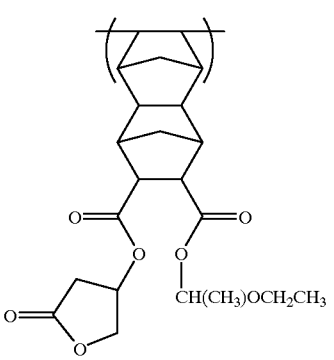
[bII-50]
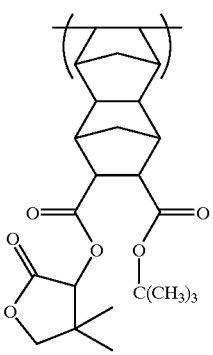

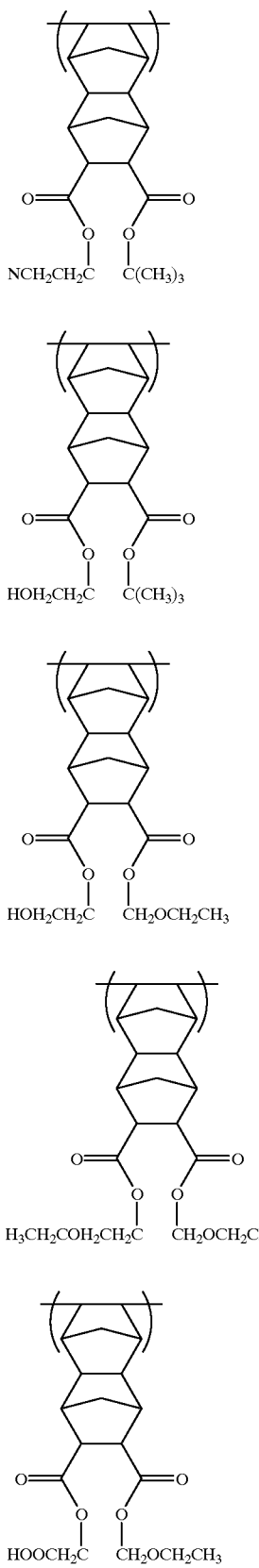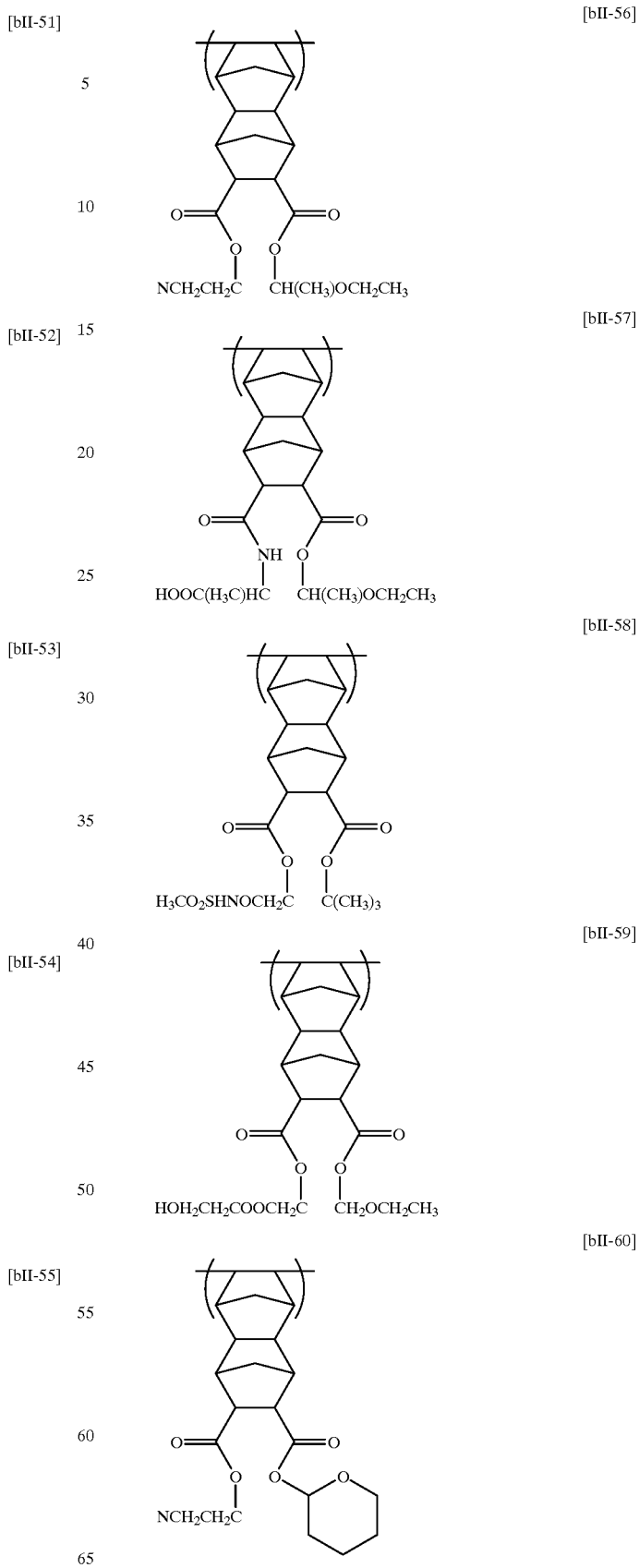

[bII-61]

[bII-62]

[bII-63]

[bII-64]

[bII-65]

[bII-66]

[bII-67]

[bII-68]

[bII-69]
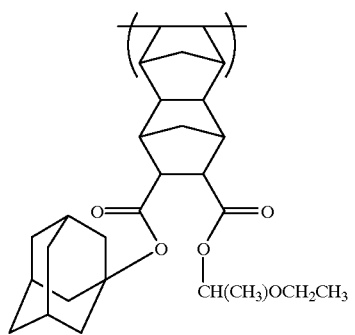
[bII-70]
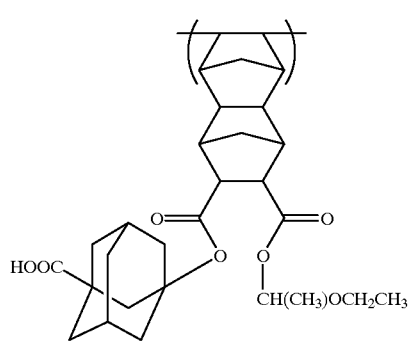
[bII-71]
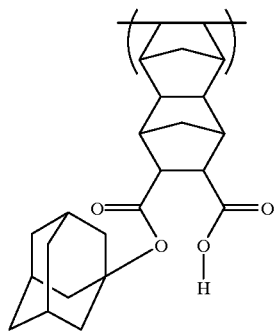
[bII-72]
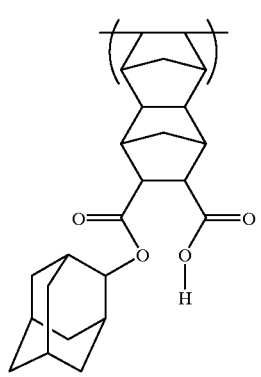
[bII-73]
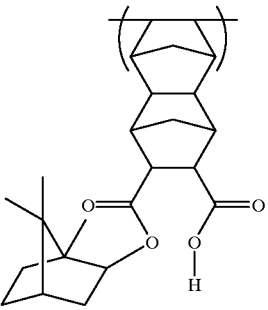
[bII-74]
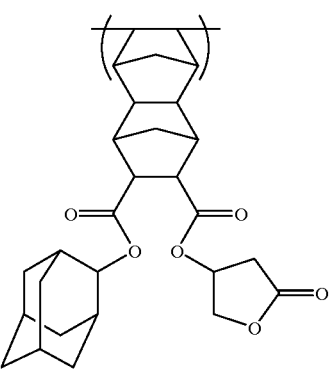
[bII-75]
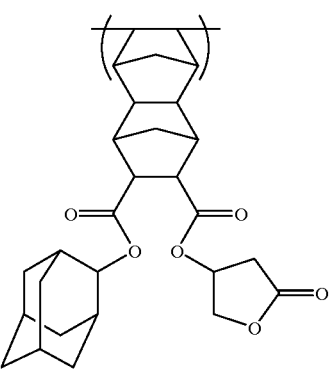
[bII-76]
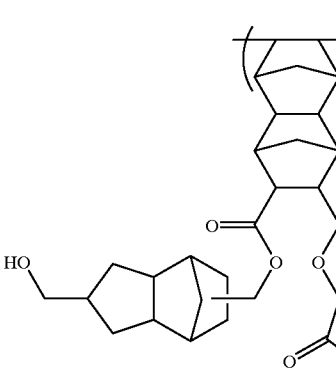

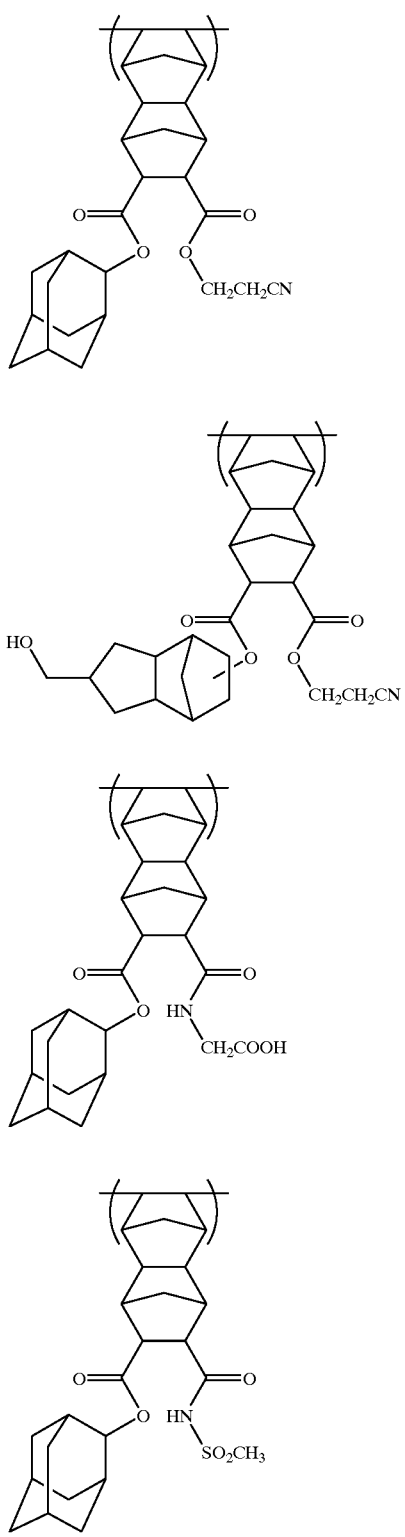
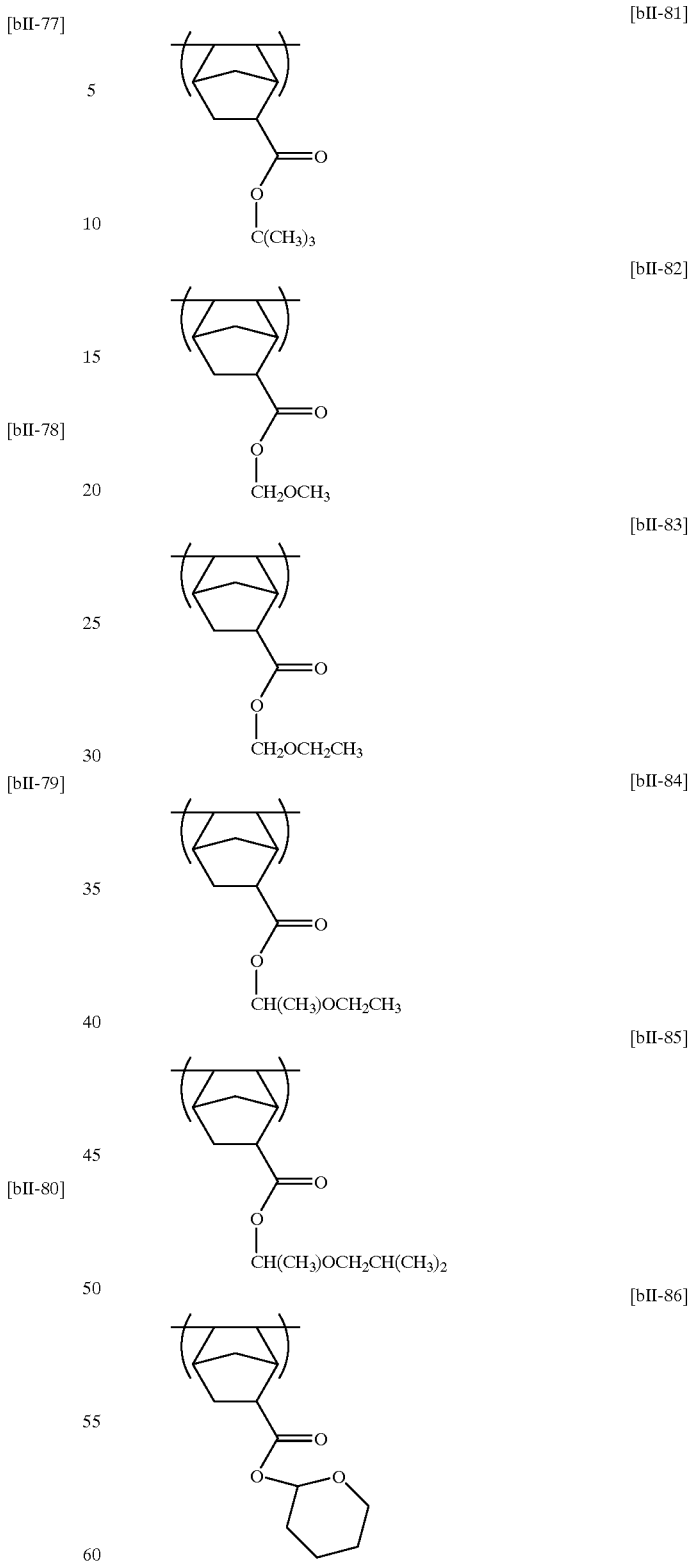

[bII-87]
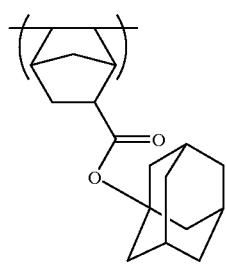
[bII-88]
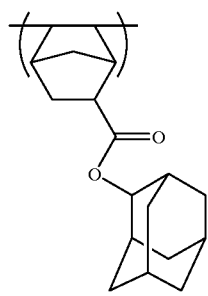
[bII-89]
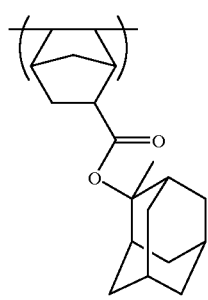
[bII-90]
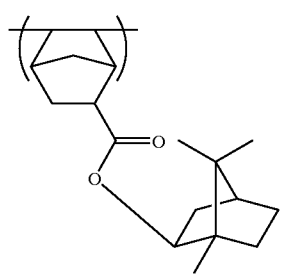
[bII-91]
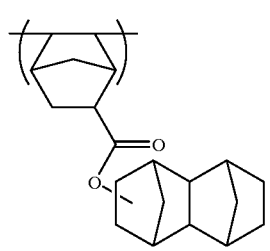
[bII-92]
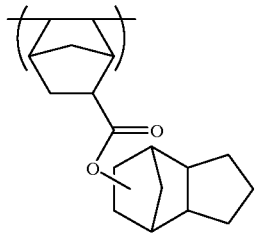
[bII-93]
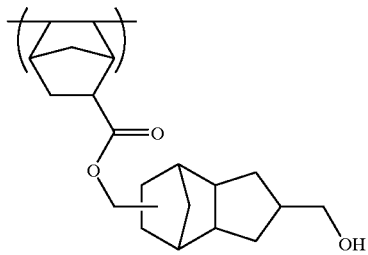
[bII-94]
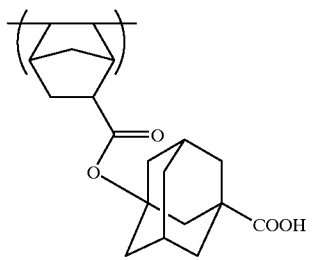
[bII-95]
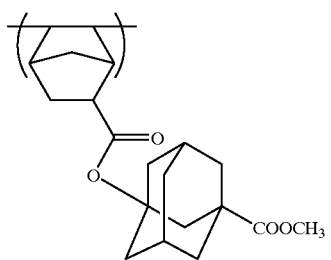
[bII-96]
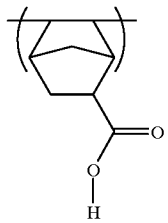
[bII-97]
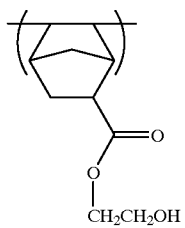

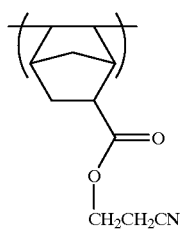
[bII-98]
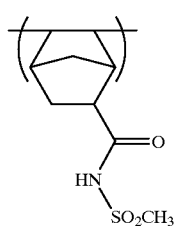
[bII-99]
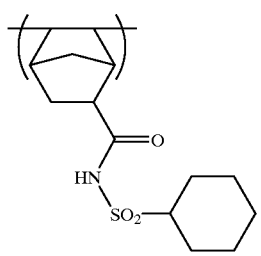
[bII-100]
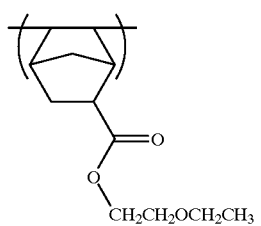
[bII-101]
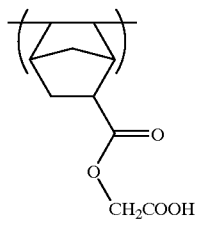
[bII-102]
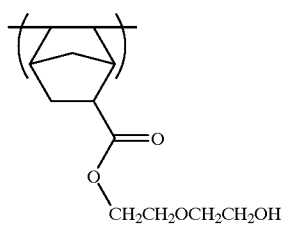
[bII-103]
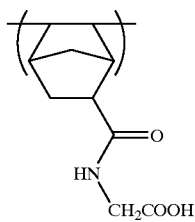
[bII-104]
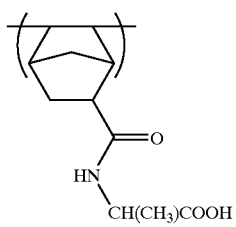
[bII-105]
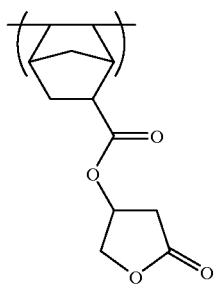
[bII-106]
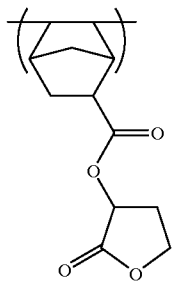
[bII-107]
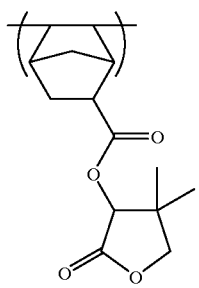
[bII-108]
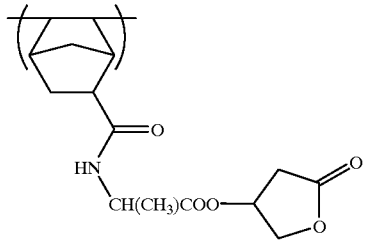
[bII-109]

[bII-110] 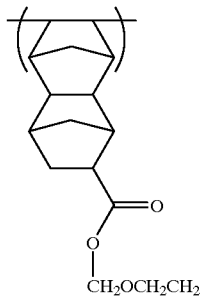
[bII-115] 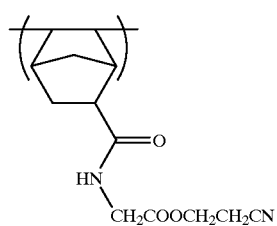
[bII-111] 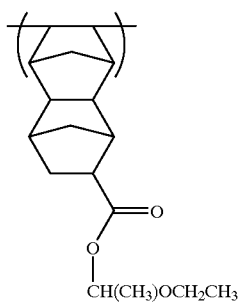
[bII-116] 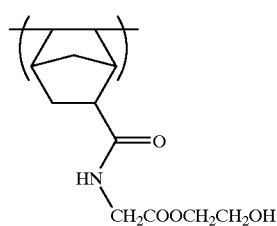
[bII-112] 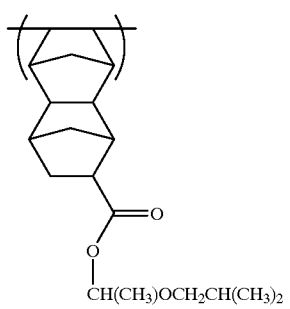
[bII-117] 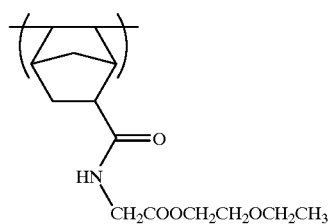
[bII-113] 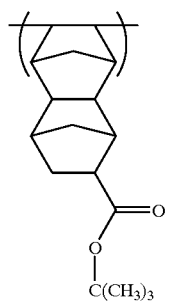
[bII-118] 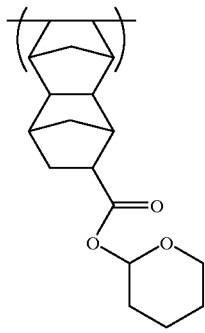
[bII-114] 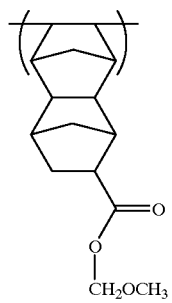
[bII-119] 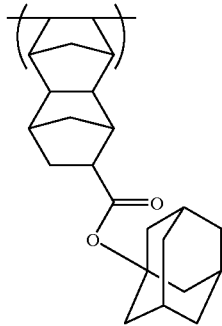

[bII-120]
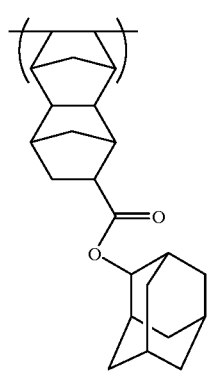
[bII-121]
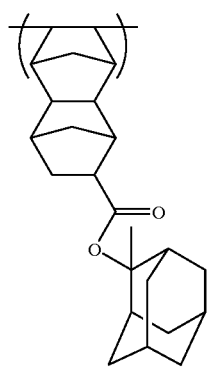
[bII-122]
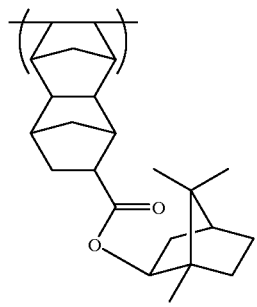
[bII-123]
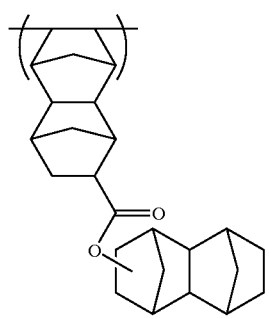
[bII-124]
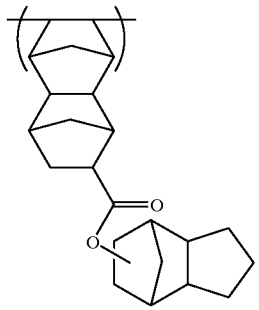
[bII-125]
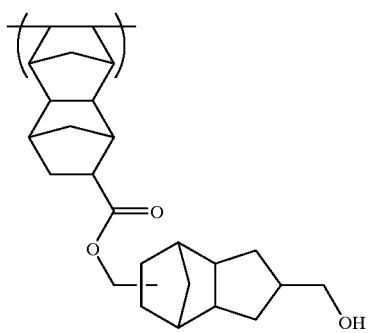
[bII-126]
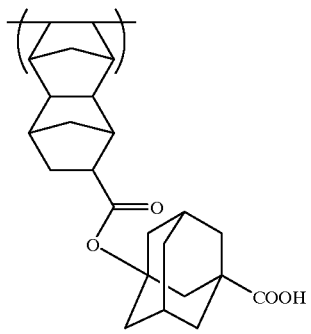
[bII-127]
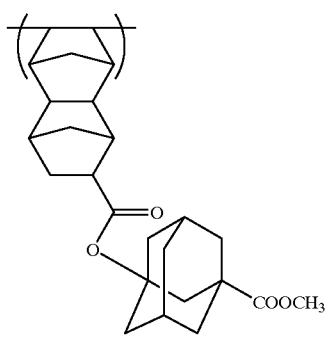

-continued
[bII-128]
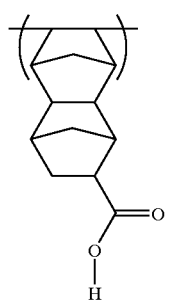
[bII-129]
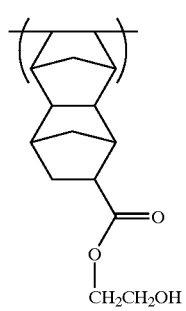
[bII-130]
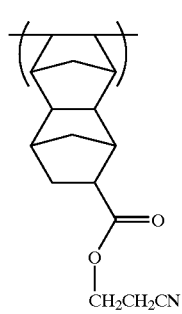
[bII-131]
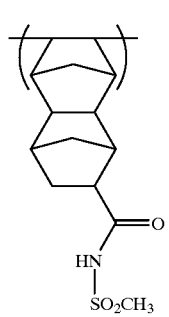
[bII-132]
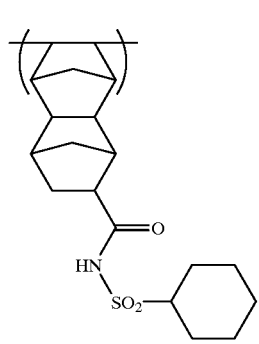
-continued
[bII-133]
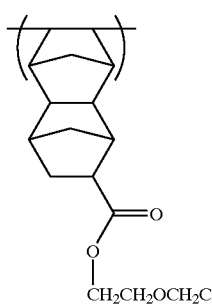
[bII-134]
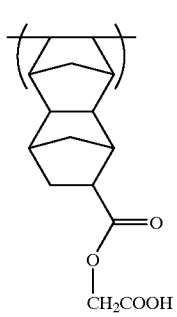
[bII-135]
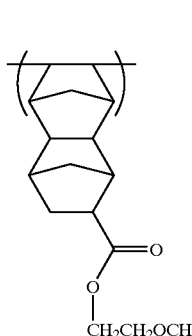
[bII-136]
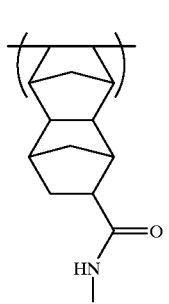
[bII-137]
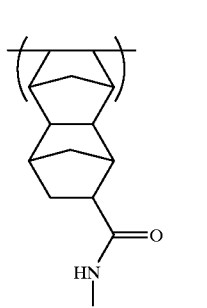

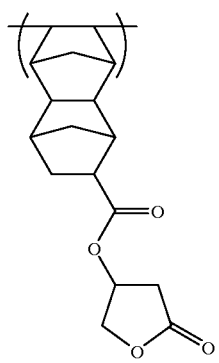
[bII-138]
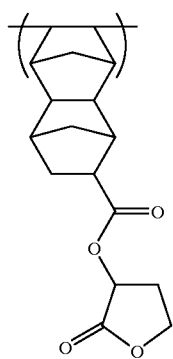
[bII-139]
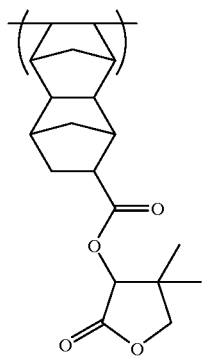
[bII-140]
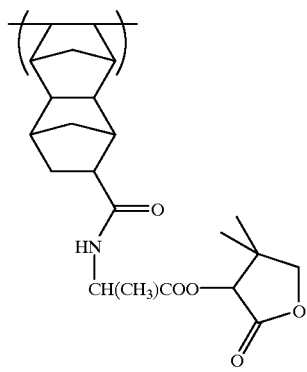
[bII-141]
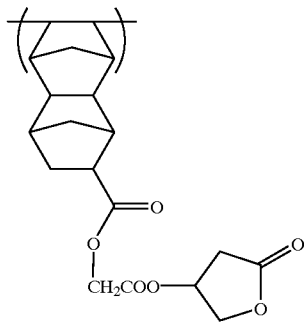
[bII-142]
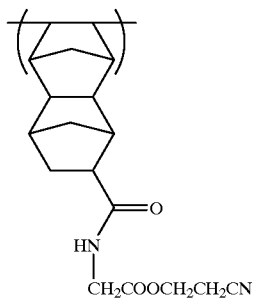
[bII-143]
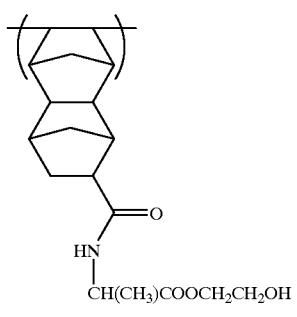
[bII-144]
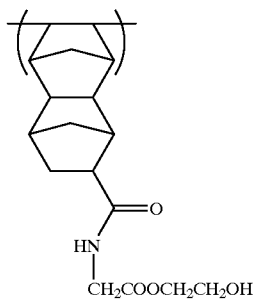
[bII-145]
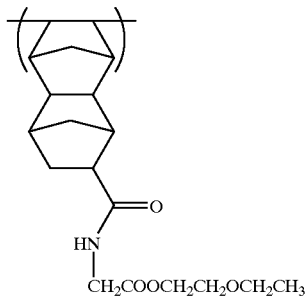
[bII-146]

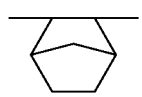
[bII-147]
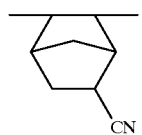
[bII-148]
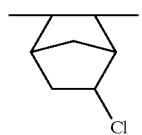
[bII-149]
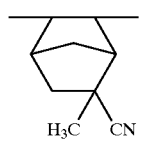
[bII-150]
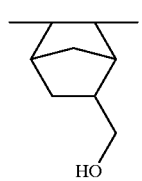
[bII-151]
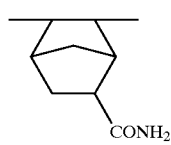
[bII-152]
[bII-153]
[bII-154]
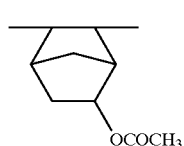
[bII-155]
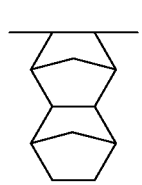
[bII-156]
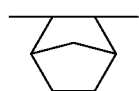
[bII-157]
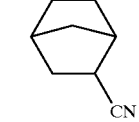
[bII-158]
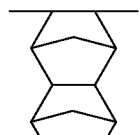
[bII-159]
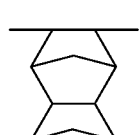
[bII-160]
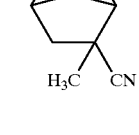
[bII-161]
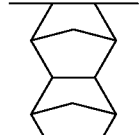
[bII-162]
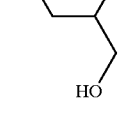
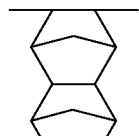
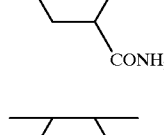
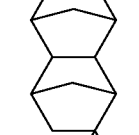
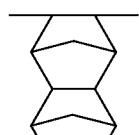
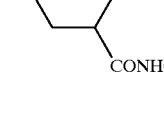
[bII-163]

-continued

[bII-164]
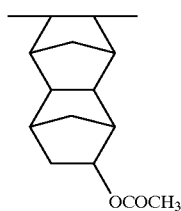

[bII-165]
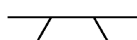

[bII-166]
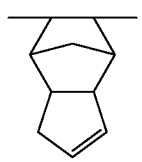

[bII-167]
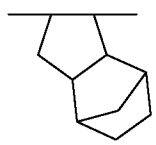

Besides containing one or more repeating units represented by formula (bI) and one or more repeating units represented by formula (bII) (including formulae (bII-A) and (bII-B)), the acid-decomposable resin (b) may contain repeating units derived from various monomers for the purposes of controlling the dry etching resistance, aptitude to a standard developing solution, adhesion to a substrate and resist profile, and further meeting ordinary requirements for resist such as resolution, heat resistance and sensitivity.

Examples of the copolymerizing component suitable for such purposes include a repeating unit represented by the following formula (bIII) or (bIV):

[bIII]
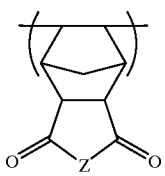

[bIV]
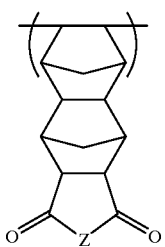

wherein Z represents an oxygen atom, —NH—, —N(R$_{b20}$)— or —N(—OSO$_2$R$_{b30}$)—; and R$_{b20}$ represents a substituted or unsubstituted alkyl or cyclic hydrocarbon group as recited hereinbefore.

Specific examples of the repeating unit represented by formula (bIII) or (bIV) above are set forth below as [bIII-1] to [bIII-8] and [bIV-1] to [bIV-8], but it should be understood that these examples are not to be considered as limiting the scope of the present invention in any way.

[bIII-1]
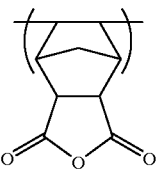

[bIII-2]
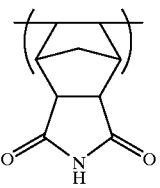

[bIII-3]
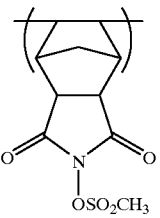

[bIII-4]
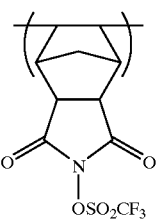

[bIII-5]
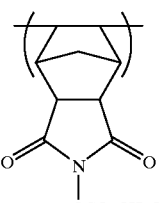

[bIII-6]
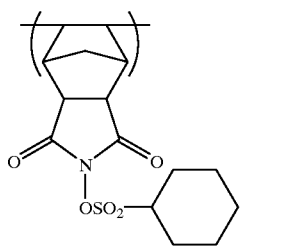
[bIII-7]
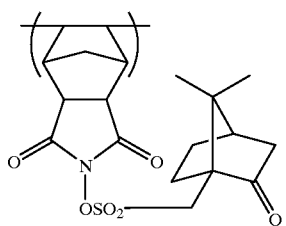
[bIII-8]
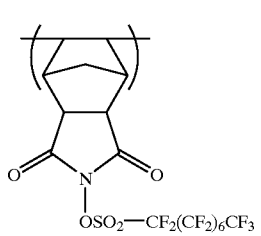
[bIV-1]
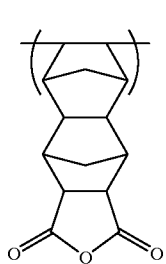
[bIV-2]
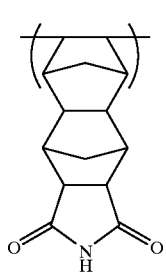
[bIV-3]
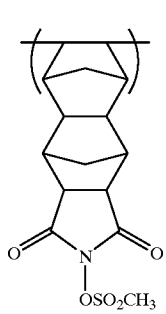
[bIV-4]
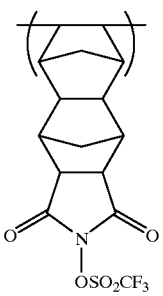
[bIV-5]
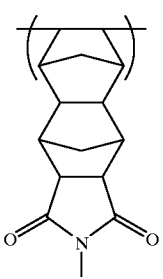
[bIV-6]
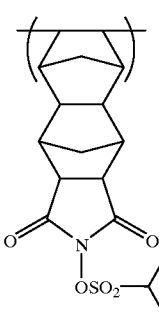
[bIV-7]
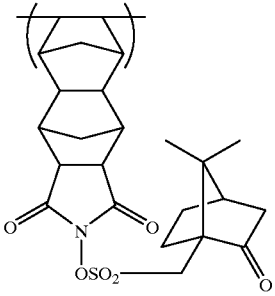
[bIV-8]
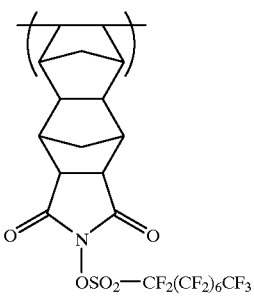
In the acid-decomposable resin (b) according to the present invention, the contents of repeating units represented by formula (bI) and formula (bII) (including formulae (bII-A) and (bII-B)) can be determined appropriately considering the desired dry etching resistance, sensitivity, prevention of cracking in resist pattern, adhesion to a substrate, resist profile, and further ordinary requirements for resist such as resolution and heat resistance. The content of the respective repeating units of formulae (bI) and (bII) in the total repeating units of the acid-decomposable resin (b) is ordinarily 30 mol % or more, preferably 40 mol % or more, and more preferably 50 mol % ore more.

The content of repeating unit derived from monomers as the desirable copolymerizing component in the acid-decomposable resin (b) according to the present invention can be determined appropriately depending on the desired resist characteristics. In general, it is preferably 99 mol % or less, more preferably 90 mol % or less, yet more preferably 80 mol % or less, to the total mole number of repeating units of formula (bI) and those of formula (bII).

In the acid-decomposable resin (b) according to the present invention, the group decomposed by the action of an acid may be containing in any of the repeating units, including the repeating units represented by formulae (bI) and (bII) and those derived from monomers as copolymerizing component. The content of the repeating unit having the group decomposed by the action of an acid in the resin is suitably from 8 to 60 mol %, preferably from 10 to 55 mol %, more preferably from 12 to 50 mol %, to the total repeating units of the resin.

The acid-decomposable resin (b) according to the present invention can be generally synthesized by copolymerizing a monomer corresponding to the repeating unit of formula (bII), maleic anhydride and, if desired, monomer(s) as copolymerizing component in the presence of a polymerization catalyst, subjecting the repeating unit form maleic anhydride to ring-opening esterification with an alcohol or hydrolysis under a basic or acidic condition, and then converting the thus produced carboxylic acid moiety into the desired substituent group.

In addition to the acid-decomposable resins described above, the following resins are also employed in the present invention.

The copolymer described on page 545 and five copolymers described in Table 2 on page 547 of Journal of Photopolymer Science and Technology, Vol. 10, No. 4 (1997);

the partially protected resin of carboxylic acid polymer described in FIG. 2 on page 562 of Journal of Photopolymer Science and Technology, Vol. 10, No. 4 (1997);

the quaterpolymer described in FIG. 1 on page 514 of Journal of Photopolymer Science and Technology, Vol. 10, No. 3 (1997); and Resin 3a described in Scheme 1 on page 116 of SPIE, Vol. 3049 (1997).

In the acid-decomposable resin according to the present invention, monomer(s) described below may be introduced as additional repeating unit(s) by copolymerization so long as the effects intended by the present invention can be obtained. Monomers usable for the copolymerization should not be construed as being limited to those described below.

The introduction of additional repeating units enables minute control of the characteristics required for the resin, particularly (1) solubility in a coating solvent, (2) resist film formability (glass transition temperature), (3) developing property with alkali, (4) reduction in a film thickness (hydrophobicity, selection of alkali-soluble group), (5) adhesion to a substrate in the unexposed area and (6) dry etching resistance.

Examples of such copolymerizable monomers include compounds having one addition polymerizable unsaturated bond, such as acrylates, methacrylate, acrylamides, methacrylamides, allyl compound, vinyl ethers and vinyl esters.

More specifically, the above compounds include:

acrylates, such as alkyl acrylates (preferably those containing an alkyl group having from 1 to 10 carbon atoms), e.g., methyl acrylate, ethyl acrylate, propyl acrylate, amyl acrylate, cyclohexyl acrylate, ethylhexyl acrylate, octyl acrylate, tert-octyl acrylate, chloroethyl acrylate, 2-hydroxyethyl acrylate, 2,2-dimethylhydroxypropyl acrylate, 5-hydroxyethyl acrylate, trimethylolpropane monoacrylate, pentaerythritol monoacrylate, benzyl acrylate, methoxybenzyl acrylate, furfuryl acrylate, and tetrahydrofurfuryl acrylate);

methacrylates, such as alkyl methacrylates (preferably those containing an alkyl group having form 1 to 10 carbon atoms), e.g., methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate, and tetrahydrofurfuryl methacrylate);

acrylamides, such as acrylamide, N-alkylacrylamides (the alkyl group of which is an alkyl group having from 1 to 10 carbon atoms, e.g., methyl, ethyl, propyl, butyl, tert-butyl, hepthyl, octyl, cyclohexyl, hydroxyethyl), N,N-dialkylacrylamides (the alkyl group of which is an alkyl group having form 1 to 10 carbon atoms, e.g., methyl, ethyl, butyl, isobutyl, ethylhexyl, cyclohexyl), N-hydroxyethyl-N-methylacrylamide, and N-2-acetamidoethyl-N-acetylacryl-amide;

methacrylamides, such as methacrylamide, N-alkylmethacrylamides (the alkyl group of which is an alkyl group having from 1 to 10 carbon atoms, e.g., methyl, ethyl, tert-butyl, ethylhexyl, hydroxyethyl, cyclohexyl), N,N-dialkylmethacrylamides (the alkyl group of which includes, e.g., ethyl, propyl and butyl), and N-hydroxyethyl-N-methylmethacrylamide;

allyl compounds, such as allyl esters (e.g., allyl acetate, allyl caproate, ally caprate, allyl laurate, allyl palmitate, allyl stearate, allyl benzoate, allyl acetoacetate, and ally lactate), and allyl oxyethanol;

vinyl ethers, such as alkyl vinyl ethers (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether);

vinyl esters, such as vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetoacetate, vinyl lactate, vinyl β-phenylbutyrate, and vinyl cyclohexylcarboxylate;

dialkyl itaconates (e.g., dimethyl itaconate, diethyl itaconate, and dibutyl itaconate); dialkyl fumarates (e.g., dibutyl fumrate) and monoalkyl fumarates; acrylic acid, methacrylic acid, crotonic acid, itaconic acid, maleic anhydride, maleimide, acrylonitrile, methacrylonitrile and maleylonitrile.

In addition to the compounds as described above, any of addition polymerizable unsaturated compounds may be used as comonomers so long as they can be copolymerized with the repeating units described above.

The content of repeating unit derived from monomer described above as the additional copolymerizing component in the resin can be appropriately determined depending on the desired resist characteristics. In general, it is preferably 99 mol % or less, more preferably 90 mol % or less, yet more preferably 80 mol % or less, to the total mole number of the essential repeating units including these of formula (bI) and those of formula (bII).

The acid-decomposable resin according to the present invention has a molecular weight of form 1,000 to 1,000,000, preferably from 1,500 to 500,000, more preferably from 2,000 to 200,000, yet more preferably from 2,500 to 100,000, in terms of a weight average molecular weight (Mw: calculated for standard polystyrene). Since a higher molecular weight improves characteristics such as the heat resistance and the like but results in decrease in the developing property and the like, the molecular weight of the resin is regulated to a value in the preferred range so as to balance these characteristics.

Of the acid-decomposable resins according to the present invention, the acid-decomposable resin (a) and acid-decomposable resin (b) descried above are preferred. By using these acid-decomposable resins, prevention of the occurrence of cracking is more effectively attained.

The content of the acid-decomposable resin in the positive photoresist composition according to the present invention is preferably from 40 to 99% by weight, more preferably from 50 to 97% by weight, to the total solid content in the resist.

Now, the compound which generates an acid upon irradiation with an actinic ray or radiation (a photo-acid generator) usable in the positive photoresist composition of the present invention will be described in more detail below.

The photo-acid generator is required to have two properties, namely (1) being transparent to exposure light (provided that it has no photobleaching property) and (2) being sufficiently subject to photolysis to secure resist sensitivity. Although a guiding principle in molecular design for meeting these contradictory essential requirements is still unclear at present, the following compounds can be recited.

Specifically, examples of the photo-acid generator include 2-oxocyclohexyl group-containing aliphatic alkylsulfonium salts and N-hydroxysuccinimidosulfonates as disclosed in JP-A-7-25846, JP-A-7-28237, JP-A-7-92675 and JP-A-8-27102. Further, sulfonium salts represented by the following formula (VI), disulfones represented by the following formula (VII) and compounds represented by the following formula (VIII) as described e.g., in *J. Photopolym. Sci. Technol.*, Vol. 7, No. 3, p. 423 (1994) are cited:

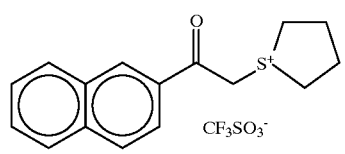

(VI)

$R_{12}\text{—}SO_2SO_2\text{—}R_{13}$ (VII)

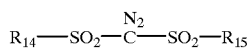

(VIII)

wherein $R_{12}$ to $R_{15}$ each represents an alkyl group or a cycloalkyl group, and they may be the same or different.

Furthermore, N-hydroxymaleinimidosulfonates of the following formula (IX) are also suitable for the photo-acid generator:

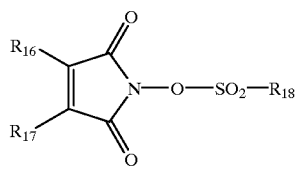

(IX)

wherein $R_{16}$ and $R_{17}$, which may be the same or different, each represents a hydrogen atom, an alkyl group having from 1 to 6 carbon atoms or a cycloalkyl group, or $R_{16}$ and $R_{17}$ combine with each other via an alkylene group to form a ring; and $R_{18}$ represents an alkyl group, a perfluoroalkyl group, a cycloalkyl group or a group derived form a substituted camphor. The N-hydroxymaleinimidosulfonates are especially advantageous with respect to photosensitivity.

Examples of the alkyl group having from 1 to 6 carbon atoms for $R_{16}$ or $R_{17}$ in formula (IX) above include methyl, ethyl, propyl, isopropyl, n-butyl, isobutyl, tert-butyl, n-pentyl and n-hexyl groups. Of these groups, methyl, ethyl and propyl groups are preferred, and methyl and ethyl groups are more preferred. Examples of the cycloalkyl group containing at most 6 carbon atoms include cyclopropyl, cyclopentyl and cyclohexyl groups. Of these groups, cyclopentyl and cyclohexyl groups are preferred. Examples of the case wherein the ring is formed by combining $R_{16}$ with $R_{17}$ via an alkylene chain include the cases of forming cyclohexyl, norbornyl and tricyclodecanyl groups.

Examples of the alkyl group for $R_{18}$ include a straight chain alkyl group having from 1 to 20 carbon atoms, including methyl, ethyl and propyl groups, and a branched alkyl group having form 3 to 20 carbon atoms, including isopropyl, isobutyl, tert-butyl and neopentyl groups. Of these alkyl groups, a straight chain or branched alkyl group having from 1 to 16 carbon atoms, especially from 4 to 15 carbon atoms, is preferred. Examples of the perfluoroalkyl group for $R_{18}$ include a straight chain perfluoroalkyl group having from 1 to 20 carbon atoms, including trifluoromethyl and pentafluoroethyl groups, and a branched perfluoroalkyl group having from 3 to 20 carbon atoms, including heptafluoroisopropyl and nonafluoro-tert-butyl groups. Of these perfluoroalkyl groups, a straight chain or branched perfluoroalkyl group having from 1 to 16 carbon atoms is preferred. Examples of the cycloalkyl group for $R_{18}$ include a monocyclic cycloalkyl group, such as cyclopenthyl and cyclohexyl groups, and a polycyclic cycloalkyl group, such as decalyl, norbornyl and tricyclodecanyl groups.

The amount of the photo-acid generator added in the positive photoresist composition is preferably from 0.1 to 20% by weight, more preferably form 0.5 to 15% by weight, yet more preferably from 1 to 10% by weight, to the total solid content in the composition.

In the positive photoresist composition of the present invention, the following photo-acid generators may further be used in combination with the above-descried photo-acid generators. The amount of the other photo-acid generator usable in combination with the above described photo-acid generator in the positive resist composition is preferably 2% by weight of less, more preferably 1% by weight or less, to the total solid content in the composition.

Examples of the other photo-acid generator include the diazonium salts described, e.g., in S. I. Schlesinger, *Photogr. Sci. Eng.*, 18, 387 (1974), and T. S. Bal et al., *Polymer*, 21, 423 (1980); onium salts, such as the ammonium salts described, e.g., in U.S. Pat. Nos. 4,069,055, 4,069,056 and Re 27,992, and JP-A-3-140140, the phosphonium salts described, e.g., in D. C. Necker et al., *Macromolecules*, 17, 2468 (1984), C. S. Wen et al., *Teh. Proc. Conf. Rad. Curing ASIA*, p. 478, Tokyo (October 1988), and U.S. Pat. Nos. 4,069,055 and 4,069,056, the iodonium salts described, e.g., in J. V. Crivello et al., *Macromolecules*, 10(6), 1307(1977), *Chem. & Eng. News*, Nov. 28, p. 31 (1988), European Patents 104,143, 339,049 and 410,201, JP-A-2-150848 and JP-A-2-296514, the sulfonium salts described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents 370,693, 161,811, 410,201, 339,049, 233,567, 297,443 and 297,442, U.S. Pat. Nos. 4,933,377, 3,902,114, 4,760,013, 4,734,444 and 2,883,827, and German Patents 2,904,626, 3,604,580 and 3,604,581, the selenonium salts described, e.g., in J. V. Crivello et al., *Macromolecules*, 10(6), 1307 (1977), and J. V. Crivello et al., *J. Polymer Sci.*, Polymer Chem. Ed., 17, 1047 (1979), and the arsonium salts described, e.g., in C. S. Wen et al., *Teh. Proc. Conf. Rad. Curing ASIA*, p. 478, Tokyo (October, 1988); the organic halogeno-compounds described, e.g., in U.S. Pat. No. 3,905, 815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; the organometallic compounds/organic halogeno compounds described, e.g., in K. Meier et al., *J. Rad. Curing*, 13(4), 26(1986), T. P. Gill et al., *Inorg. Chem.*, 19, 3007 (1980), D. Astruc, *Acc. Chem. Res.*, 19(12), 377 (1896), and JP-A-2-161445; the photo-acid generators having o-nitrobenzyl type protective groups described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11(4), 191 (1985), F. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J.Electrochem. Soc.*, Solid State Sci. Technol., 130(6), F. M. Houlihan et al., *Macromolecules*, 21, 2001 (1988), European Patents 290,750, 046,083, 156,535, 271,851 and 388,343, U.S. Pat. Nos. 3,901,710 and 4,181, 531, JP-A-60-198538 and JP-A-53-133022; the compounds generating a sulfonic acid on photolysis, which are represented by iminosulfonates, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 199,672, 084,515, 044,115, 101,122 and 618,564, U.S. Pat. Nos. 4,371,605 and 4,431,774, JP-A-64-18143, JP-A-2-245756, JP-A-3-140109: and the disulfone compounds described, e.g., in JP-A-61-166544.

Besides the photo-acid generators as described above, the polymers in the main or side chains of which the above-recited groups or compounds that can generate acids upon exposure to light are introduced, such as the polymers disclosed, e.g., in M. E. Woodhouse et al., *J. Am. Chem. Soc.*, 104, 5586(1982), S. P. Pappas et al., *J. Imaging Sci.*, 30(5), 218(1986), S. Kondo et al., *Makromol. Chem.*, Rapid Commun., 9, 625(1988), Y. Yamada et al., *Makromol. Chem.*, 152, 153, 163 (1972), J. V. Crivello et al., *J. Polymer Sci.*, Polymer Chem. Ed., 17, 3845(1979), U.S. Pat. No. 3,849,137, German Patent 3,914,407, JP-A-63-26653, JP-A-55-164824, JP-A-62-69263, JP-A-63-13638, JP-A-63-163452, JP-A-62-153853 and JP-A-63-146029 can be used.

In addition, the compounds capable of generating acids upon exposure to light as disclosed, e.g., in V. N. R. Pillai, *Synthesis*, (1), 1(1980), A. Abad et al., *Tetrahedron Lett.*, (47) 4555(1971), D. H. R. Barton et al., *J. Chem. Soc.*, (C), 329(1970), U.S. Pat. No. 3,779,778 and European Patent 126,712 can also be used.

Of the above described compounds for the combined use, which can be decomposed by irradiation with an acitinic ray or radiation to generate acids, compounds particularly advantageously used are set forth below.

(PAG1)

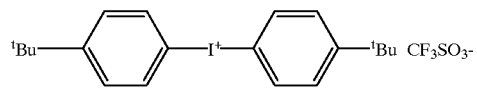

(PAG2)

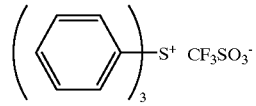

(PAG3)

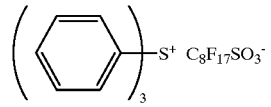

(PAG4)

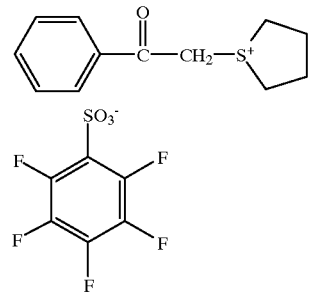

(PAG5)

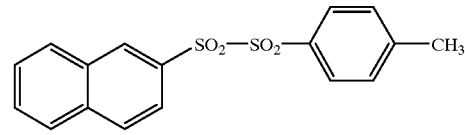

-continued (PAG6)

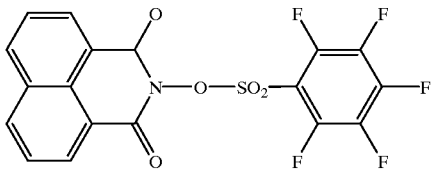

To the positive photoresist composition may be added an appropriate alkali-soluble low molecular weight compound for the purposes of increasing the solubility of the resist in alkali and controlling the glass transition temperature of the resist to prevent the composition from forming a brittle film and undergoing deterioration in heat resistance. Examples of such an alkali-soluble low molecular weight compound include a compound containing an acid group in a molecule, such as a dialkylsulfonamido compound, a dialkylsulfonylmido (—$SO_2$—NH—CO—) compound and a dialkyldisulfonylimido (—$SO_2$—NH—$SO_2$—) compound. The content of the alkali-soluble low molecular weight compound is preferably 40% by weight or less, more preferably 30% by weight or less, and still more preferably 25% by weight, based on the weight of the binder resin described above.

The positive photoresist composition of the present invention may further contain other ingredients, e.g., acid-decomposable dissolution inhibiting compounds, dyes, plasiticizers, surfactants, photosensitizers, organic basic compounds, and compounds which accelerate dissolution in a developing solution, if desired.

For application to a substrate, the photosensitive composition of the present invention is dissolved in a solvent in which the ingredients described above are dissolved. Preferred examples of the solvent include ethylene dichloride, cyclohexanone, cyclopentanone, 2-heptanonoe, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, metyl methoxypropionate, ethyl ethoxypropionate, metyl pyruvate, ethyl pyruvate, propyl pyruvate, N,N-dimetylformamide, dimethyl sulfoxide, N-methylpyrrolidone, and tetrahydrofuran. These solvents may be used alone or as a mixture of two or more thereof.

Of the above described solvents, 2-heptanone, γ-butyrolactone, ethylene glycol monomethyl ether, ethylene glycol monethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetrahydrofuran are more preferred.

A surfactant may be added to the solvent. Examples of the surfactant include nonionic surfactants such as polyoxyetylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate and polyoxyethylene sorbitan tristearate; fluorochemical surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), Asahi Guard AG710 and Surflon S-382, SC101, SC102, SC103, SC104, SC105, and SC106 (manufactured by Asahi Glass Co., Ltd.); organosiloxane polymer KP341 (manufactured by Shin-Etsu Chemical Co., Ltd.); and acrylic or methacrylic (co) polymers Polyflow No. 75 and No. 95 (manufactured by Kyoeisha Chemical Co., Ltd.). The amount of the surfactant added is ordinarily 2 parts by weight or less, preferably 1 part by weight or less, per 100 parts by weight of the solid content in the composition of the present invention.

These surfactants may be added alone or in combination of two or more thereof.

The positive photoresist composition according to the present invention is applied to a substrate to form a thin coating. A thickness of the coating is preferably from 0.4 to 1.5 μm.

A satisfactory resist pattern can be obtained by applying the photoresist composition described above to a substrate such as one for use in the production of precision integrated-circuit element (e.g., silicon/silicon dioxide coating) by an appropriate coating means, e.g., a spinner or coater, exposing the coating to light through a prescribed mask, baking and developing the coating. Preferred examples of the exposure light include a far ultraviolet ray having a wavelength of 250 nm and shorter, more preferably 220 nm and shorter. Specific examples thereof include KrF excimer laser light (248 nm), ArF excimer laser light (193 nm), $F_2$ excimer laser light (157 nm), an X-ray, and an electron beam.

As a developing solution for the photoresist composition of the present invention, an alkaline aqueous solution of an inorganic alkali, e.g., sodium hydroxide, potassium hydroxide, sodium carbonate, sodium silicate, sodium metasilicate or aqueous ammonia, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroixde or tetraethylammonium hydroixde, a cyclic amine, e.g., pyrrole or piperidine, or the like can be employed.

The alkaline aqueous solution for use as a developing solution may contain an appropriate amount of an alcohol and a surfactant.

The positive photoresist composition containing the resin according to the present invention is particularly suitable for exposure to light having a wavelength range of from 170 nm to 220 nm, has high sensitivity and good resolution, and provides good resist pattern profile. Also, the composition solution thereof has improved storage stability. Thus, the positive photoresist composition is excellent for practical use.

The present invention will be described in greater detail with reference to the following examples, but the present invention should not be construed as being limited thereto.

SYNTHESIS EXAMPLES (a) Synthesis of Monomer a Corresponding to Repeating Unit (a37)

Into a 2-liter three-necked flask were introduced 75 g of deoxychloic acid and one liter of dimethylformamide. The contents were stirred at room temperature to dissolve the acid. Thereto was added 19.2 g of triethylamine. Ethoxymethyl chloride was then added dropwise thereto. After the completion of the addition, the resulting mixture was stirred for 3 hours to react. After the completion of the reaction, the solvent was distilled off under a reduced pressure and the residue was extracted with ethyl acetate and water. The ethyl acetate solution obtained was dehydrated and then concentrated again to obtain 70 g of ethoxymethyl-protected deoxychloic acid.

The protected acid obtained was redissolved in 2 liter of THF, and the resulting solution was introduced into a 3-liter three-necked flask together with 100 g of triphenylphosphine. Thereto was then added 33 g of methacrylic acid. Thereafter, 66 g of diethylazobiscarboxylate was added dropwise. After the completion of the addition, the resulting mixture was stirred as it was for 16 hours. The reaction mixture obtained was concentrated and then extracted with ethyl acetate and an aqueous sodium bicarbonate solution. The ethyl acetate layer was filtered, concentrated, and then redissolved in acetone. An aqueous hydrochloric acid solution was added to the acetone solution to hydrolyze the reaction product. After the completion of the reaction, the reaction mixture was neutralized, concentrated, and purified by silica gel column chromatography. As a result, 45 g of Monomer a having the following structure was obtained as the desired compound.

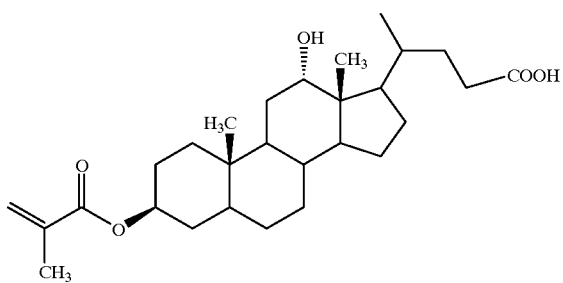

(2) Synthesis of Monomer b Corresponding to Repeating Unit (a48)

Monomer b having the following structure was synthesized in the same manner as in Synthesis Example (a) above, except that acrylic acid was used in place of methacrylic acid.

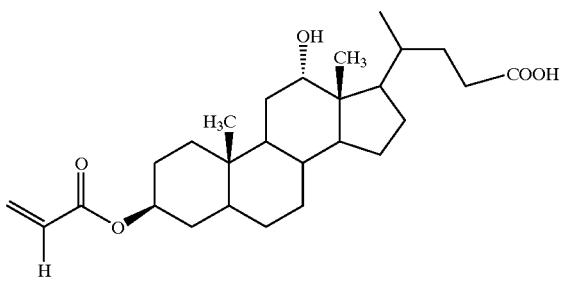

(1) Synthesis of Resin A

In 60 g of N,N-dimethylacetaminde were dissolved 2 g of Monomer a, 10 g of cyanoethyl ester of Monomer b, 3 g of tert-butyl acrylate, and 1 g of dimethyl azobis(2-methylpropionate) (V-601 manufactured by Wako Pure Chemical Industries, Ltd.). The solution was dropwise added over 3 hours into a reactor containing 5 g of N,N-dimethylacetamide heated to 75° C. under a nitrogen gas stream. After the completion of the dropwise addition, the contents were stirred as they were for 3 hours. The resulting reaction mixture was allowed to cool to room temperature and poured into 2 liters of distilled water to conduct crystallization. The white particles precipitated were collected by filtration. Thus, 13.6 g of Resin A was recovered.

The weight average molecular weight of Resin A obtained was measured by GPC and calculated in terms of standard polystyrene, and was found to be 17,200.

(2) Synthesis of Resin B

In 60 g of N,N-dimethylacetamide were dissolved 1.8 g of Monomer b, 10.5 g of cyanoethyl ester of Monomer b, 3.1 g of tert-butyl acrylate, 0.8 g of V-601, manufactured by Wako Pure Chemical Industries, Ltd., and 0.2 g of thioethanol. The solution was dropwise added over 3 hours into a reactor containing 5 g of N,N-dimethylacetamide heated at 75° C. under a nitrogen gas stream. After the completion of the dropwise addition, the contents were stirred as they were for 3 hours. The resulting reaction mixture was allowed to cool to room temperature and poured into 2 liters of distilled water to conduct crystallization. The white particles precipitated were collected by filtration. Thus, 14.1 g of Resin B was recovered.

The weight average molecular weight of Resin B obtained was measured by GPC and calculated in terms of standard polystyrene, and was found to be 11,300.

(3) Synthesis of Resin C

In 60 g of N,N-dimethylacetamide were dissolved 1.8 g of Monomer b, 10.2 g of hydroxyethylamide of Monomer b, 3.1 g of tert-butyl acrylate, 0.8 g of V-65 (2,2'-azobis(2,4-dimethylvaleronitrile)), manufactured by Wako Pure Chemical Industries, Ltd., and 0.2 g of thioethanol. The solution was dropwise added over 3 hours into a reactor containing 5 g of THF heated at 60° C. under a nitrogen gas stream. After the completion of the dropwise addition, the contents were stirred as they were for 3 hours. The resulting reaction mixture was allowed to cool to room temperature and poured into 2 liters of distilled water to conduct crystallization. The white particles precipitated were collected by filtration. Thus, 13.8 g of Resin C was recovered.

The weight average molecular weight of Resin C obtained was measured by GPC and calculated in terms of standard polystyrene, and was found to be 10,700.

(4) Synthesis of Resin D

In 60 g of N,N-dimethylacetamide were dissolved 1.8 g of Monomer b, 10.3 g of hydroxyethylamide of Monomer b, 3.0 g of tert-butyl acrylate, and 1.2 g of V-601, manufactured by Wako Pure Chemical Industries, Ltd. The solution was dropwise added over 3 hours into a reactor containing 5 g of N,N-dimethylacetamide heated at 75° C. under a nitrogen gas stream. After the completion of the dropwise addition, the contents were stirred as they were for one hour. Subsequently, 0.6 g of 2-bromoethanol was added and the mixture was further stirred for 2 hours. The resulting reaction mixture was allowed to cool to room temperature and poured into 2 liters of distilled water to conduct crystallization. The white particles precipitated were collected by filtration. Thus, 14.3 g of Resin D was recovered.

The weight-average molecular weight of Resin D obtained was measured by GPC and calculated in terms of standard polystyrene, and was found to be 16,700.

(5) Synthesis of Resin E

Resin E was synthesized in the same manner as in Synthesis Example 1 of JP-A-10-55069 except for using dimethyl azobis(2-methylpropionate) in place of 4,4-azobis (4-cyanovaleric acid) as the polymerization initiator described in paragraph [0050] of JP-A-10-55069.

The weight average molecular weight of Resin E obtained was measured by GPC and calculated in terms of standard polystyrene, and was found to be 15,700.

EXAMPLES 1 TO 5

Each of the resins synthesized in Synthesis Examples (1) to (5) above was mixed in an amount of 1.2 g with 0.25 g of triphenylsulfonium triflate and dissolved in propylene glycol monoethyl ether acetate in such a proportion as to result in a solid content of 14% by weight. The solution was filtered through a 0.1-μm microfilter to prepare a positive photoresist composition solution.

Comparative Example 1

A positive photoresist composition solution was prepared in the same manner as in Example 1, except that Resin (A-1) described in Synthesis Example 1 in paragraph [0050] of JP-A-10-55069 was used in place of the resin used in Example 1.

Evaluation Test

Each of the positive photoresist composition solutions obtained was applied to a silicon wafer with a spin coater and dried at 120° C. for 90 seconds to form a positive photoresist film having a thickness of about 0.5 μm. The resist film was exposed to ArF excimer laser light (193 nm). After the exposure, the resist film was heated at 130° C. for 90 seconds, subsequently developed with a 2.38% aqueous solution of tetramethylammonium hydroxide, and then rinsed with distilled water to obtain a resist pattern profile.
Resolution The resolution was evaluated using limiting resolution in an exposure amount necessary to reproduce a mask pattern of 0.35 μm.
Storage Stability of Composition Solution The positive photoresist composition solution, i.e., coating solution, prepared was allowed to stand at 4° C. for one week and then the number of particles in 10 ml of the solution was counted by a particle counter manufactured by Rion Co., Ltd. The number of particles of about less than 30 is the allowable range, and the number of particles is preferably less than 10.

The results of the evaluation obtained are shown in Table 1 below.

TABLE 1

| Example | Resin | Resolution | Storage Stability |
|---|---|---|---|
| Example 1 | A | 0.18 | <5 |
| Example 2 | B | 0.18 | <5 |
| Example 3 | C | 0.19 | <5 |
| Example 4 | D | 0.19 | <5 |
| Example 5 | E | 0.22 | 20 |
| Comparative Example 1 | A-1 | 0.35 | 3000 |

As is apparent from the results shown in Table 1, the positive photoresist compositions for exposure to far ultraviolet light containing the resin according to the present invention provide satisfactory results with respect to the resolution and storage stability of composition solution. On the contrary, the positive photoresist composition of the comparative example was insufficient as to the storage stability of composition solution.

While the present invention has been described in detail and with reference to specific embodiments thereof, it will be apparent to one skilled in the art that various changes and modifications can be made therein without departing from the spirit and scope thereof.

What is claimed is:

1. A positive photoresist composition for exposure to far ultraviolet light which comprises (A) a compound which generates an acid upon irradiation with an actinic ray or radiation, and (B) a resin which is decomposed by the action of an acid to increase its solubility in an alkaline developing solution and has a group represented by the following formula (1) connected to at least one terminal of the molecular chain thereof:

—X—R    (1)

wherein X represents —$R_1$—, —S—$R_1$—, —O—$R_1$—, —NH—$R_1$— or —$NR_2$—$R_1$—; R represents an alkoxy group, a hydroxy group, —COO—$R_2$, —CONH—$R_2$, —$CONHSO_2$—$R_2$ or —$CONH_2$; $R_1$ represents a divalent hydrocarbon group having from 1 to 20 carbon atoms; and $R_2$ represents an alkyl group.

2. A positive photoresist composition for exposure to far ultraviolet light as claimed in claim 1, wherein the resin has an alicyclic structure.

3. A positive photoresist composition for exposure to far ultraviolet light as claimed in claim 1, wherein the composition is suitable for exposure using far ultraviolet light having a wavelength of from 170 nm to 220 nm, as exposure light.

4. A positive photoresist composition for exposure to far ultraviolet light as claimed in claim 1, wherein the resin is a resin having at least one monovalent polyalicyclic group represented by the following formula (aI), (aII) or (aIII) and a group which is decomposed by the action of an acid to increase solubility of the resin in an alkaline developing solution:

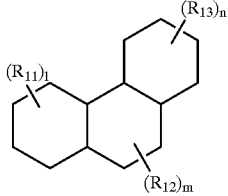

(aI)

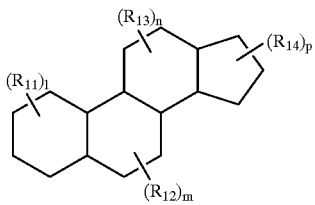

(aII)

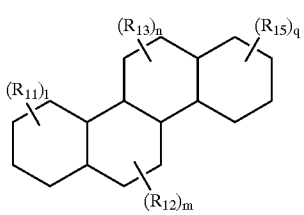

(aIII)

wherein $R_{11}$ to $R_{15}$ may be the same or different and each represents an optionally substituted alkyl, cycloalkyl, alkenyl, acyloxy, or alkynyl group, a halogen atom, a cyano group, or a group represented by

—$R_{16}$—O—$R_{17}$,
—$R_{18}$—CO—O—$R_{19}$,

—R$_{20}$—CO—O—NR$_{21}$R$_{22}$,
—R$_{23}$—O—CO—R$_{24}$,
—R$_{25}$—CO—X$_1$—A$_1$—R$_{26}$,
—R$_{25}$—CO—X$_1$—A$_2$—R$_{27}$,
—R$_{25}$—CO—NHSO$_2$—X$_2$—A—R$_{27}$, or
—COOZ,
wherein R$_{17}$ and R$_{19}$ may be the same or different and each represents a hydrogen atom, an optionally substituted alkyl, cycloalkyl, or alkenyl group, —Z, or such a group that the —O—R$_{17}$ or —CO—O—R$_{19}$ functions as a group which is decomposed by the action of an acid to increase solubility in an alkaline developing solution, Z is a group represented by either of the following formulae:

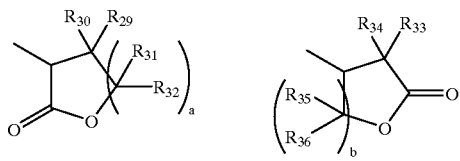

wherein R$_{29}$ to R$_{36}$ may be the same or different and each represents a hydrogen atom or an optionally substituted alkyl group, and a and b each represents 1 or 2;

R$_{21}$, R$_{22}$ and R$_{24}$ may be the same or different and each represents a hydrogen atom or an optionally substituted alkyl, cycloalkyl, or alkenyl group, provided that R$_{21}$ and R$_{22}$ may be bonded to each other to form a ring;

R$_{16}$, R$_{18}$, R$_{20}$ and R$_{23}$ may be the same or different and each represents a single bond or an optionally substituted alkylene, alkenylene, or cycloalkylene group;

R$_{25}$ represents a single bond or an optionally substituted alkylene or cycloalkylene group;

X$_1$ represents an oxygen atom, a sulfur atom, or —NH—;

X$_2$ represents a single bond or —NH—;

A represents one member or a combination of two or more members selected from the group consisting of a single bond, an optionally substituted alkylene group, an ether group, a thioether group, a carbonyl group, an ester group, an amido group, a sulfonamido group, a urethane group and a urea group;

A$_1$ represents one member or a combination of two or more members selected form the group consisting of an optionally substituted alkylene group, an ether group, a thioether group, a carbonyl group and an ester group;

A$_2$ represents one member or a combination of two or more members selected from the group consisting of an optionally substituted alkylene group, an ether group, a thioether group, a carbonyl group, an ester group, an amido group, a sulfonamido group, a urethane group and a urea group, provided that at least one A$_2$ is selected form sulfonamido, urethane, and urea groups, R$_{26}$ represents —COOH, —COOR$_{19}$, —OR$_{17}$, —COOZ, —CN, a hydroxy group, or —CO—NH—SO$_2$—R$_{40}$;

R$_{27}$ represents —COOH, —COOR$_{19}$, —OR$_{17}$, —CN, a hydroxy group, —CO—NH—R$_{40}$, —CO—NH—SO$_2$—R$_{40}$, —Z—, or an optionally substituted alkyl, cycloalkyl, or alkoxy group, wherein R$_{40}$ represents an optionally substituted alkyl or cycloalkyl group; and L, m, n, p, and q may be the same or different and each represents 0 or an integer of 1 to 5, provided that when l, m, n, p, or q is 2 or larger, the plural substituents with respect to each of R$_{11}$, R$_{12}$, R$_{13}$, R$_{14}$ and R$_{15}$ may be the same or different; two of the plural substituents, which are present on the same carbon, in combination may represent a carbonyl group (=O) or a thiocarbonyl group (=S); two of the plural substituents, which are bonded to adjacent carbon atoms, may represent a double bond between the carbon atoms; and two of the plural substituents may be bonded to each other to form a ring; and the bond for external linkage of each monovalent polyalicyclic group represented by formula (aI), (aII), or (aIII) being located in any position in the polycyclic hydrocarbon structure.

5. A positive photoresist composition for exposure to far ultraviolet light as claimed in claim 4, wherein the resin comprises a repeating unit represented by the following formula (aIV), (aV) or (aVI):

(aIV)

(aV)

(aVI)

wherein R$_{65}$, R$_{66}$, and R$_{68}$ to R$_{70}$ may be the same or different and each represents a hydrogen atom, a halogen atom, a cyano group, an alkyl group, or a haloalkyl group; R$_{67}$ represents a cyano group, —CO—OR$_{77}$, or —CO—NR$_{78}$R$_{79}$;

A represents one member or a combination of two or more members selected from the group consisting of a single bond, an optionally substituted alkylene, alkenylene or cycloalkylene group, an ether group, a thioether group, a carbonyl group, an ester group, an amido group, a sulfonamido group, a urethane group, and a urea group, or represents —SO$_2$—, —O—CO—R$_{80}$—, —CO—O—R$_{81}$—, or —CO—NR$_{82}$—R$_{83}$—;

R$_{77}$ represents a hydrogen atom, an optionally substituted alkyl, cycloalkyl, or alkenyl group, or such a group that the —CO—OR$_{77}$ functions as an acid-decomposable group;

R$_{78}$, R$_{79}$, and R$_{82}$ may be the same or different, and each represents a hydrogen atom or an optionally substituted alkyl, cycloalkyl, or alkenyl group, or R$_{78}$ and R$_{79}$ may be bonded to each other to form a ring;

R$_{80}$, R$_{81}$, and R$_{83}$ may be the same or different, and each represents a single bond or a bivalent alkylene, alkenylene, or cycloalkylene group, or a bivalent group formed by combining these groups with an ether, ester, amido, urethane or ureido group; and Y represents any of the polyalicyclic groups represented by formulae (aI) to (aIII).

6. A positive photoresist composition for exposure to far ultraviolet light as claimed in claim 4, wherein the resin further comprises a repeating unit represented by the following formula (aVII), (aVIII) or (aIX):

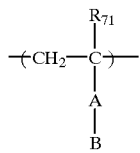
(aVII)

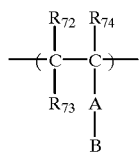
(aVIII)

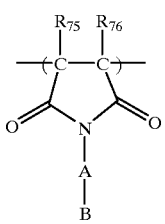
(aIX)

wherein $R_{71}$, $R_{72}$, and $R_{74}$ to $R_{76}$ may be the same or different and each represents a hydrogen atom, a halogen atom, a cyano group, an alkyl group or a haloalkyl group;

$R_{73}$ has the same meaning as $R_{67}$ described above;

A has the same meaning as in formulae (aIV) to (aVI) described above; and

B is a group which is decomposed by the action of an acid to increase solubility in an alkaline developing solution.

7. A positive photoresist composition for exposure to far ultraviolet light as claimed in claim 4, wherein the resin further comprises a repeating unit represented by the following formula (aX), (aXI) or (aXII):

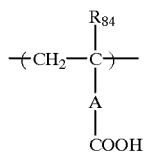
(aX)

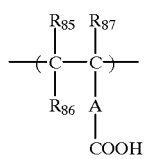
(aXI)

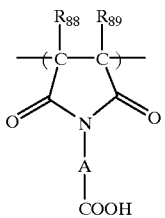
(aXII)

wherein $R_{84}$, $R_{85}$, and $R_{87}$ to $R_{89}$ may be the same or different and each represents a hydrogen atom, a halogen atom, a cyano group, an alkyl group or a haloalkyl group;

$R_{86}$ represents a cyano group, a carboxy group, —CO—$OR_{90}$, or —CO—$NR_{91}R_{92}$;

A has the same meaning as in formulae (aIV) to (aVI);

$R_{90}$ represents an optionally substituted alkyl, cycloalkyl, or alkenyl group;

$R_{91}$ and $R_{92}$ may be the same or different and each represents a hydrogen atom or an optionally substituted alkyl, cycloalkyl, or alkenyl group, or $R_{91}$ and $R_{92}$ may be bonded to each other to form a ring.

8. A positive photoresist composition for exposure to far ultraviolet light as claimed in claim 4, wherein the group which is decomposed by the action of an acid is a group represented by the following formula (XIII) or (XIV):

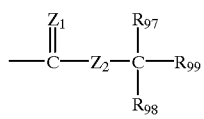
(XIII)

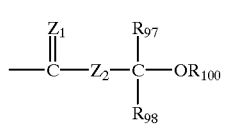
(XIV)

wherein $R_{97}$ to $R_{99}$ may be the same or different and each represents a hydrogen atom or an optionally substituted alkyl, cycloalkyl, or alkenyl group, provided that at least one of $R_{97}$ to $R_{99}$ in formula (XIII) is not a hydrogen atom;

$R_{100}$ represents an optionally substituted alkyl, cycloalkyl, or alkenyl group; or two of $R_{97}$ to $R_{99}$ in formula (XIII) or two of $R_{97}$, $R_{98}$, and $R_{100}$ in formula (XIV) may be bonded to each other to form a three- to eight-membered ring structure comprising carbon atoms and optionally containing one or more heteroatoms; and $Z_1$ and $Z_2$ may be the same or different and each represents an oxygen atom or a sulfur atom.

9. A positive photoresist composition for exposure to far ultraviolet light as claimed in claim 4, wherein the group which is decomposed by the action of an acid is a group represented by the following formula:

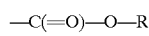
—C(=O)—O—R wherein R represents a trialkylsilyl group, a mervalonic lactone group or a 3-oxocyclohexyl group.

10. A positive photoresist composition for exposure to far ultraviolet light as claimed in claim 1, wherein the resin is a resin having a repeating unit represented by the following formula (bI), a repeating unit represented by the following formula (bII) and a group which is decomposed by the action of an acid:

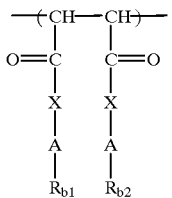
(bI)

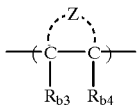
(bII)

wherein $R_{b1}$ and $R_{b2}$ may be the same or different and each represents a hydrogen atom, a cyano group, a hydroxy group, —COOH, —COOR$_{b5}$, —CO—NH—R$_{b6}$, —CO—NH—SO$_2$—R$_{b6}$, a substituted or unsubstituted alkyl, alkoxy or cyclic hydrocarbon group, or a group —Y; $R_5$ represents a substituted or unsubstituted alkyl or cyclic hydrocarbon group, or a group —Y; the group —Y is represented by

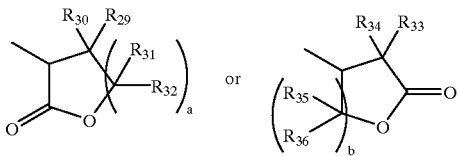

$R_{b6}$ represents a substituted or unsubstituted alkyl or cyclic hydrocarbon group; $R_{29}$ to $R_{36}$ may be the same or different and each represents a hydrogen atom or a substituted or unsubstituted alkyl group; a and b each represents 1 or 2; $R_{b3}$ and $R_{b4}$ may be the same or different and each represents a hydrogen atom, a cyano group, a halogen atom or a substituted or unsubstituted alkyl group;

X represents an oxygen atom, a sulfur atom, —NH—, —NHSO$_2$— or —NHSO$_2$NH—; A represents a single bond or a divalent linkage group; and Z represents an atomic group necessary for forming a substituted or unsubstituted alicyclic structure together with the two carbon atoms (C—C).

11. A positive photoresist composition for exposure to far ultraviolet light as claimed in claim 10, wherein Z in formula (bII) represents an atomic group necessary for forming a substituted or unsubstituted alicyclic structure having a bridged linkage together with the two carbon atoms (C—C).

12. A positive photoresist composition for exposure to far ultraviolet light as claimed in claim 10, wherein the repeating unit represented by formula (bII) is a repeating unit represented by the following formula (bII-A) or (bII-B):

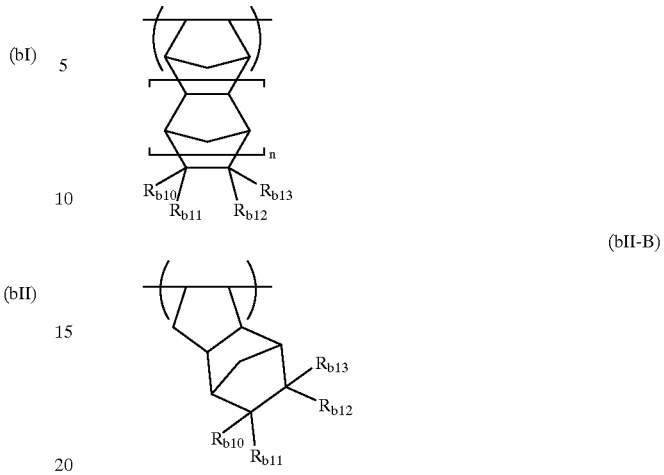

wherein $R_{b10}$ to $R_{b13}$ may be the same or different and each represents a hydrogen atom, a halogen atom, a cyano group, —COOH, —COOR$_{b5}$, an acid-decomposable group, —C(=O)—X—A—R$_{b14}$ or an unsubstituted or substituted alkyl or cyclic hydrocarbon group, or at least two of $R_{b10}$ to $R_{b13}$ combine with each other to form a ring; n is 0 or 1; $R_{b5}$ represents an unsubstituted or substituted alkyl or cyclic hydrocarbon group, or the group —Y as defined above; X represents an oxygen atom, a sulfur atom, —NH—, —NHSO$_2$— or —NHSO$_2$NH—; $R_{b14}$ represents —COOH, —COOR$_{b5}$, —CN, a hydroxy group, an unsubstituted or substituted alkoxy group, —CO—NH—R$_{b6}$, —CO—NH—SO$_2$—R$_{b6}$, or the group —Y as defined above; $R_{b6}$ represents a substituted or unsubstituted alkyl or cyclic hydrocarbon group; and A represents a single bond or a divalent linkage group.

13. A positive photoresist composition for exposure to far ultraviolet light as claimed in claim 1, wherein the compound which generates an acid upon irradiation with an actinic ray or radiation is a compound represented by the following formula (VI), (VII) or (VIII):

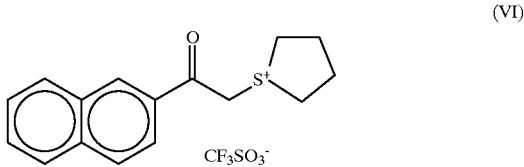
(VI)

(VII)

(VIII)

wherein $R_{12}$ to $R_{15}$ each represents an alkyl group or a cycloalkyl group, and they may be the same or different.

14. A positive photoresist composition for exposure to far ultraviolet light as claimed in claim 1, wherein the compound which generates an acid upon irradiation with an actinic ray or radiation is a compound represented by the following formula (IX):

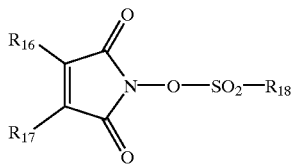

(IX)

wherein $R_{16}$ and $R_{17}$, which may be the same or different, each represents a hydrogen atom, an alkyl group having from 1 to 6 carbon atoms or a cycloalkyl group, or $R_{16}$ and $R_{17}$ combine with each other via an alkylene group to form a ring; and $R_{18}$ represents an alkyl group, a perfluoroalkyl group, a cycloalkyl group or a group derived form a substituted camphor.

15. A positive photoresist composition for exposure to far ultraviolet light as claimed in claim 1, wherein the photoresist composition further comprises a solvent which dissolves the compound which generates an acid upon irradiation with an actinic ray or radiation and the resin.

16. A positive photoresist composition for exposure to far ultraviolet light as claimed in claim 15, wherein the solvent is selected from 2-heptanone, γ-butyrolactone, ethylene glycol monomethyl ether, ethylene glycol monoethyl ether, ethylene glycol monoethyl ether acetate, propylene glycol monomethyl ether, propylene glycol monoethyl ether, methyl lactate, ethyl lactate, methyl methoxypropionate, ethyl ethoxypropionate, N-methylpyrrolidone and tetrahydrofuran.

* * * * *